US012687344B2

(12) United States Patent
Stoia et al.

(10) Patent No.: US 12,687,344 B2
(45) Date of Patent: Jul. 21, 2026

(54) PUMPED TWO-PHASE COOLING OF AIRCRAFT ELECTRONICS

(71) Applicant: The Boeing Company, Arlington, VA (US)

(72) Inventors: Michael F. Stoia, Rancho Santa Margarita, CA (US); Jianping Tu, Walnut, CA (US); Arun Muley, San Pedro, CA (US); Richard C. Smith, III, Huntington Beach, CA (US); Kevin Javier Jui, Torrance, CA (US)

(73) Assignee: The Boeing Company, Arlington, VA (US)

( * ) Notice: Subject to any disclaimer, the term of this patent is extended or adjusted under 35 U.S.C. 154(b) by 196 days.

(21) Appl. No.: 18/610,438

(22) Filed: Mar. 20, 2024

(65) Prior Publication Data

US 2025/0060168 A1     Feb. 20, 2025

Related U.S. Application Data

(60) Provisional application No. 63/519,522, filed on Aug. 14, 2023.

(51) Int. Cl.
F28D 15/02        (2006.01)
B64D 33/08        (2006.01)
(Continued)

(52) U.S. Cl.
CPC ....... F28D 15/0266 (2013.01); F28D 15/025 (2013.01); H01M 8/04059 (2013.01);
(Continued)

(58) Field of Classification Search
CPC ......... H01M 8/04007; H01M 8/04111; H01M 8/04029; H01M 8/0267; H01M 10/46;
(Continued)

(56) References Cited

U.S. PATENT DOCUMENTS 3,768,254 A    10/1973  Stuart
4,722,357 A     2/1988  Wynosky
(Continued)

FOREIGN PATENT DOCUMENTS

DE      102021200088 A1    7/2022
GB          2208702 A     4/1989
(Continued)

OTHER PUBLICATIONS

European Patent Office Extended Search Report, dated Apr. 3, 2025, regarding Application No. EP24193626.9, 7 pages.
(Continued)

*Primary Examiner* — Michael A Matey
(74) *Attorney, Agent, or Firm* — Yee & Associates, P.C.

(57) ABSTRACT

An aircraft cooling system comprises an evaporator, condenser, an accumulator, and a pump system. The evaporator is configured to cool a set of heat loads in an aircraft using a liquid. The liquid forms a vapor in response to cooling the set of heat loads. The condenser is configured to receive the vapor from the evaporator and cool the vapor in which cooling the vapor forms the liquid. The accumulator is configured to receive the liquid from the condenser and store the liquid. The pump system is configured to pump the liquid stored in the accumulator to the evaporator.

23 Claims, 45 Drawing Sheets

(51) Int. Cl.
    *F28D 21/00*      (2006.01)
    *H01M 8/04007*      (2016.01)
    *H01M 8/10*      (2016.01)
    *H02K 7/18*      (2006.01)
    *H05K 7/20*      (2006.01)

(52) U.S. Cl.
    CPC ......... *H02K 7/183* (2013.01); *H05K 7/20309*
    (2013.01); *H05K 7/20327* (2013.01); *H05K*
    *7/20881* (2013.01); *B64D 33/08* (2013.01);
    *F28D 2015/0291* (2013.01); *F28D 2021/0021*
    (2013.01); *H01M 2008/1095* (2013.01); *H01M*
    *2250/20* (2013.01)

(58) Field of Classification Search
    CPC ........... H01M 10/667; H01M 8/04059; H01M
    2008/1095; H01M 2250/20; B60L
    2200/10; B60L 58/33; B60L 58/26; B60L
    50/64; H02K 9/20; H02K 7/1823; H02K
    7/183; H05K 7/20309; H05K 7/20327;
    H05K 7/20318; H05K 7/20354; H05K
    7/20381; H05K 7/20881; F05D 2220/323;
    F25B 39/04; B60Y 2306/05; B64B 1/28;
    F28D 15/0266; F28D 15/025; F28D
    2015/0291; F28D 2021/0021; B64D
    33/08
    See application file for complete search history.

(56) References Cited

U.S. PATENT DOCUMENTS

| | | | |
|---|---|---|---|
| 5,660,358 | A | 8/1997 | Grafwallner et al. |
| 5,833,172 | A | 11/1998 | Grafwallner et al. |
| 6,296,957 | B1 | 10/2001 | Graage |
| 7,624,946 | B2 | 12/2009 | Schoene |
| 7,878,214 | B1 | 2/2011 | Jansen et al. |
| 8,789,379 | B2 | 7/2014 | Watts |
| 9,701,416 | B2 | 7/2017 | Epstein et al. |
| 9,752,728 | B2 | 9/2017 | Tang et al. |
| 11,155,359 | B2 | 10/2021 | Carneiro et al. |
| 11,273,925 | B1 | 3/2022 | O'Meallie et al. |
| 11,465,766 | B2 | 10/2022 | Stoia et al. |
| 11,575,138 | B1 | 2/2023 | Miftakhov et al. |
| 11,835,064 | B1 | 12/2023 | Heeter et al. |
| 11,958,625 | B1 | 4/2024 | DeVault et al. |
| 12,065,979 | B2 | 8/2024 | Heeter et al. |
| 12,172,758 | B2 * | 12/2024 | Rambo ................... B64D 13/02 |
| 2004/0069897 | A1 | 4/2004 | Corcoran |
| 2005/0230554 | A1 | 10/2005 | Schoene |
| 2007/0029330 | A1 | 2/2007 | Immel |
| 2008/0006743 | A1 | 1/2008 | Miller et al. |
| 2008/0230654 | A1 | 9/2008 | Velicki et al. |
| 2010/0307155 | A1 | 12/2010 | Kasuya et al. |
| 2012/0248242 | A1 | 10/2012 | Gagne et al. |
| 2012/0299311 | A1 | 11/2012 | Biederman et al. |
| 2014/0026597 | A1 | 1/2014 | Epstein et al. |
| 2014/0096539 | A1 | 4/2014 | Gustafson et al. |
| 2014/0260340 | A1 * | 9/2014 | Vaisman ................ B64D 13/06 |
| | | | 62/335 |
| 2014/0318131 | A1 | 10/2014 | Artinian et al. |
| 2015/0336680 | A1 | 11/2015 | Schumacher et al. |
| 2015/0338171 | A1 * | 11/2015 | Torres Sepúlveda ........................ |
| | | | F28D 15/043 |
| | | | 165/104.26 |
| 2017/0175565 | A1 | 6/2017 | Sennoun |
| 2019/0070924 | A1 * | 3/2019 | Mancini ............. B60H 1/32281 |
| 2019/0135425 | A1 | 5/2019 | Moore et al. |
| 2019/0338670 | A1 | 11/2019 | Reid |
| 2020/0109667 | A1 | 4/2020 | Muldoon et al. |
| 2020/0277069 | A1 | 9/2020 | Rainville et al. |
| 2020/0325854 | A1 | 10/2020 | Bartlok |
| 2021/0151783 | A1 | 5/2021 | Miftakhov |
| 2021/0269152 | A1 | 9/2021 | Wankewycz et al. |
| 2021/0316877 | A1 | 10/2021 | Rheaume et al. |
| 2021/0381429 | A1 | 12/2021 | Taylor |
| 2022/0041263 | A1 | 2/2022 | Rainville |
| 2022/0055762 | A1 | 2/2022 | Clarke et al. |
| 2022/0243685 | A1 | 8/2022 | Pennec |
| 2022/0306306 | A1 | 9/2022 | Labarthe et al. |
| 2022/0355942 | A1 | 11/2022 | Pome et al. |
| 2022/0355943 | A1 | 11/2022 | Carretero Benignos et al. |
| 2022/0411083 | A1 | 12/2022 | Kierbel |
| 2023/0058816 | A1 | 2/2023 | Mikic et al. |
| 2023/0077242 | A1 | 3/2023 | Emerson et al. |
| 2023/0077740 | A1 | 3/2023 | Booth et al. |
| 2023/0159176 | A1 | 5/2023 | Taylor |
| 2023/0170499 | A1 | 6/2023 | Lee et al. |
| 2023/0174247 | A1 | 6/2023 | Ahyow et al. |
| 2023/0184382 | A1 | 6/2023 | Gross |
| 2023/0234714 | A1 | 7/2023 | Wang et al. |
| 2024/0190566 | A1 | 6/2024 | Tulsyan et al. |
| 2024/0209796 | A1 | 6/2024 | Heeter et al. |
| 2024/0228018 | A1 | 7/2024 | Regaud et al. |
| 2024/0270401 | A1 | 8/2024 | Kondo et al. |
| 2024/0369107 | A1 | 11/2024 | Owoeye |
| 2025/0058885 | A1 * | 2/2025 | Balan ................. H01M 8/04111 |
| 2025/0058890 | A1 | 2/2025 | Watts |
| 2025/0058891 | A1 * | 2/2025 | Balan ........................ B64B 1/28 |
| 2025/0059933 | A1 * | 2/2025 | Balan ................ H01M 8/04014 |
| 2025/0060168 | A1 * | 2/2025 | Stoia .................... B64D 27/355 |
| 2025/0250019 | A1 | 8/2025 | Alvarez et al. |
| 2025/0353606 | A1 | 11/2025 | Richardson et al. |

FOREIGN PATENT DOCUMENTS

| | | | |
|---|---|---|---|
| WO | 0103223 | A1 | 1/2001 |
| WO | 2021222528 | A1 | 11/2021 |
| WO | 2023074870 | A1 | 5/2023 |
| WO | 2023114353 | A2 | 6/2023 |
| WO | 2023239965 | A2 | 12/2023 |

OTHER PUBLICATIONS

European Patent Office Extended Search Report, dated May 2, 2025, regarding Application No. EP24193557.6, 8 pages.

European Patent Office Search Report, dated Apr. 2, 2025, regarding Application No. EP24193508.9, 12 pages.

Office Action, dated Mar. 12, 2025, regarding U.S. Appl. No. 18/610,526, 26 pages.

Office Action, dated May 14, 2025, regarding U.S. Appl. No. 18/610,697, 29 pages.

Balan et al., Configuration for a LH2 Fuel Cell Aircraft with Distributed Systems, U.S. Appl. No. 18/610,526, filed Mar. 20, 2024, 117 pages.

Balan et al., "Fuel Cell Aircraft Thermal Management System," U.S. Appl. No. 18/610,868, filed Mar. 20, 2024, 119 pages.

Balan et al., Method of Nacelle Air Heat Exchanger Integration for a Hydrogen Fueled Fuel Cell Powered Aircraft, U.S. Appl. No. 18/610,580, filed Mar. 20, 2024, 118 pages.

Balan et al., "Start-Up of High Temperature Proton Exchange Membrane (HTPEM) Fuel Cell Aircraft with Multiple Power Generating Units," U.S. Appl. No. 18/610,742, filed Mar. 20, 2024, 120 pages.

Balan, "Low Temperature Proton Exchange Membrane Charge Air Heat Exchanger," U.S. Appl. No. 18/610,816, filed Mar. 20, 2024, 119 pages.

Watts, "Liquid Hydrogen Feed System for Fuel Cell Powered Aircraft," U.S. Appl. No. 18/610,697, filed Mar. 20, 2024, 119 pages.

European Patent Office Search Report and Written Opinion, dated Dec. 13, 2024, regarding Application No. EP24193577.4, 6 pages.

European Patent Office Communication, dated Nov. 7, 2025, regarding Application No. EP24193517.0, 4 pages.

European Patent Office Extended Search Report, dated Jan. 28, 2025, regarding Application No. EP24193517.0, 7 pages.

European Patent Office Extended Search Report, dated Jan. 8, 2025, regarding Application No. EP24193532.9, 7 pages.

(56)          References Cited

OTHER PUBLICATIONS

European Patent Office Partial Search Report, dated Jan. 8, 2025, regarding Application No. EP24193508.9, 6 pages.

European Patent Office Search Report and Search Opinion, dated Jan. 2, 2025, regarding Application No. EP24193504.8, 7 pages.

Geliev Av et al: "Conceptual Design of an Electric Propulsion System Based on Fuel Cells for an Ultralight Manned Aircraft", 2019 International Conference on Electrotechnical Complexes and Systems (ICOECS), IEEE, Oct. 21, 2019 (Oct. 21, 2019), pp. 1-17, XP033684161, DOI: 10.1109/ICOECS46375.2019.8949950 [retrieved on Jan. 3, 2020].

Notice of Allowance, dated Aug. 26, 2025, regarding U.S. Appl. No. 18/610,697, 13 pages.

Office Action, dated Dec. 29, 2025, regarding U.S. Appl. No. 18/610,580, 46 pages.

European Patent Office Communication, dated Feb. 11, 2026, regarding Application No. EP24193577.4, 4 pages.

* cited by examiner

1300

1302

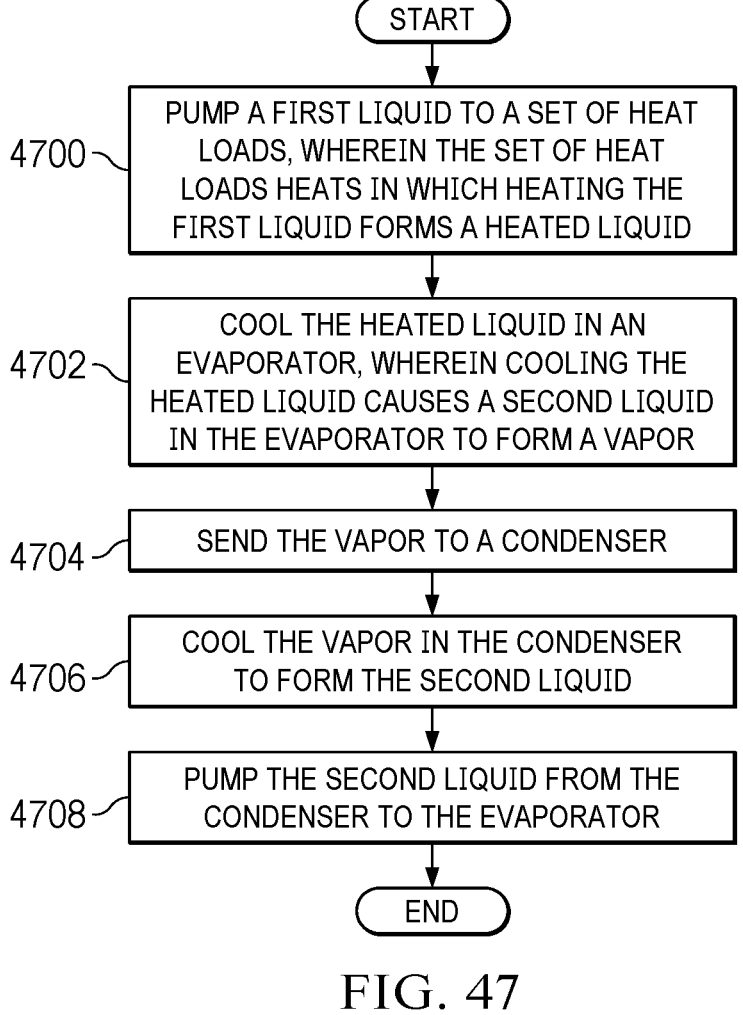

START

4700 — PUMP A FIRST LIQUID TO A SET OF HEAT LOADS, WHEREIN THE SET OF HEAT LOADS HEATS IN WHICH HEATING THE FIRST LIQUID FORMS A HEATED LIQUID

4702 — COOL THE HEATED LIQUID IN AN EVAPORATOR, WHEREIN COOLING THE HEATED LIQUID CAUSES A SECOND LIQUID IN THE EVAPORATOR TO FORM A VAPOR

4704 — SEND THE VAPOR TO A CONDENSER

4706 — COOL THE VAPOR IN THE CONDENSER TO FORM THE SECOND LIQUID

4708 — PUMP THE SECOND LIQUID FROM THE CONDENSER TO THE EVAPORATOR

END

FIG. 47

PUMPED TWO-PHASE COOLING OF AIRCRAFT ELECTRONICS

CROSS-REFERENCE TO RELATED APPLICATIONS

This application claims the benefit of U.S. Provisional Patent Application Ser. No. 63/519,514, filed Aug. 14, 2023, and entitled "Liquid Hydrogen Feed System for Fuel Cell Powered Aircraft," which is incorporated herein by reference in its entirety.

This application is related to the following U.S. Patent Applications: U.S. patent application Ser. No. 18/610,526, filed Mar. 20, 2024, and entitled "Configuration for a LH2 Fuel Cell Aircraft with Distributed Systems;" U.S. patent application Ser. No. 18/610,580, filed Mar. 20, 2024, and entitled "Method of Nacelle Heat Exchanger Integration for a Hydrogen Fueled Fuel Cell Powered Aircraft;" U.S. patent application Ser. No. 18/610,697, filed Mar. 20, 2024, and entitled "Liquid Hydrogen Feed System for Fuel Cell Powered Aircraft;" U.S. patent application Ser. No. 18/610,742, filed Mar. 20, 2024, and entitled "Start-Up of High Temperature Proton Exchange Membrane (HTPEM) Fuel Cell Aircraft with Multiple Power Generating Units;" U.S. patent application Ser. No. 18/610,816, filed Mar. 20, 2024, and entitled "Low Temperature Proton Exchange Membrane Charge Air Heat Exchanger;" and U.S. patent application Ser. No. 18/610,868, filed Mar. 20, 2024, and entitled "Fuel Cell Aircraft Thermal Management System;" which are incorporated herein by reference in their entirety.

BACKGROUND INFORMATION

1. Field

The present disclosure relates generally to aircraft and in particular, to aircraft using propulsion systems powered using hydrogen fueled fuel cells.

2. Background

Aircraft with electric propulsion systems is an emerging trend that can provide many benefits for the aviation industry. Electric aircraft can provide many environmental benefits. For example, electric aircraft produce zero emissions during flight which can reduce their carbon footprint.

Further, electric motors are generally quieter than combustion engines. As a result, noise pollution can be reduced with the use of these types of aircraft.

Electric aircraft have electric propulsion systems that can be powered using hydrogen. The hydrogen can be stored in tanks. The hydrogen stored in these tanks is typically in a liquid state and stored at extremely low temperatures such as −253 degrees C.

The hydrogen in these fuel tanks can be stored as liquid hydrogen, gaseous hydrogen, or other hydrogen carriers such as methane or other hydrocarbons in liquid or gaseous state. A reformer can be used in a reformation process to remove hydrogen from hydrocarbon molecules.

The hydrogen in these fuel tanks can then be sent to fuel cells for use in generating electricity to power propulsion systems and other systems in aircraft. These fuel cells are electrochemical devices that convert the hydrogen and oxygen obtained from the air into electricity to power the propulsion systems in aircraft. These types of cells operate with high efficiency and minimal emissions with the byproduct being water vapor.

SUMMARY

An embodiment of the present disclosure provides an aircraft cooling system comprising an evaporator, condenser, an accumulator, and a pump system. The evaporator is configured to cool a set of heat loads in an aircraft using a liquid. The liquid forms a vapor in response to cooling the set of heat loads. The condenser is configured to receive the vapor from the evaporator and cool the vapor in which cooling the vapor forms the liquid. The accumulator is configured to receive the liquid from the condenser and store the liquid. The pump system is configured to pump the liquid stored in the accumulator to the evaporator.

Another embodiment of the present disclosure provides an aircraft cooling system comprising a first pump, an evaporator, a condenser, and a second pump. The first pump is configured to pump a first liquid in a liquid loop to a set of heat loads. The set of heat loads heats the first liquid in which heating the first liquid forms a heated liquid. The evaporator is configured to receive the heated liquid and cool the heated liquid. The cooling of the heated liquid causes a second liquid in a liquid-vapor loop to form a vapor. The condenser is configured to receive the vapor and cool the vapor in which cooling the vapor forms the second liquid. The second pump is configured to pump the second liquid from the condenser to the evaporator.

Yet another embodiment of the present disclosure provides an aircraft comprising a fuselage, wings, a number of engines connected to the wings, an evaporator, a condenser, an accumulator, and a pump system. The evaporator is configured to cool a set of heat loads in the aircraft using a liquid. Cooling the set of heat loads using the liquid forms a vapor. The condenser is configured to receive the vapor and cool the vapor in which cooling the vapor forms the liquid. The accumulator is configured to receive the liquid from the condenser and stores the liquid. The pump system is configured to pump the liquid stored in the accumulator to the evaporator.

Another embodiment of the present disclosure provides an aircraft cooling system comprising an evaporator, a condenser, an accumulator, and a pump system. The evaporator is configured to cool a set of heat loads in an aircraft using a liquid, wherein the liquid forms a fluid selected at least one of a vapor or a superheated gas in response to cooling the set of heat loads. The condenser is configured to receive the fluid from the evaporator and cool the fluid in which cooling the vapor forms the liquid. The accumulator is configured to receive the liquid from the condenser and store the liquid. The pump system is configured to pump the liquid stored in the accumulator to the evaporator.

Yet another embodiment of the present disclosure provides an aircraft cooling system comprising a first pump, an evaporator, a condenser, and a second pump. The first pump is configured to pump a first liquid in a liquid loop to a set of heat loads, wherein the set of heat loads heats the first liquid in which heating the first liquid forms a heated liquid. The evaporator is configured to receive the heated liquid and cool the heated liquid, wherein cooling the heated liquid causes a second liquid in a liquid-vapor loop to form a fluid selected at least one of a vapor or a superheated gas. The condenser is configured to receive the fluid and cool the fluid in which cooling the vapor forms the second liquid. The second pump is configured to pump the second liquid from the condenser to the evaporator.

Still another embodiment of the present disclosure provides a method for cooling a set of heat loads in an aircraft. A set of heat loads is cooled in an aircraft using a liquid in an evaporator, wherein cooling the set of heat loads in the liquid forms a vapor. The vapor is cooled with a condenser to form the liquid. The liquid is received from the condenser. The liquid is stored in an accumulator. The liquid stored in the accumulator is pumped to the evaporator.

Still another embodiment of the present disclosure provides a method for cooling a set of heat loads in an aircraft. A first liquid is pumped to a set of heat loads. The set of heat loads in which heating the first liquid forms a heated liquid. The heated liquid is cooled in an evaporator. Cooling the heated liquid causes a second liquid in the evaporator to form a vapor. The vapor is sent to a condenser. The vapor is cooled in the condenser to form the second liquid. The second liquid is pumped from the condenser to the evaporator.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

4

Figure 15:
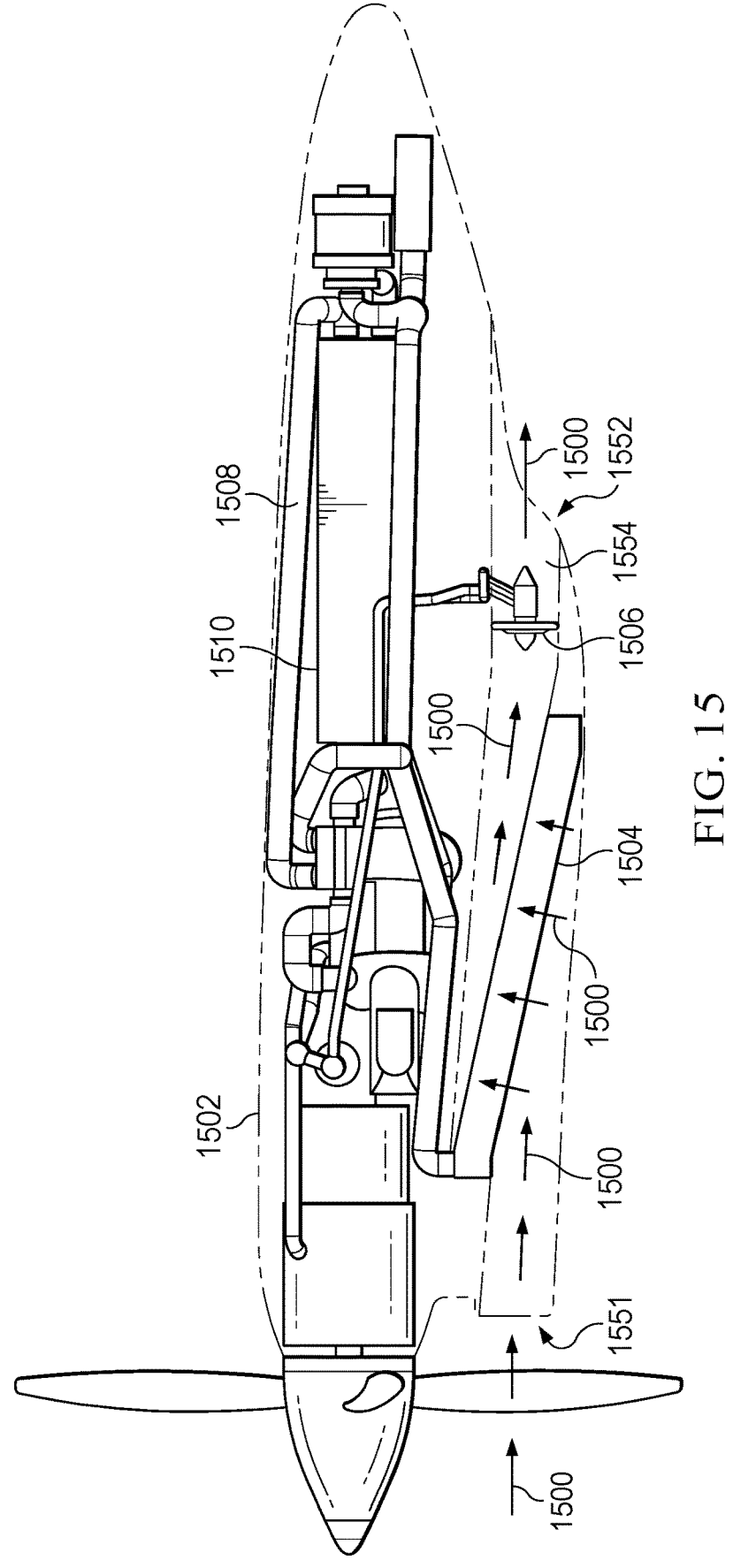
Figure 16:
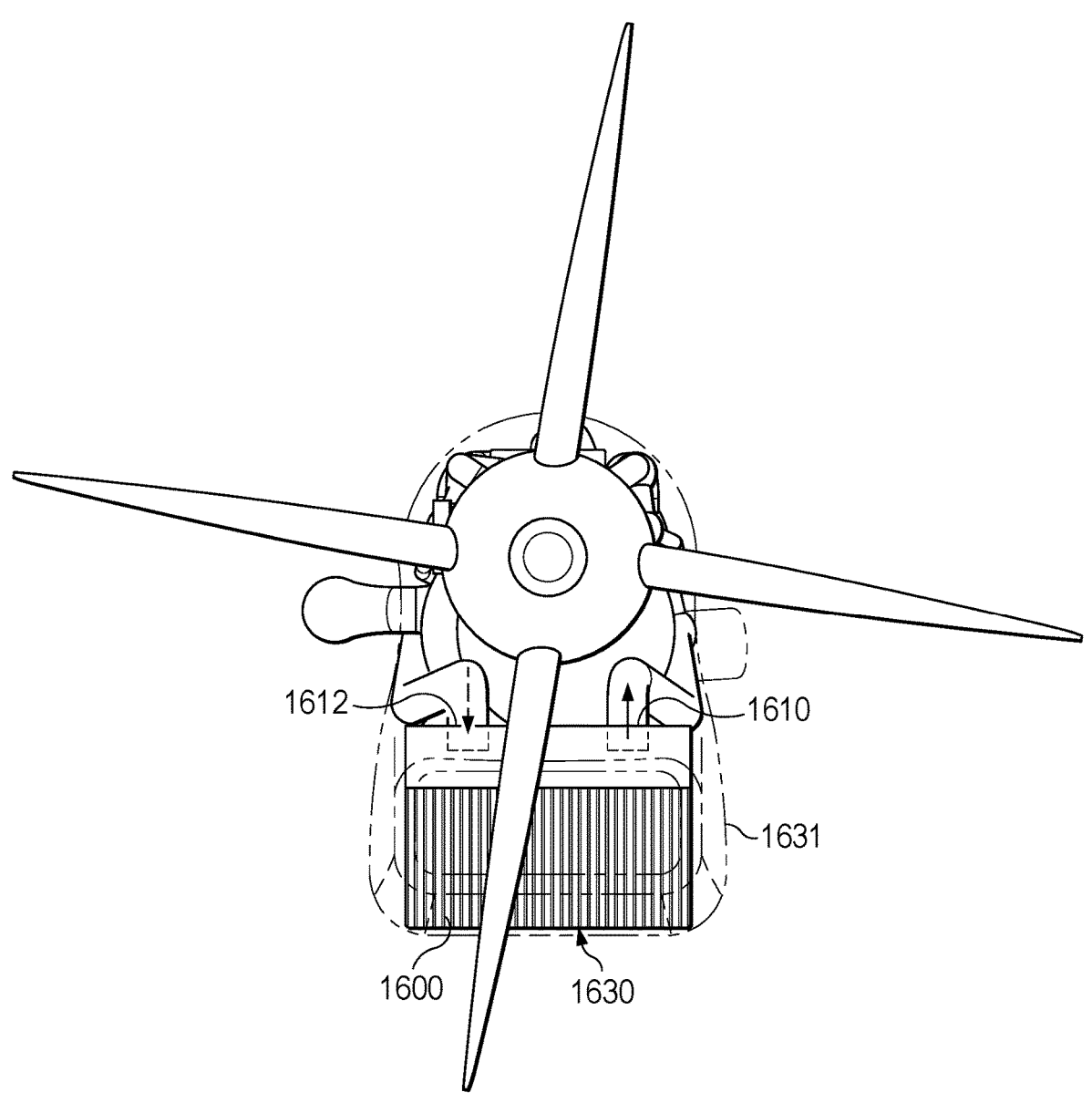
Figure 17:
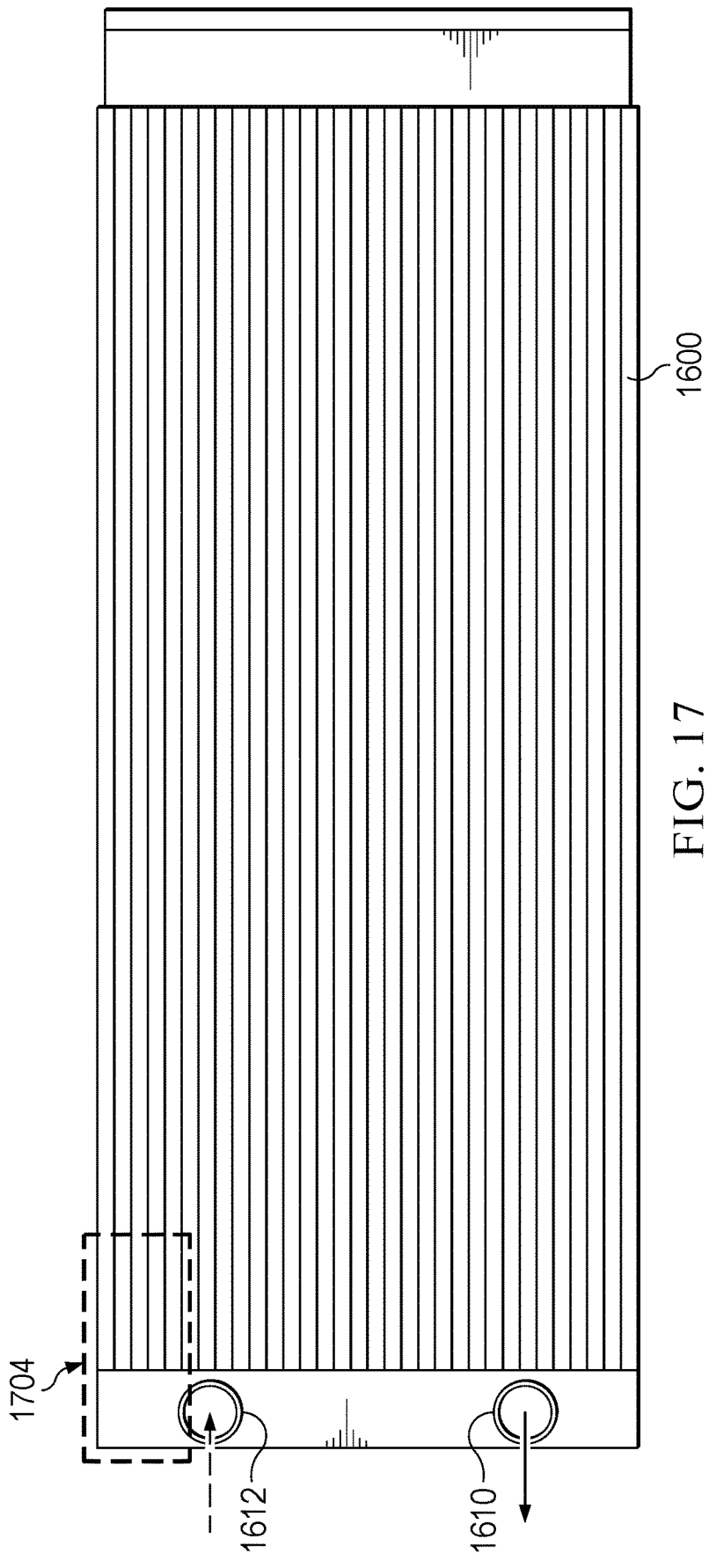
Figure 18:
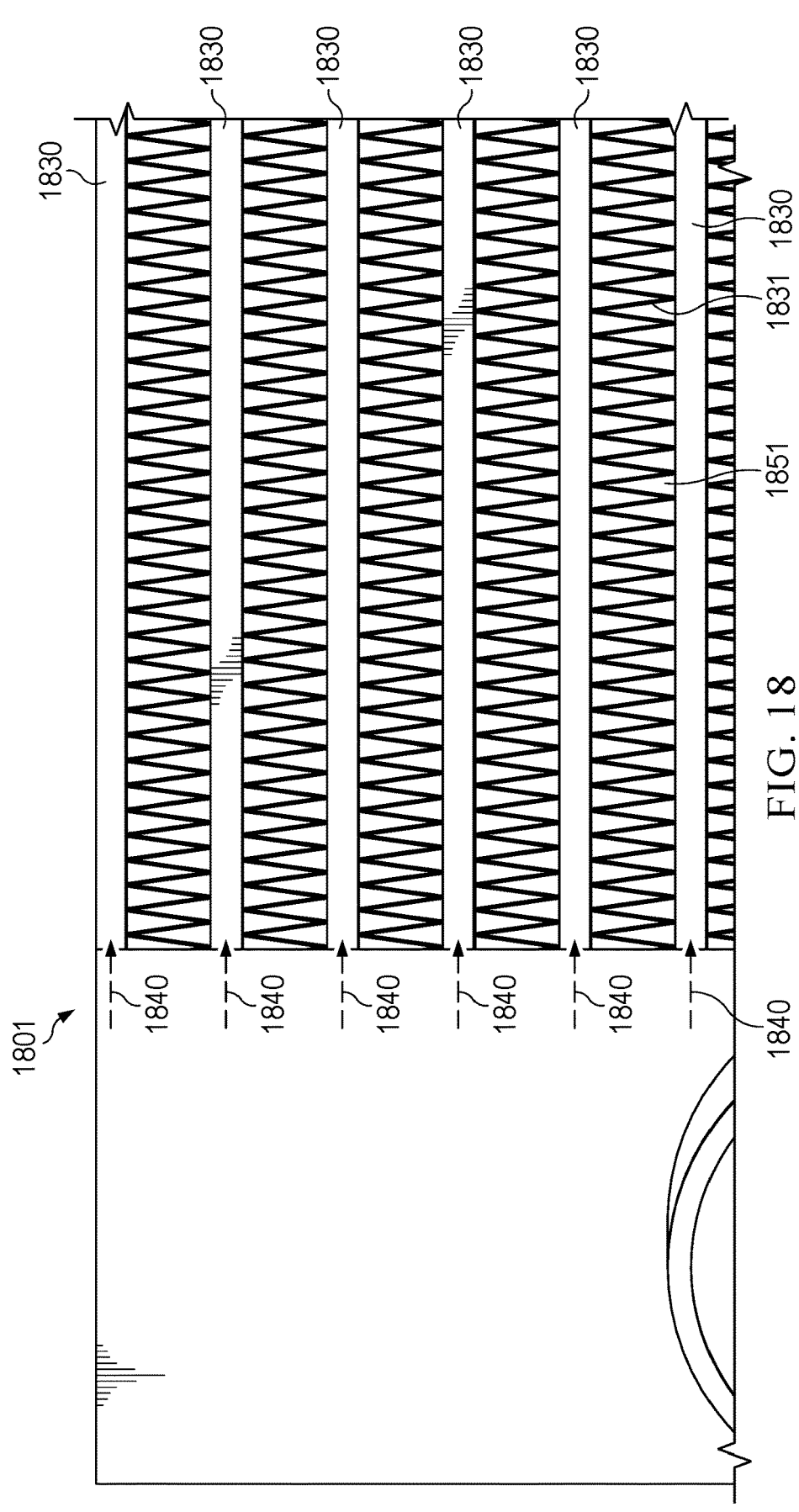
Figure 19:
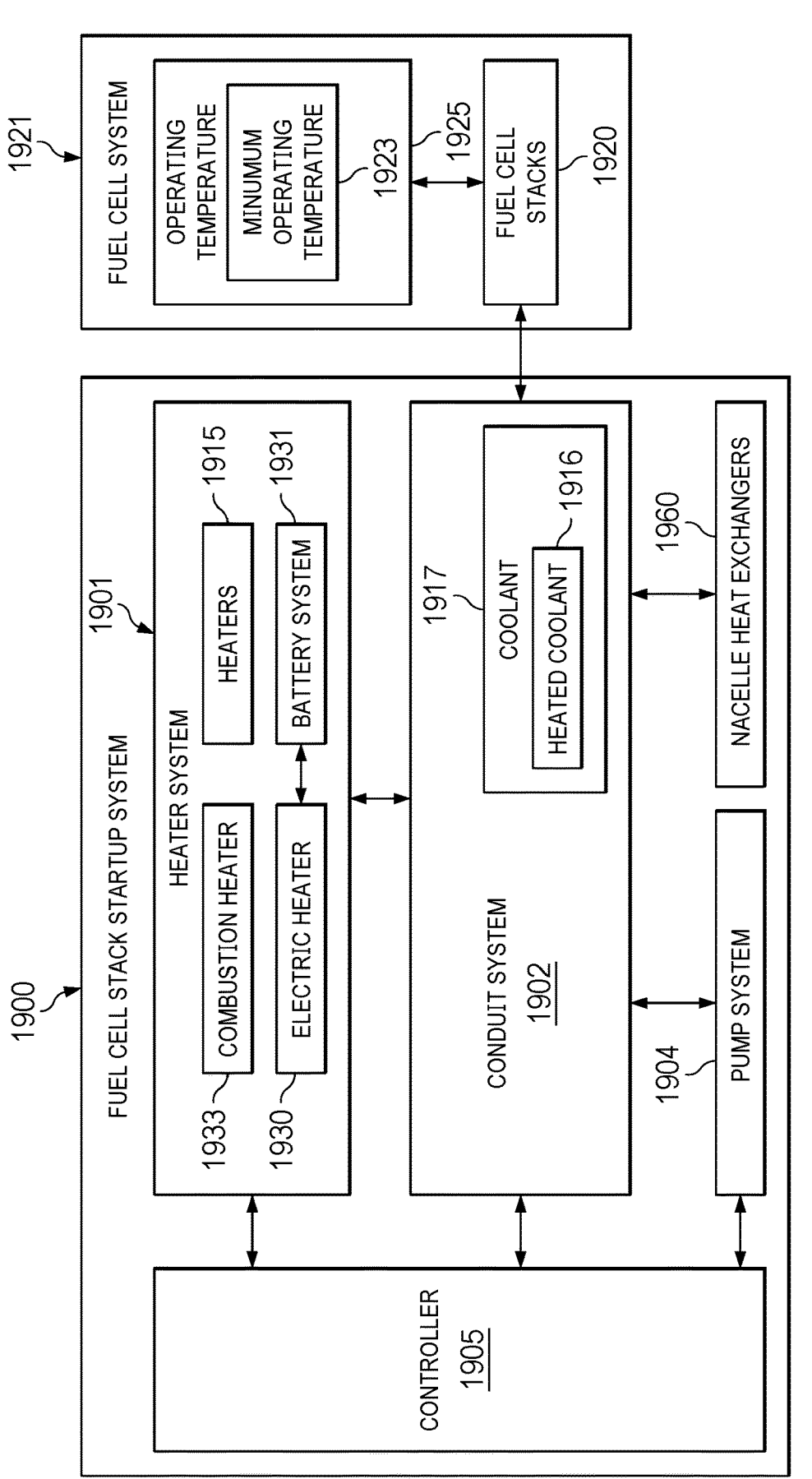
Figure 20:
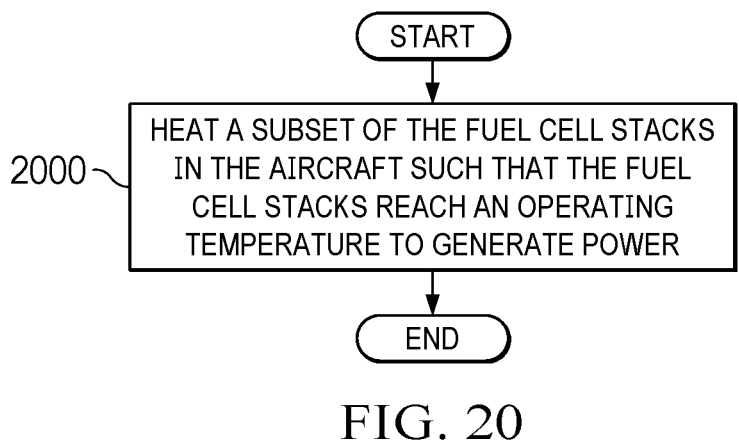
Figure 21:
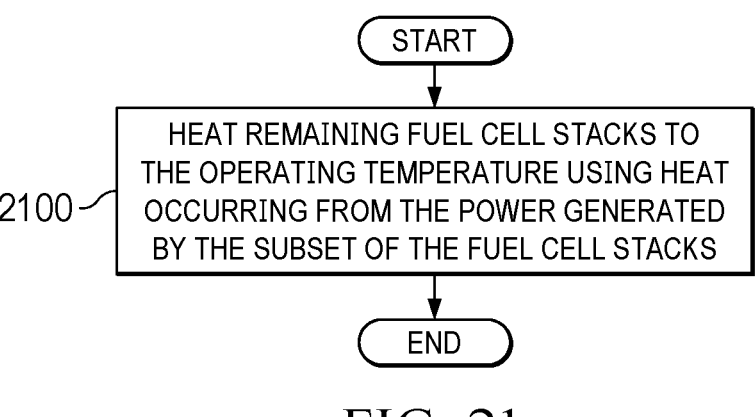
Figure 22:
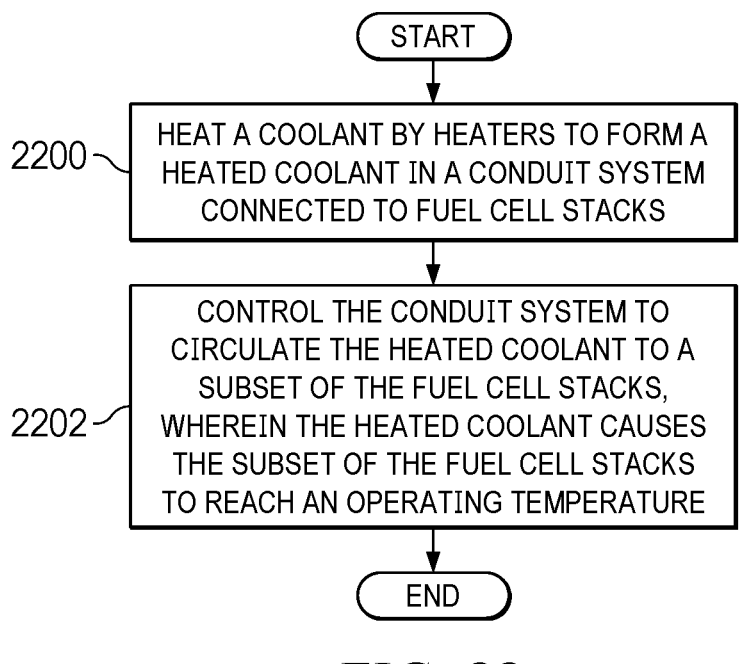
Figure 23:
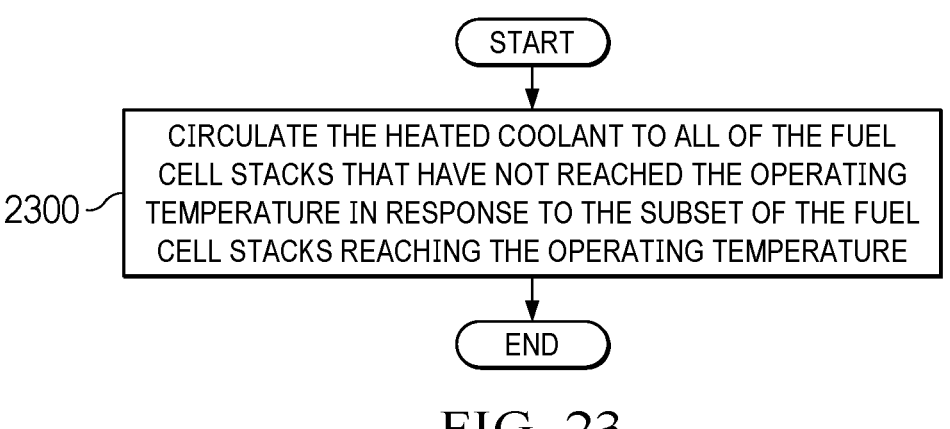
Figure 24:
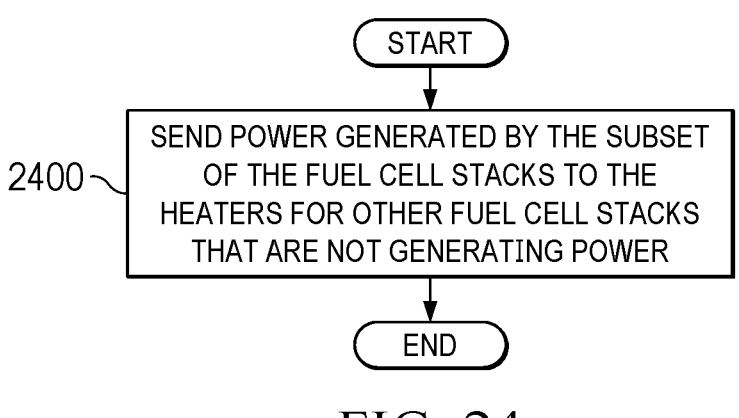
Figure 25:
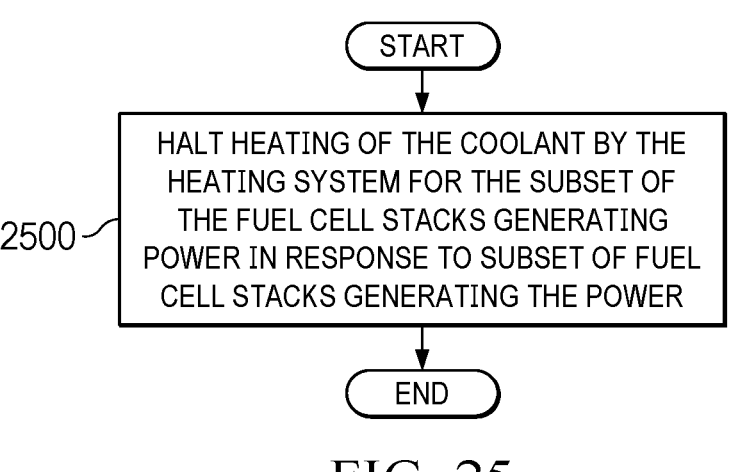
Figure 26:
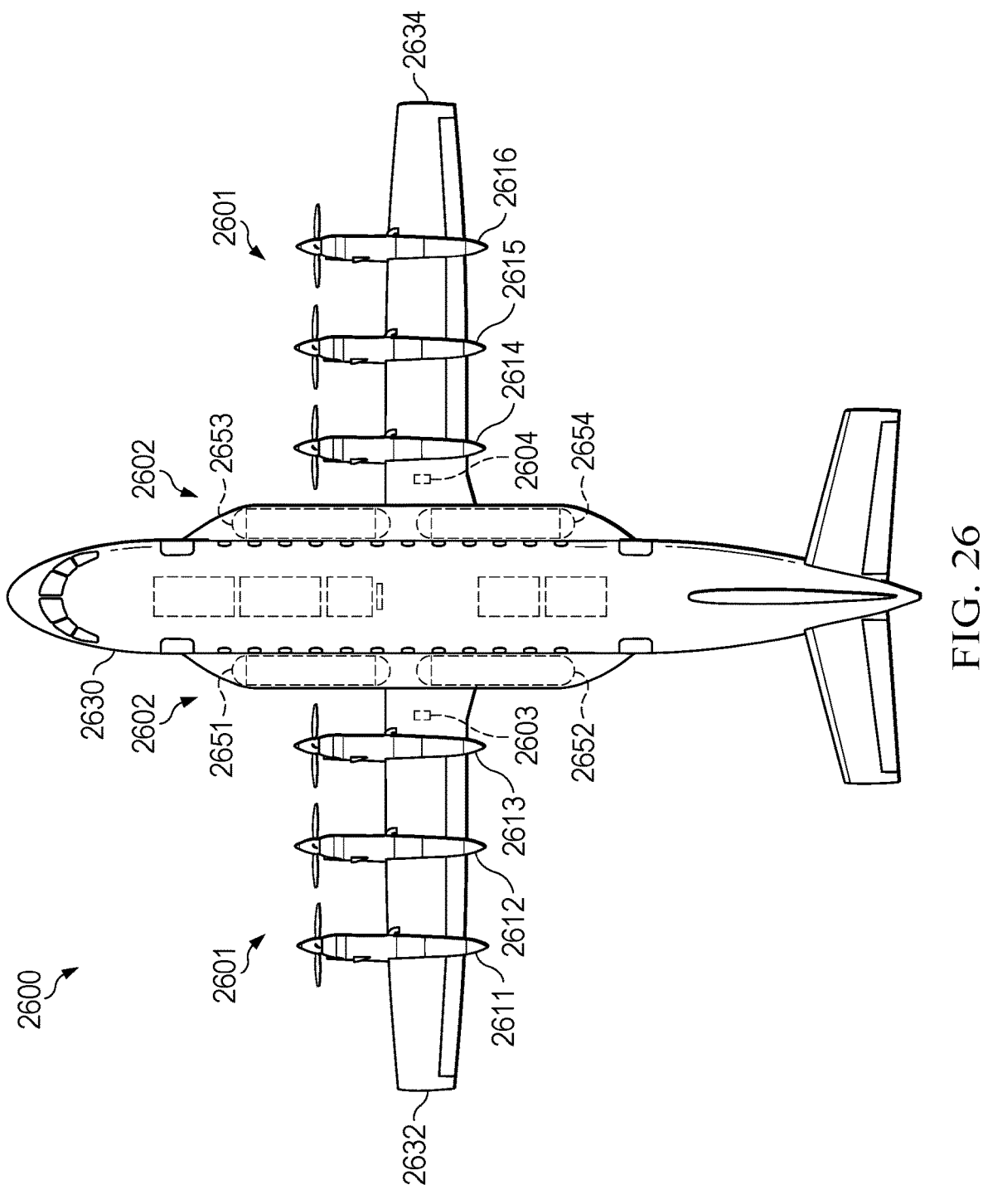
Figure 27:
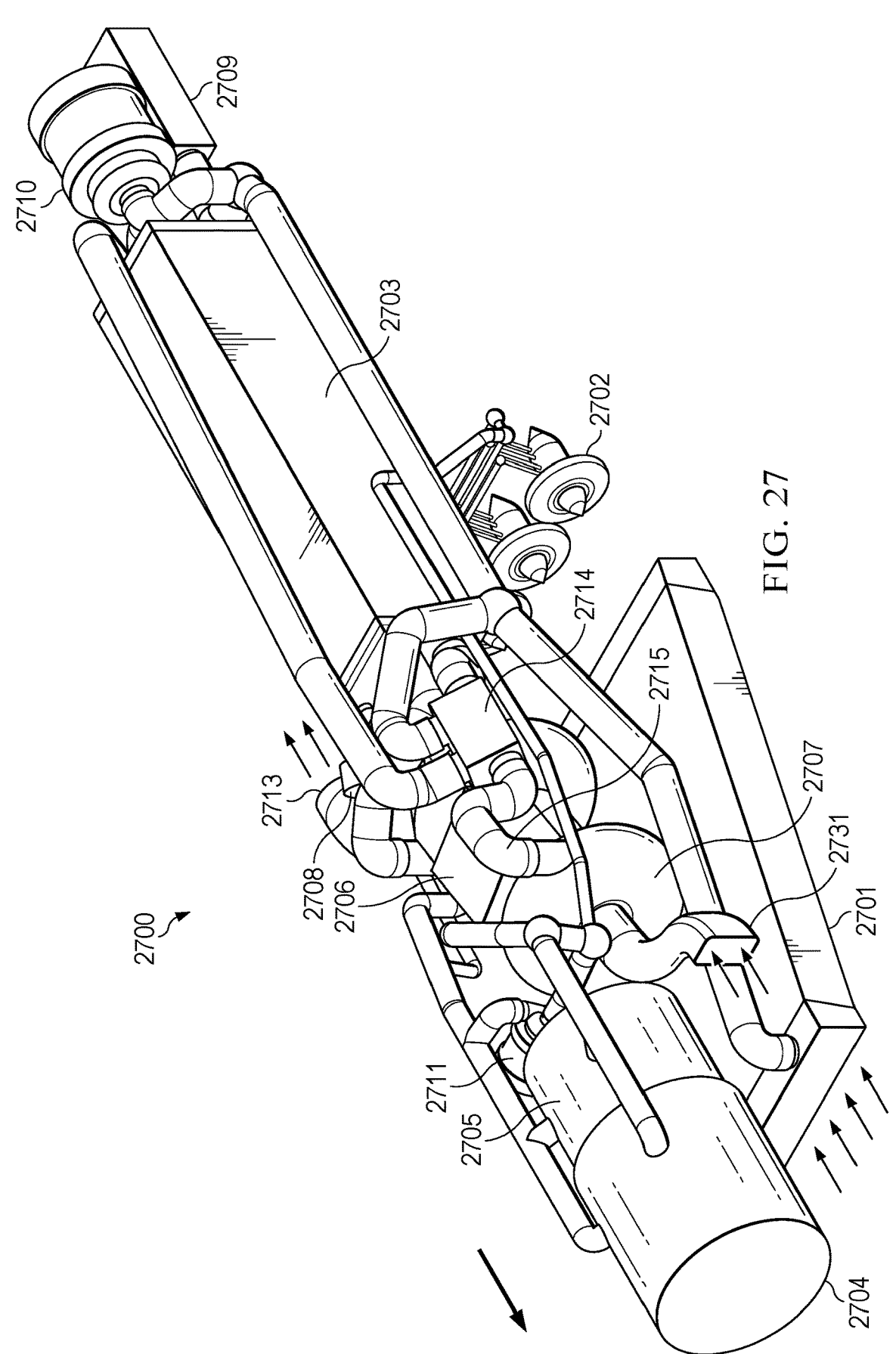
Figure 28:
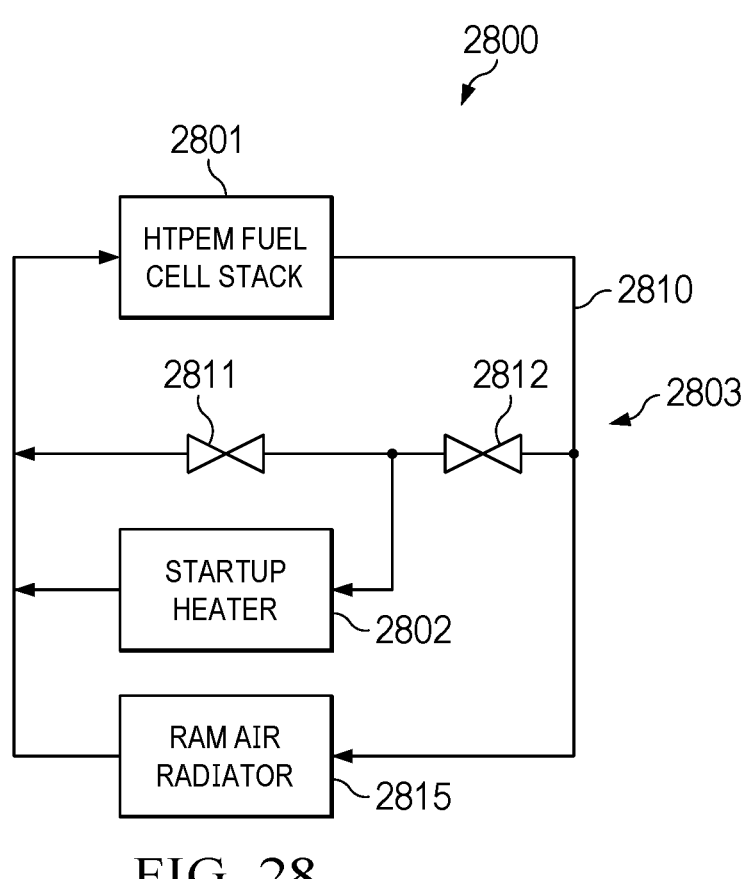
Figure 29:
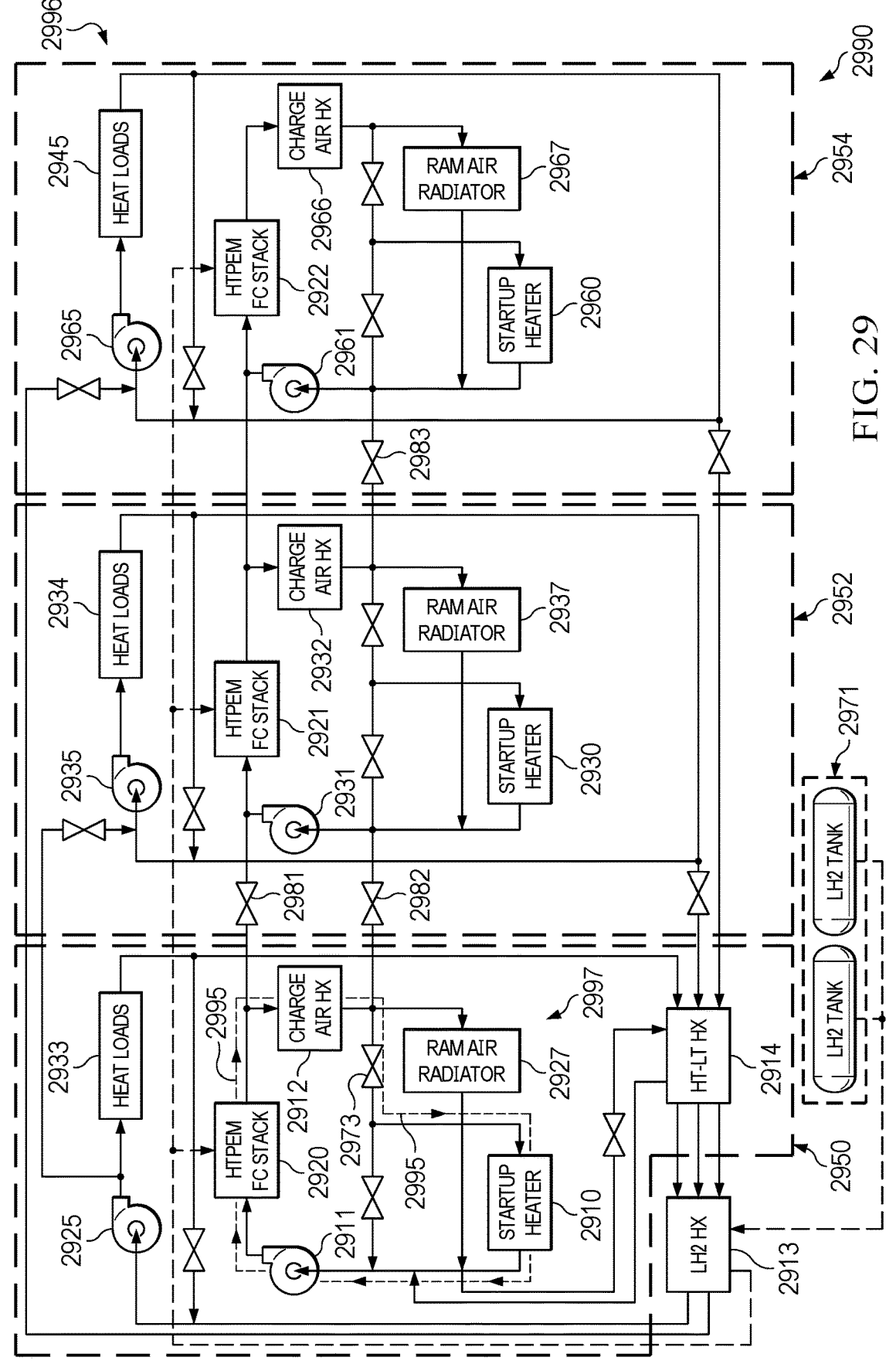
Figure 30:
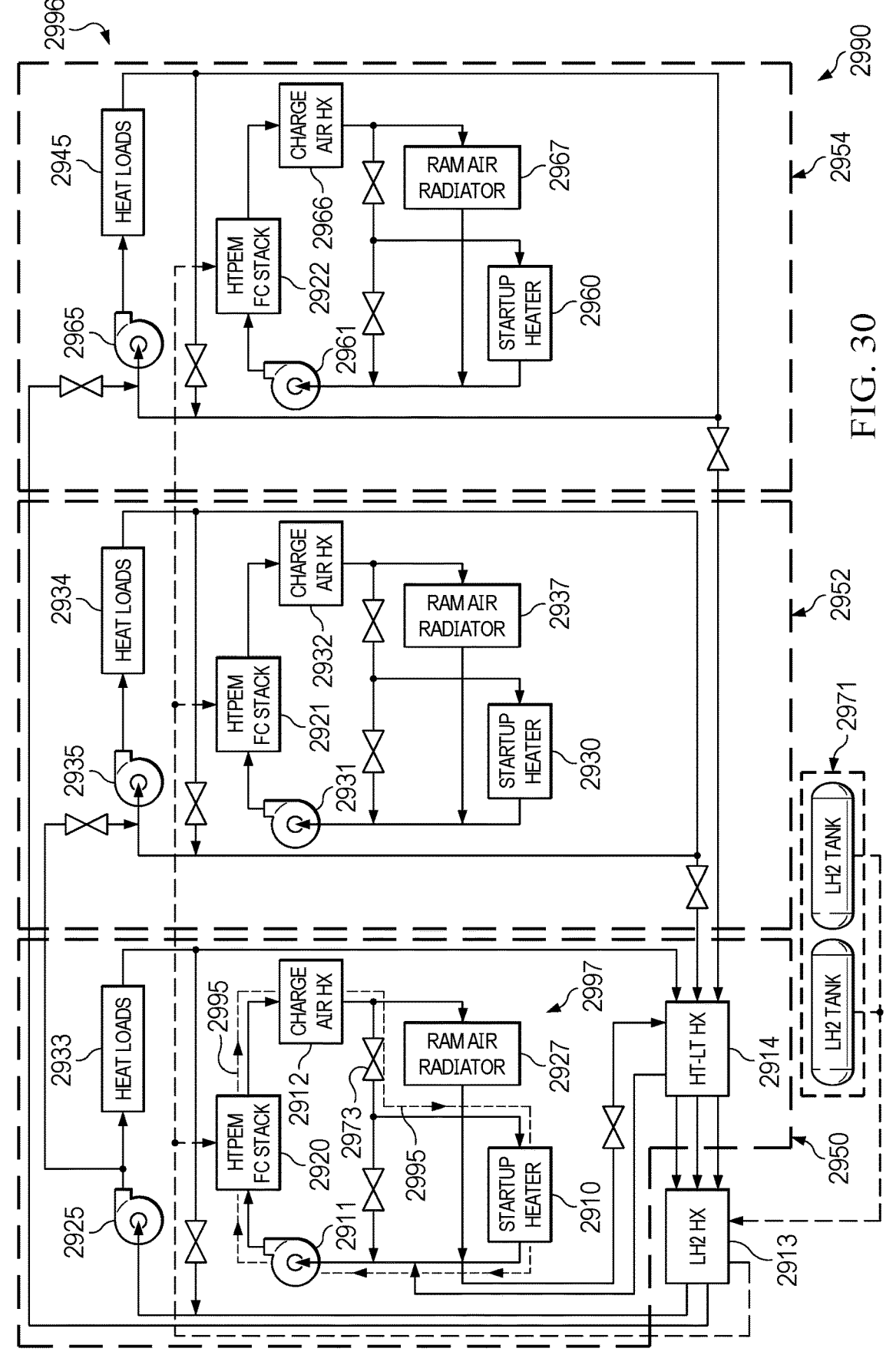
Figure 31:
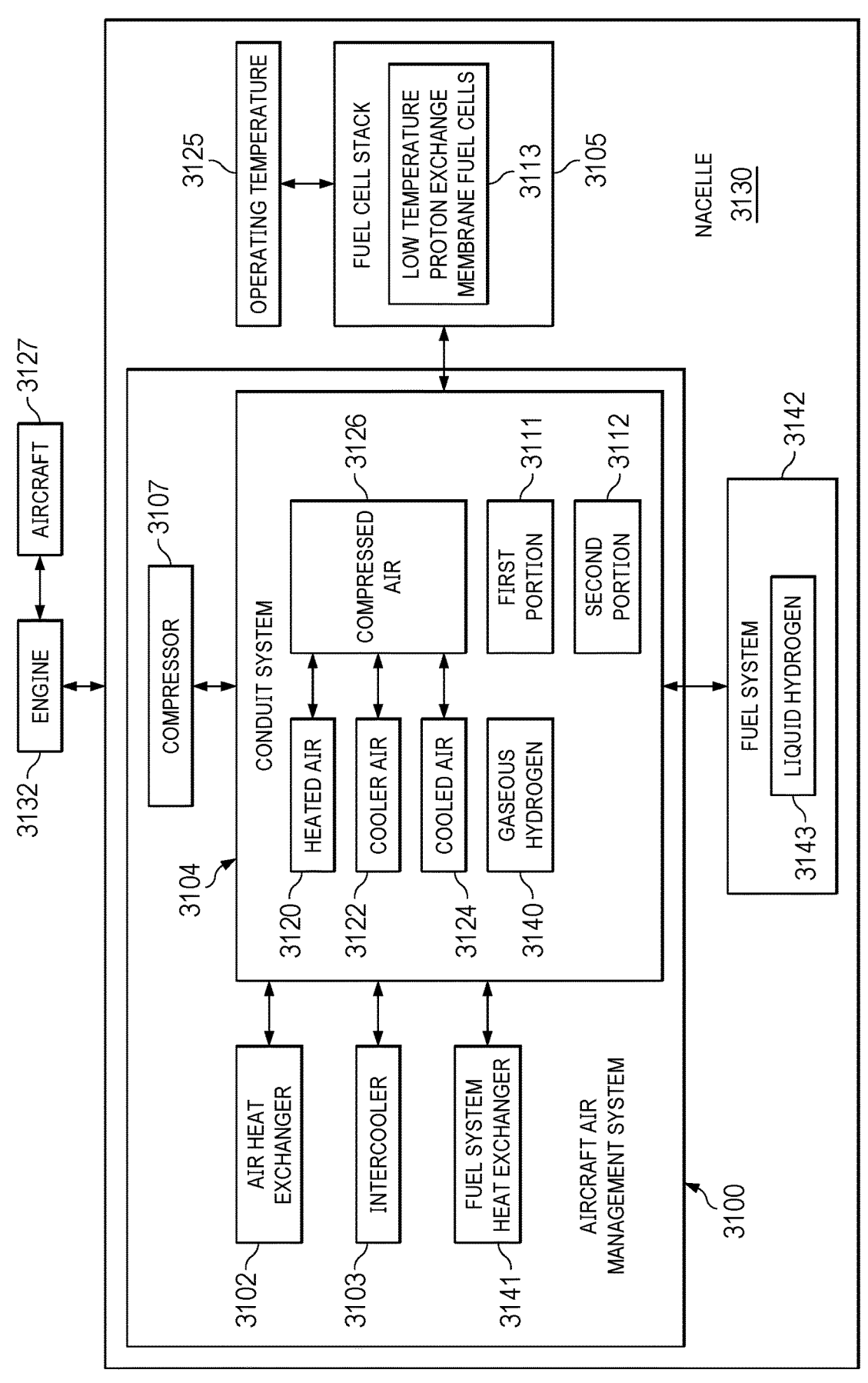
Figure 32:
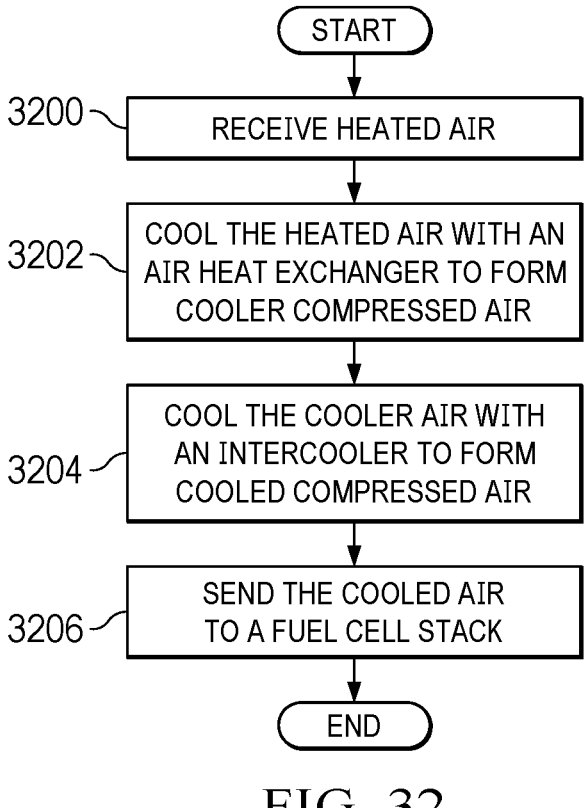
Figure 33:
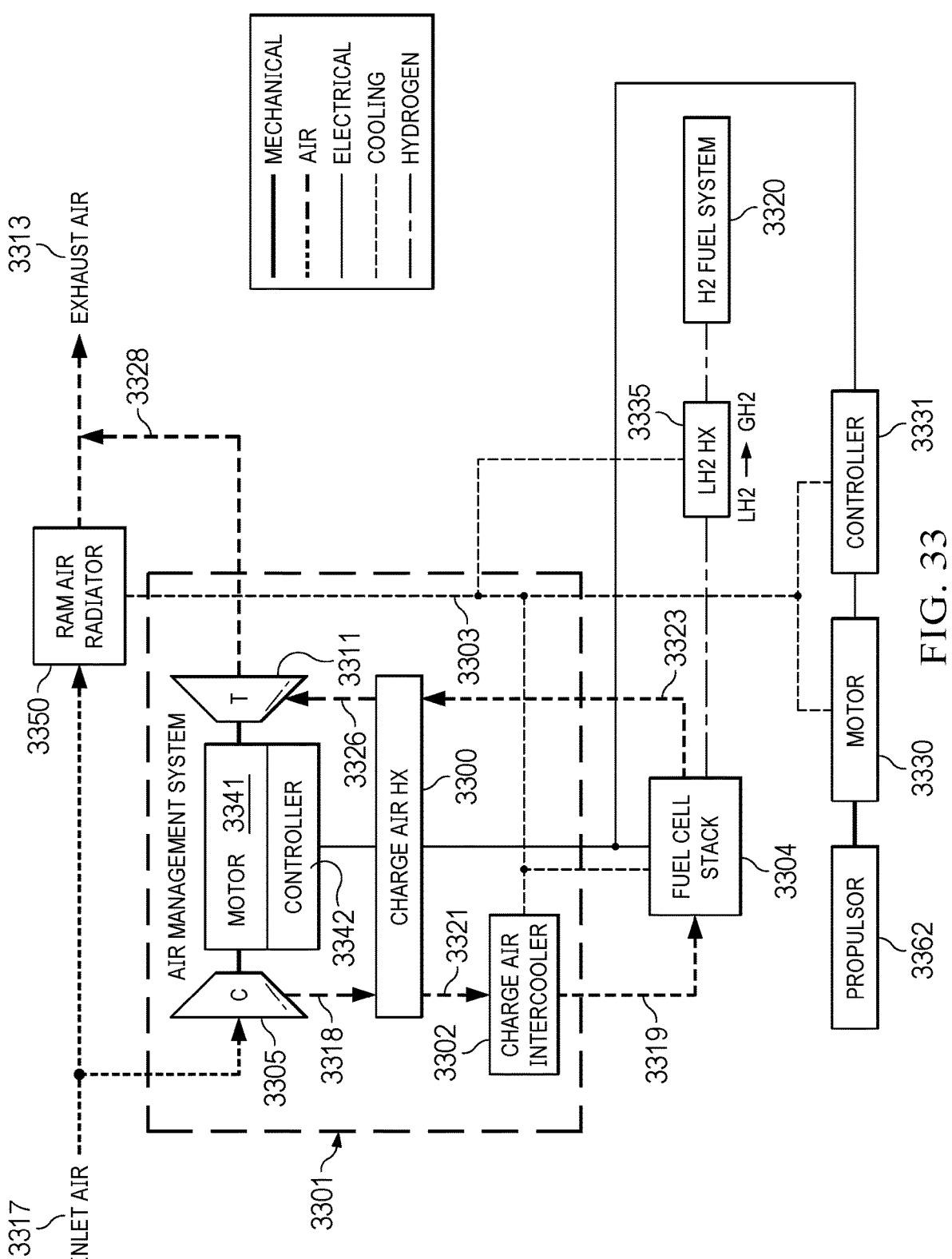
Figure 34:
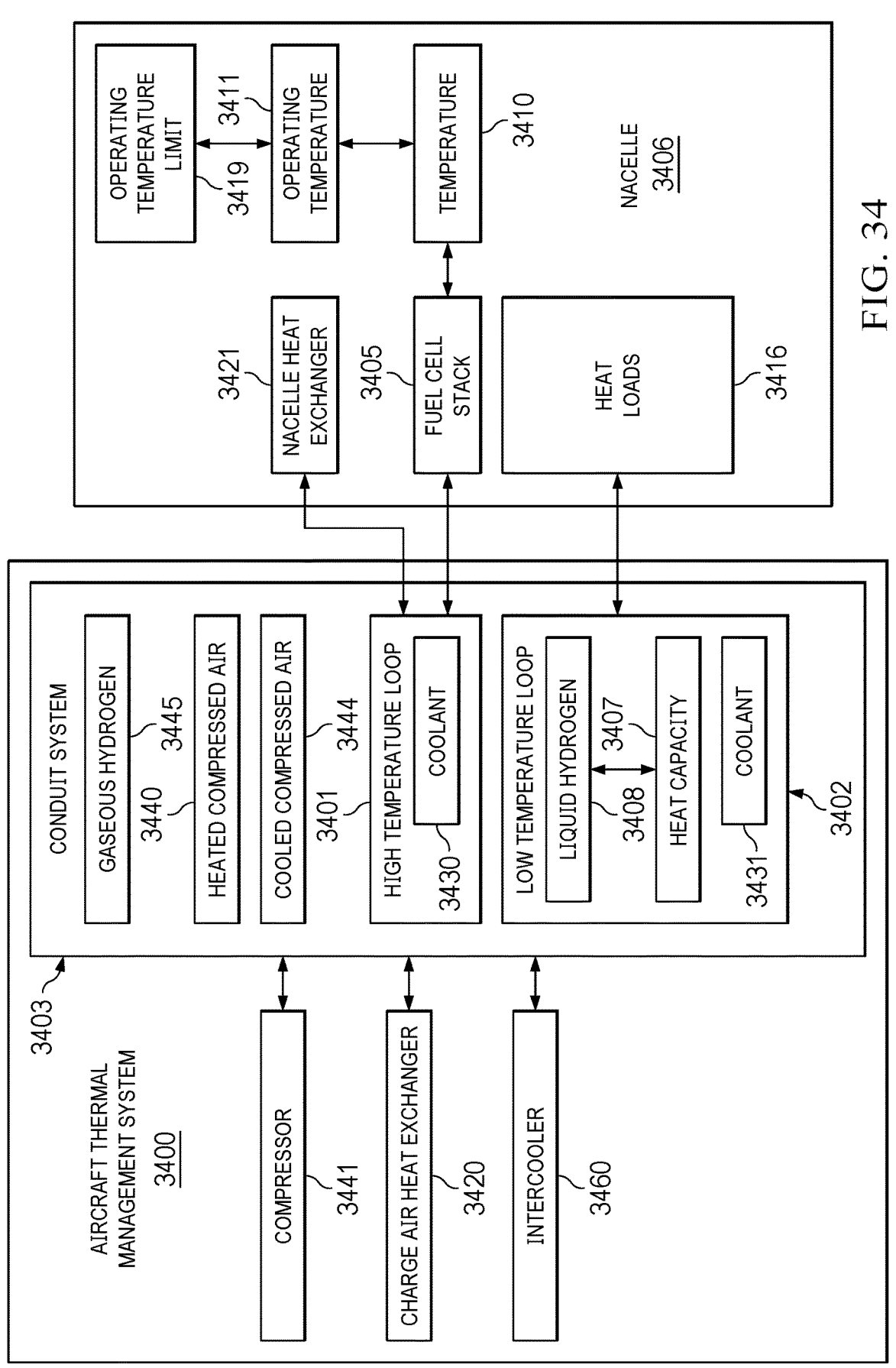
Figure 35:
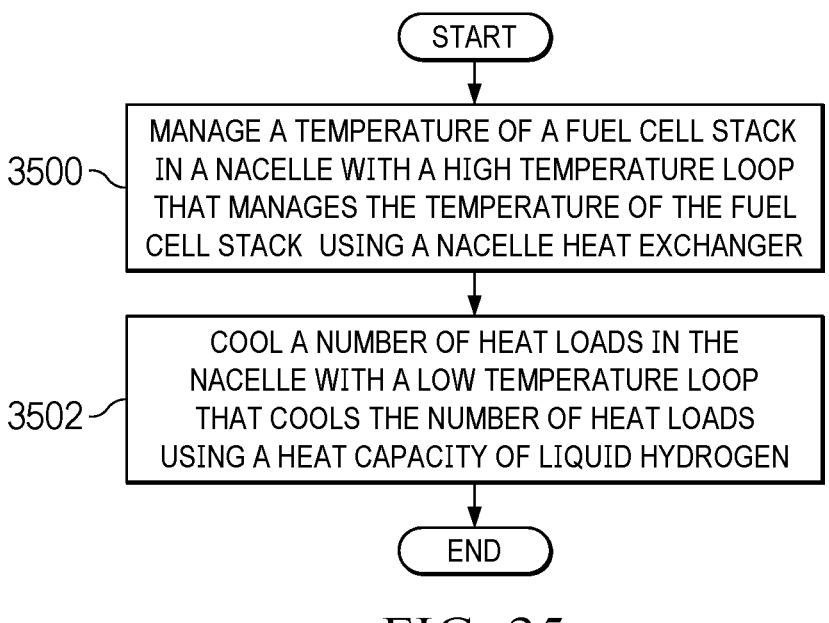
Figure 36:
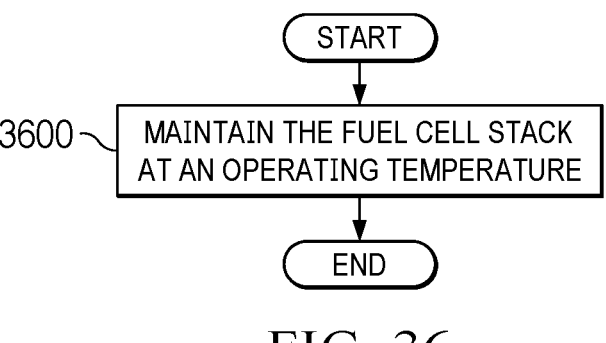
Figure 37:
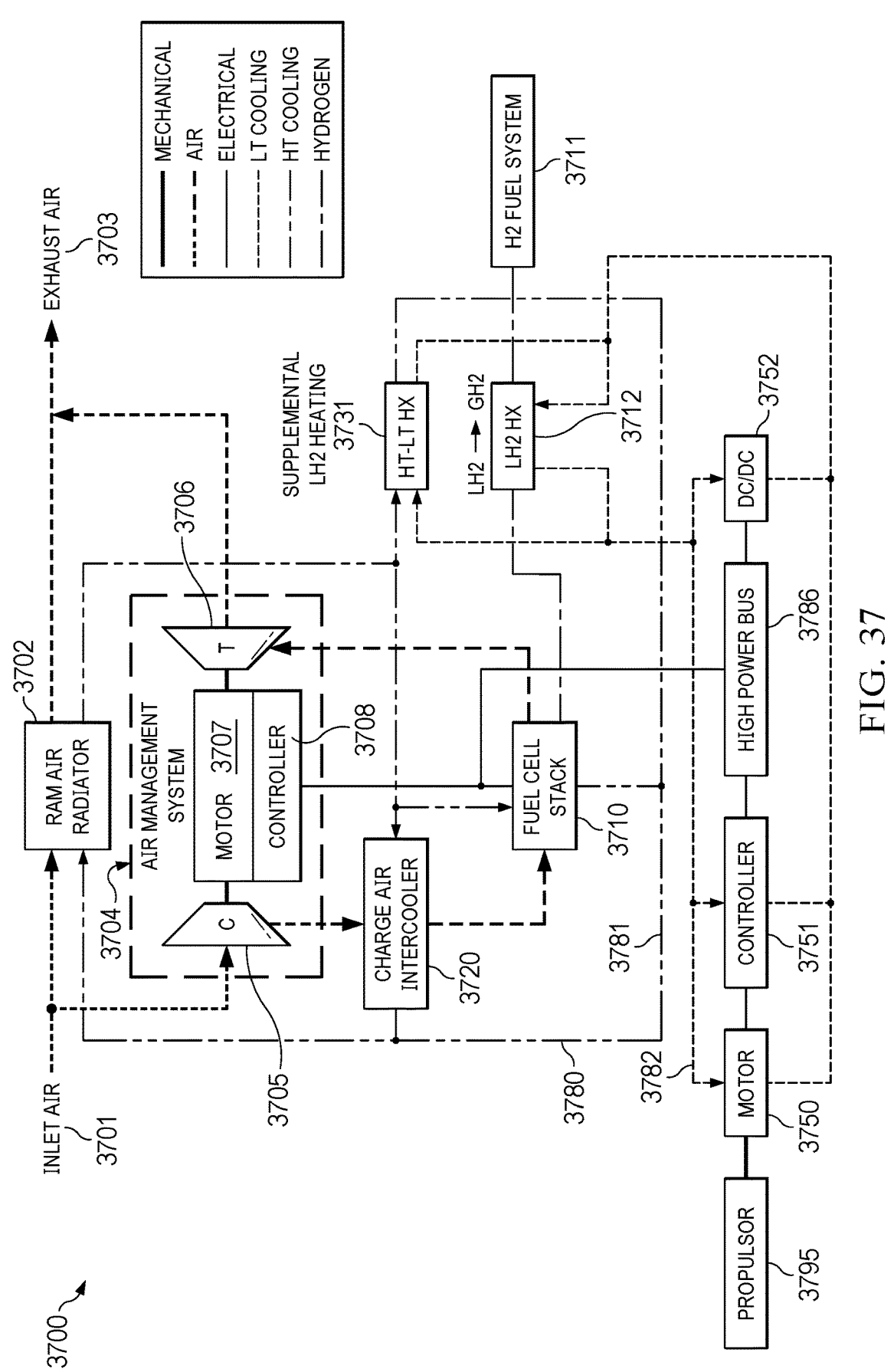
Figure 38:
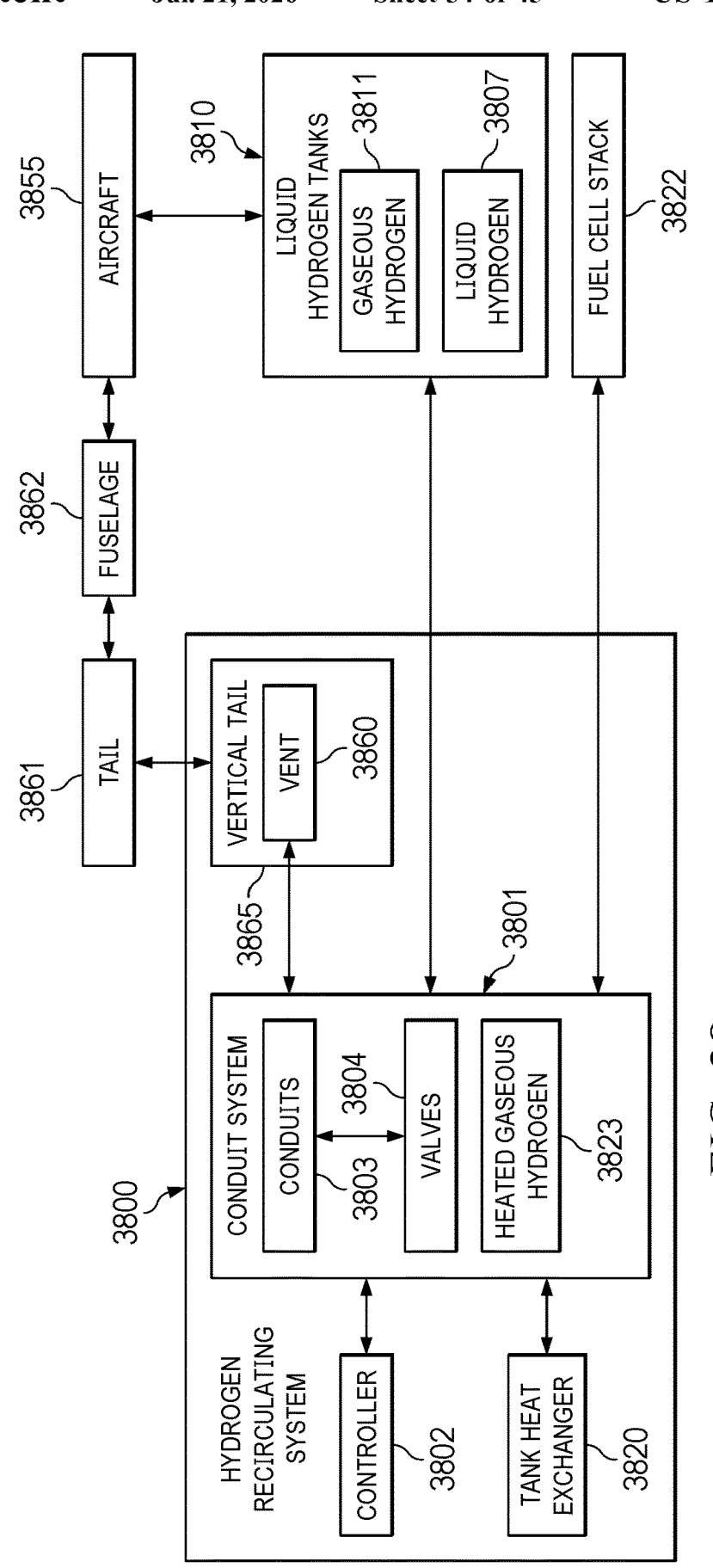
Figure 39:
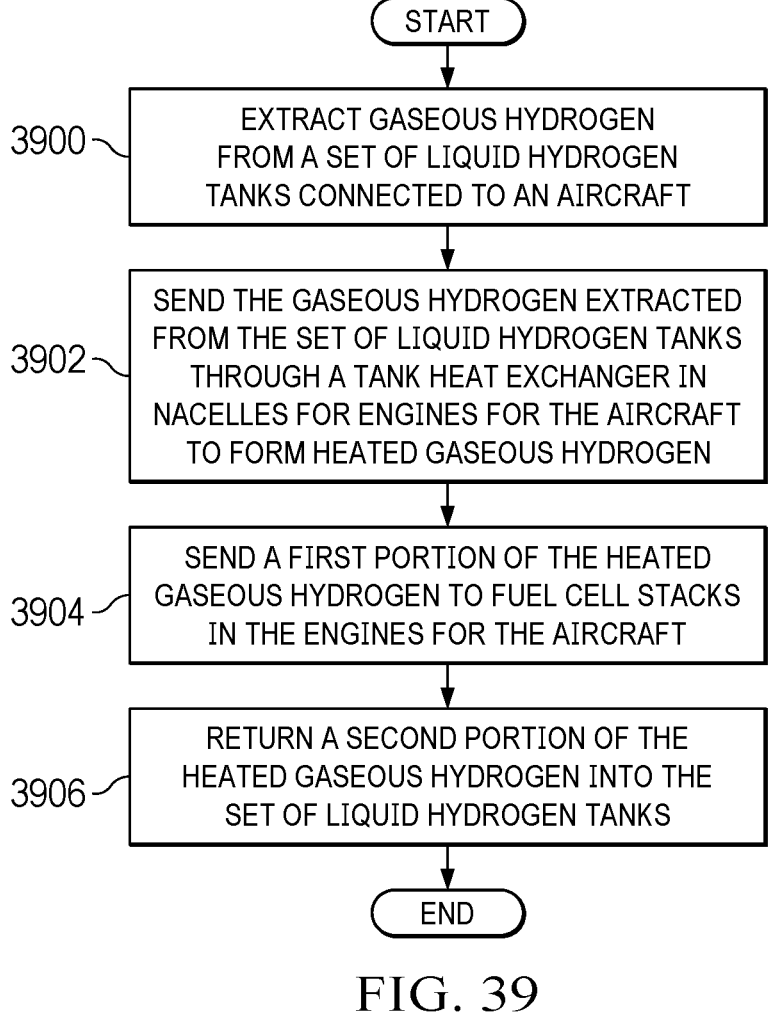
Figure 40:
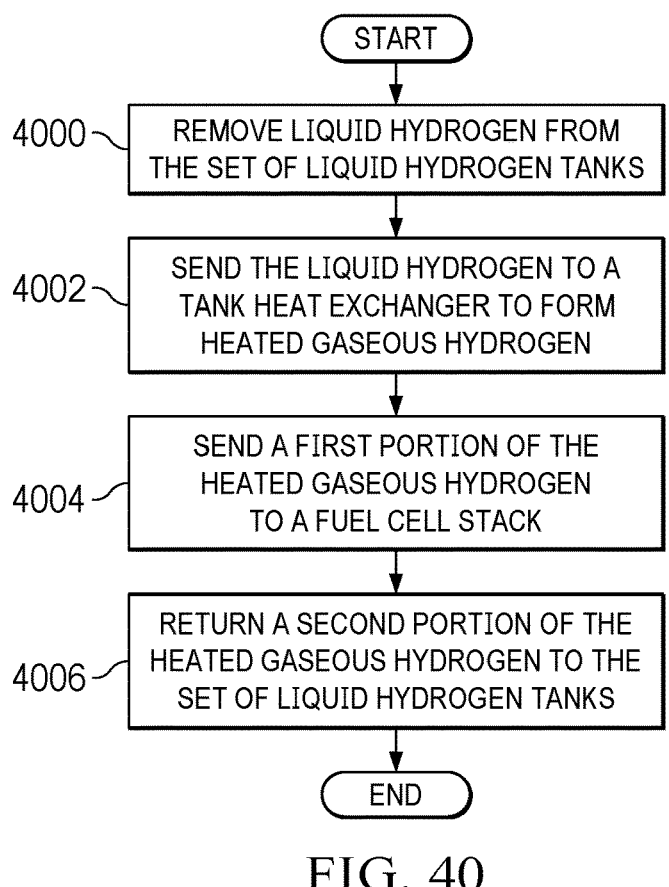
Figure 41:
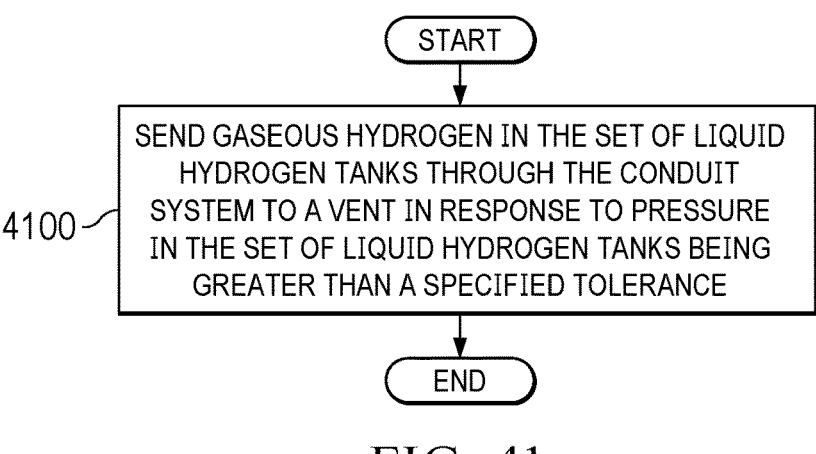
Figure 42:
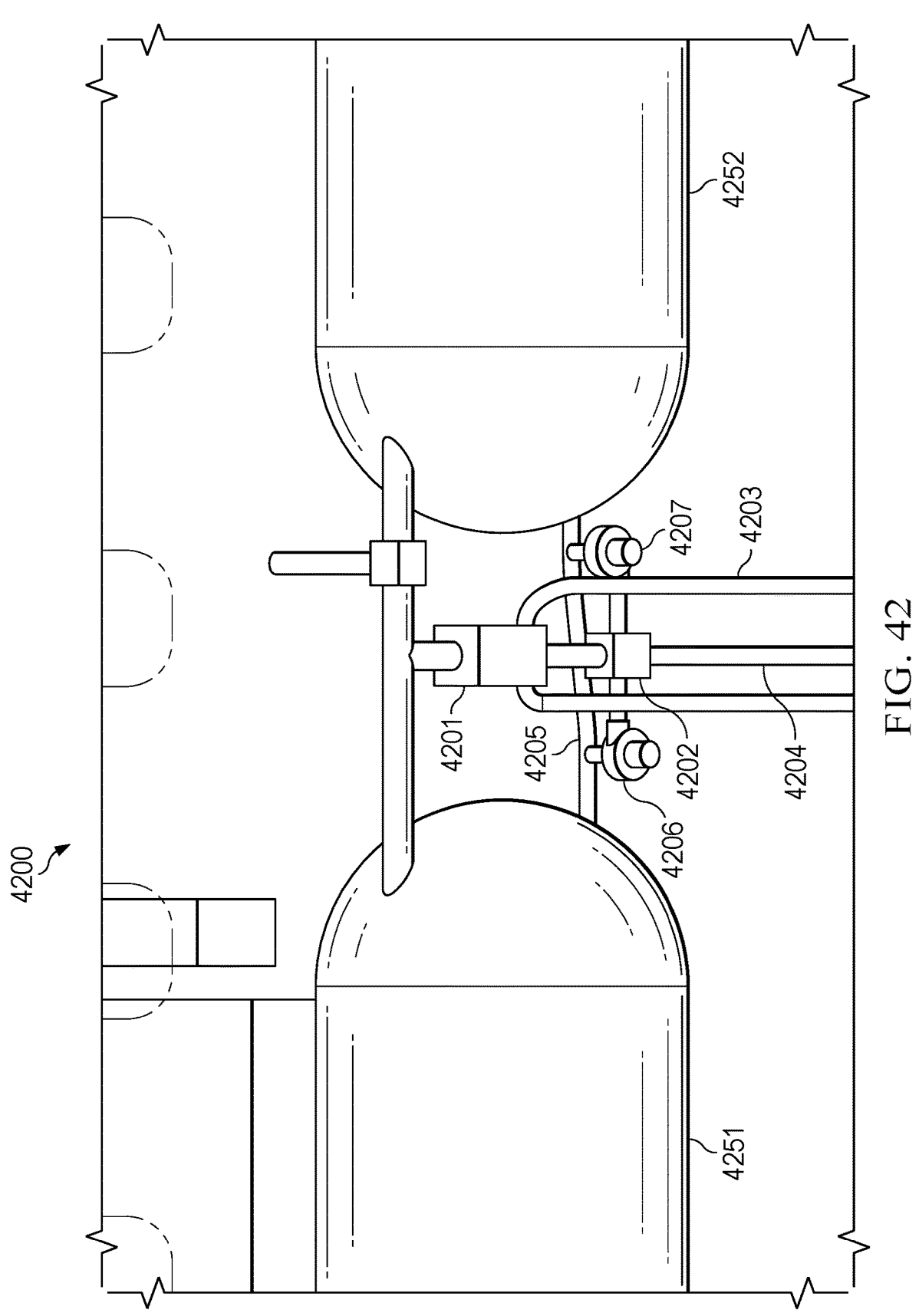
Figure 43:
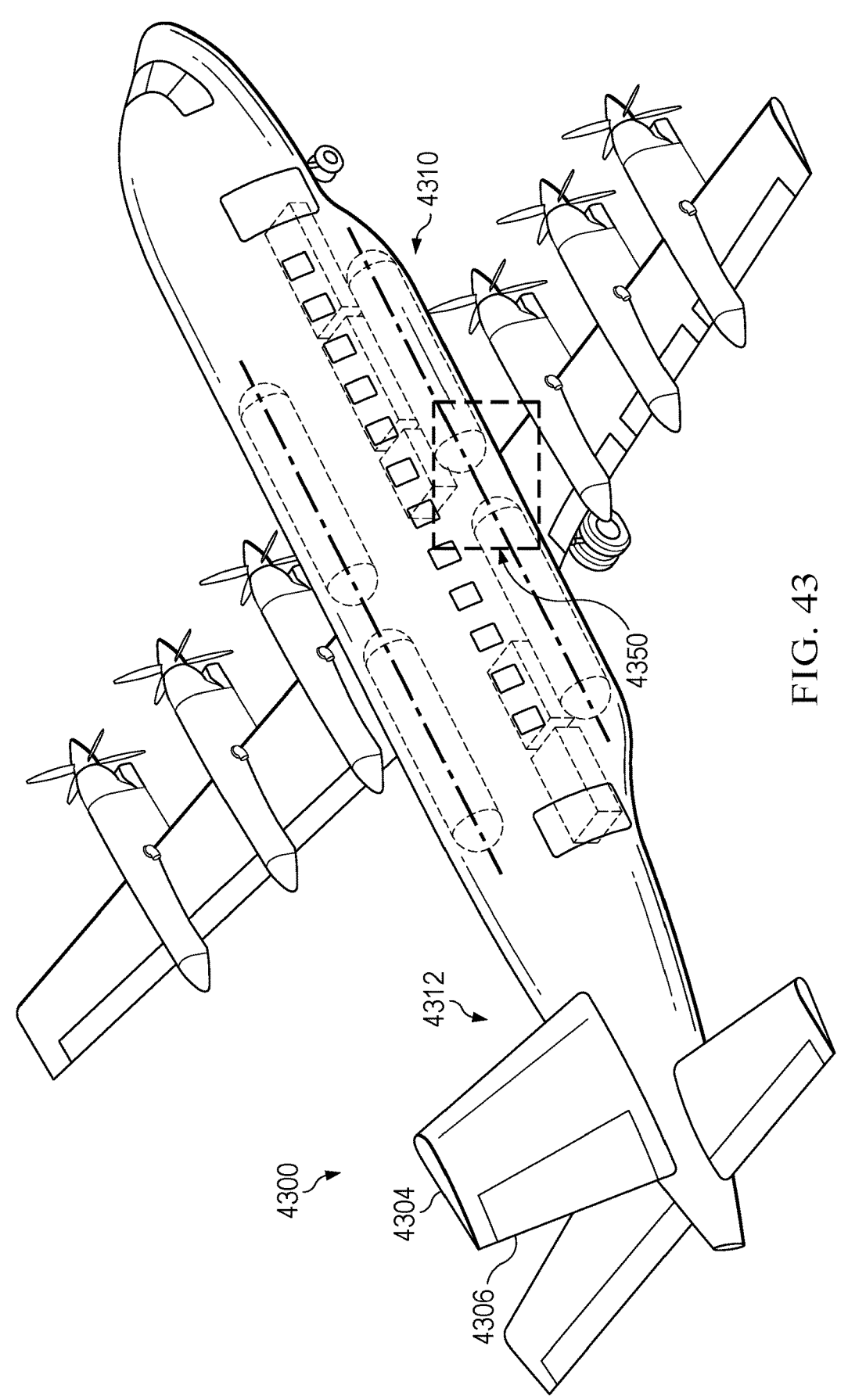
Figure 44:
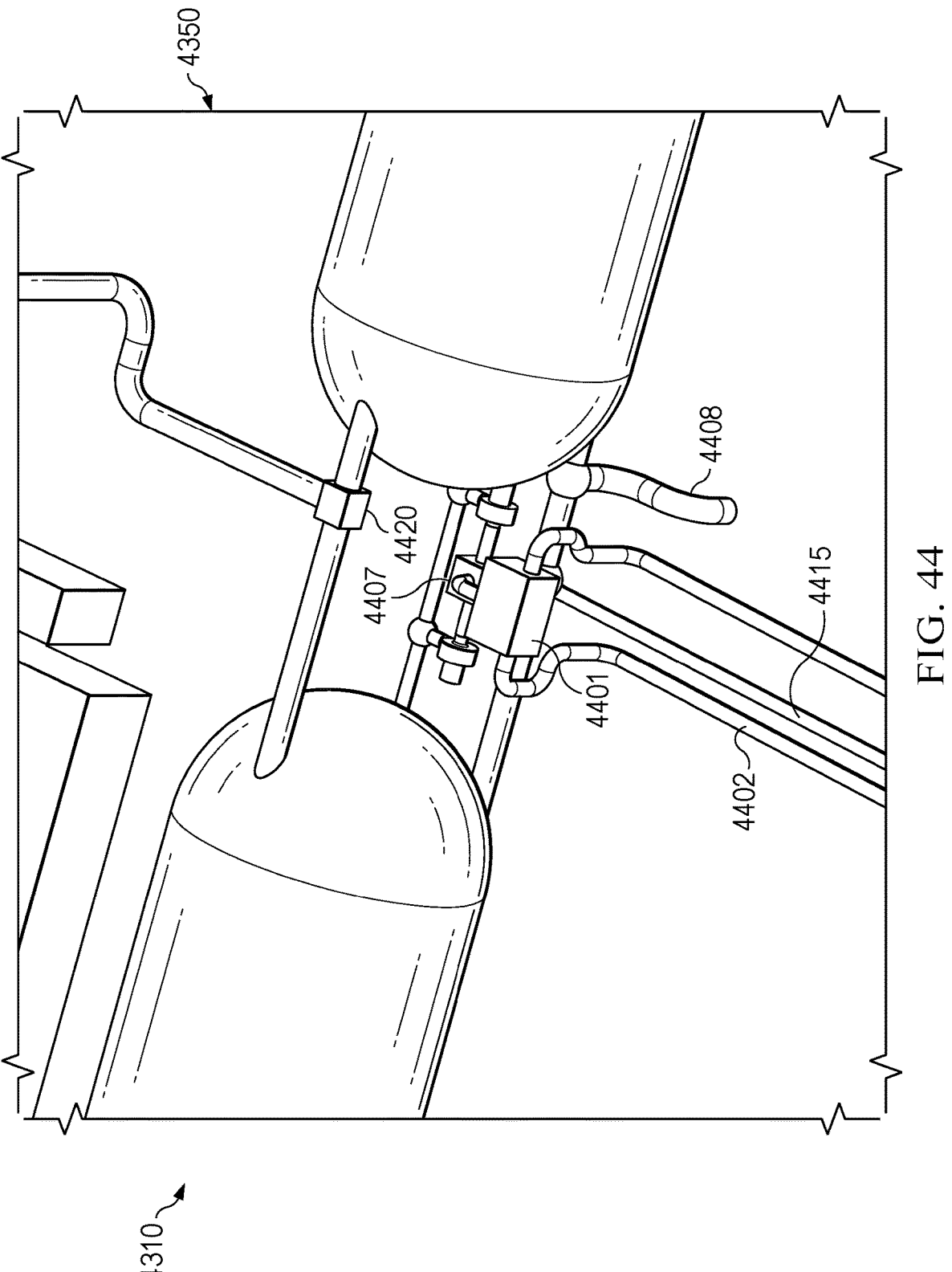
Figure 45:
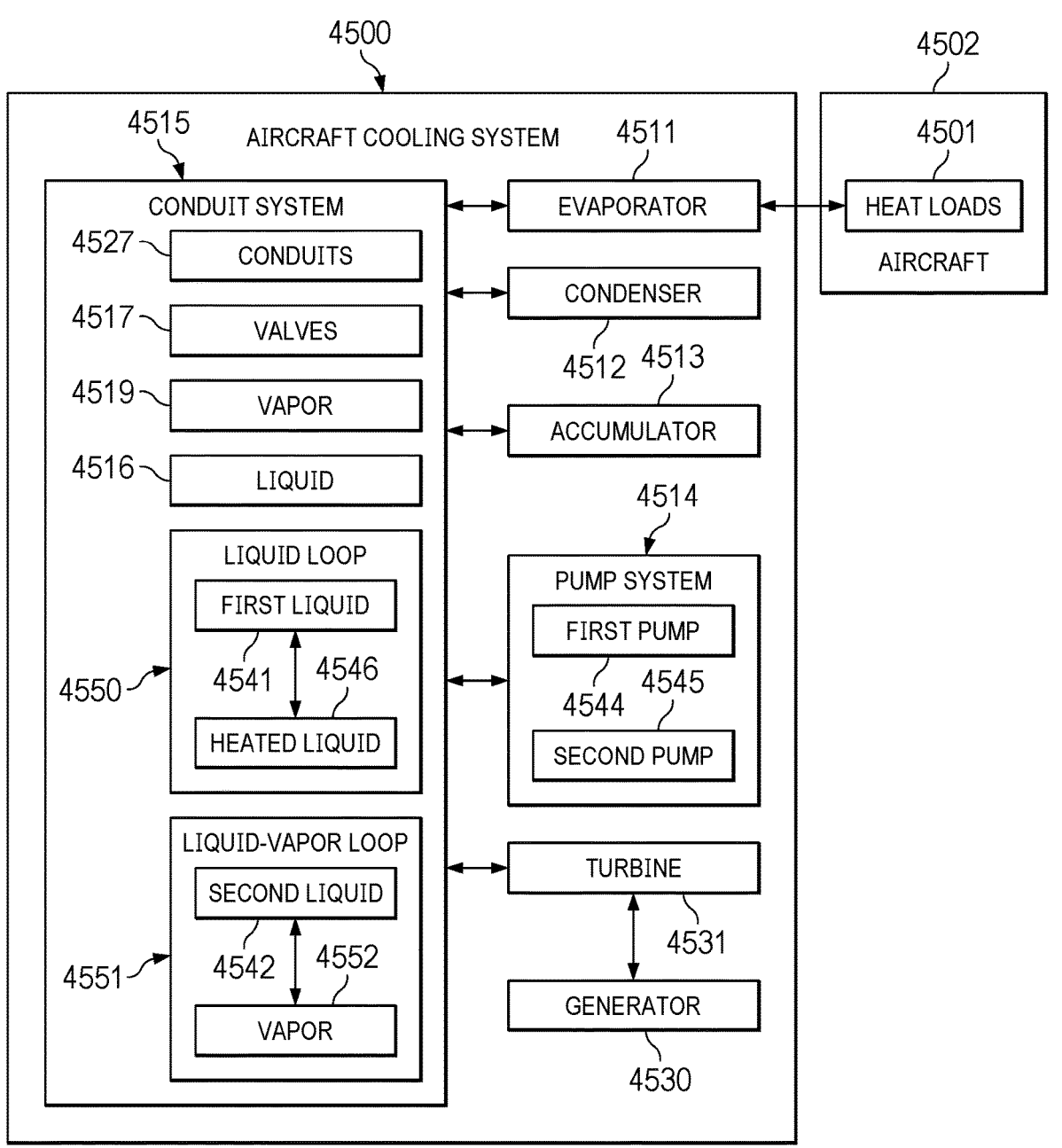
Figure 46:
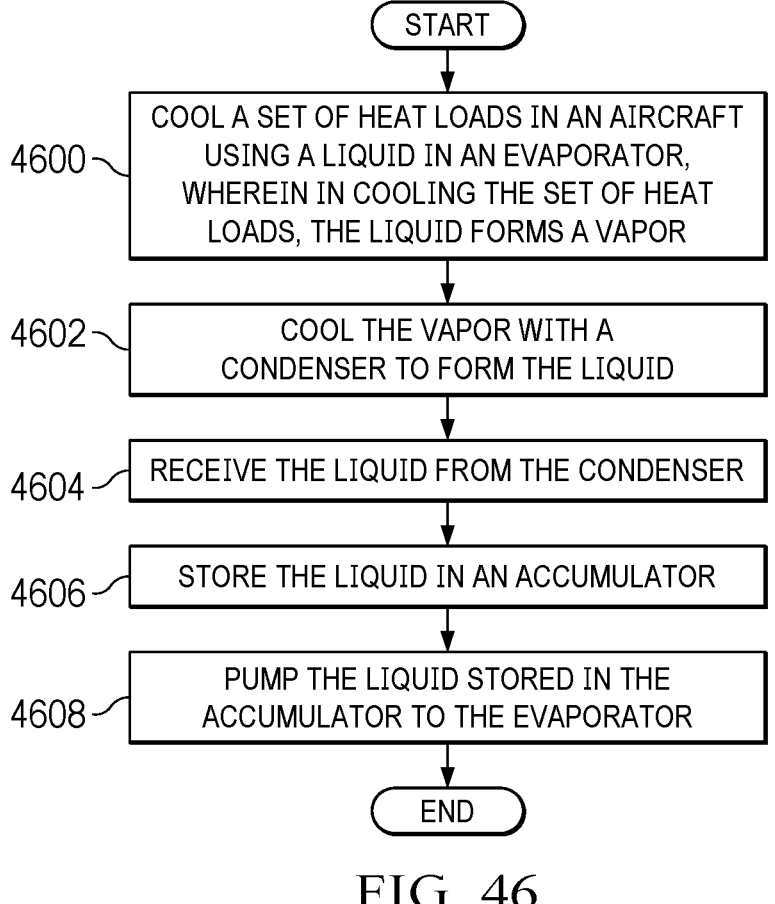
Figure 48:
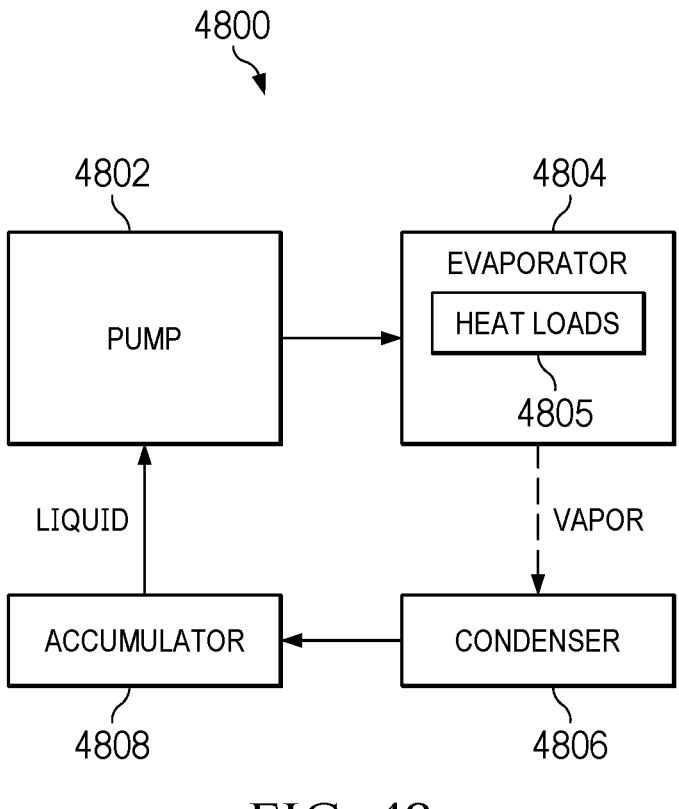
Figure 49:
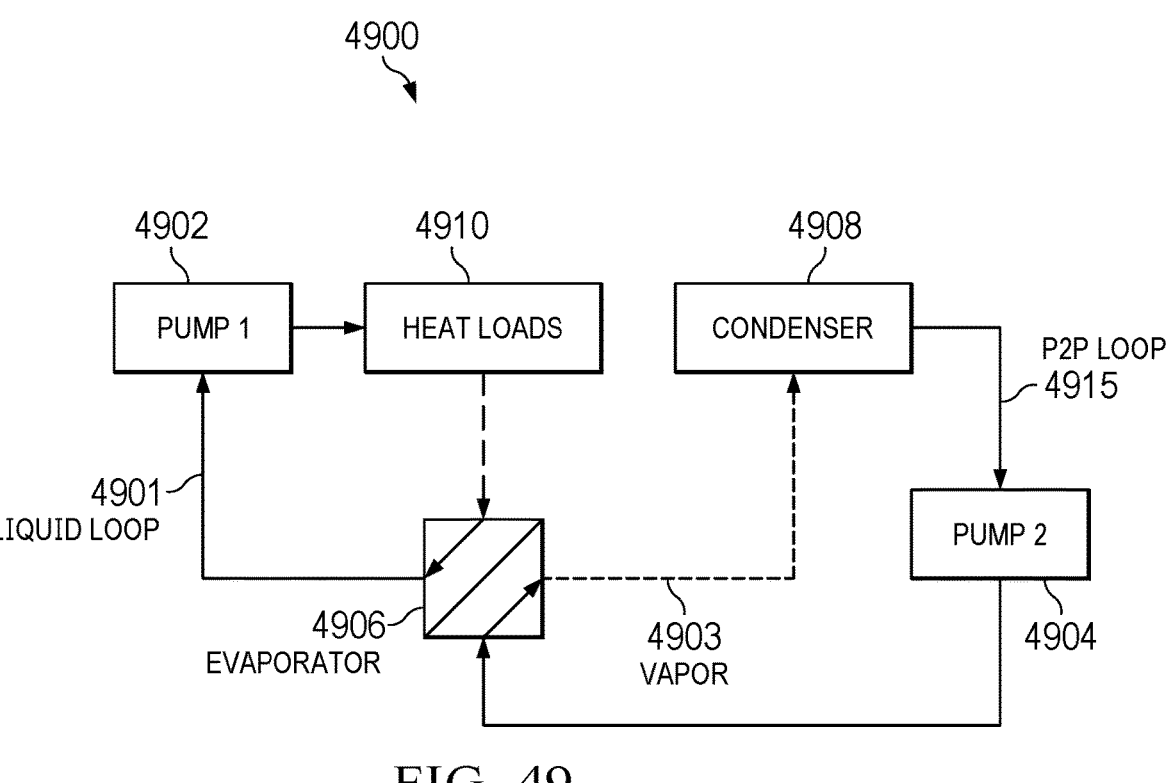
Figure 50:
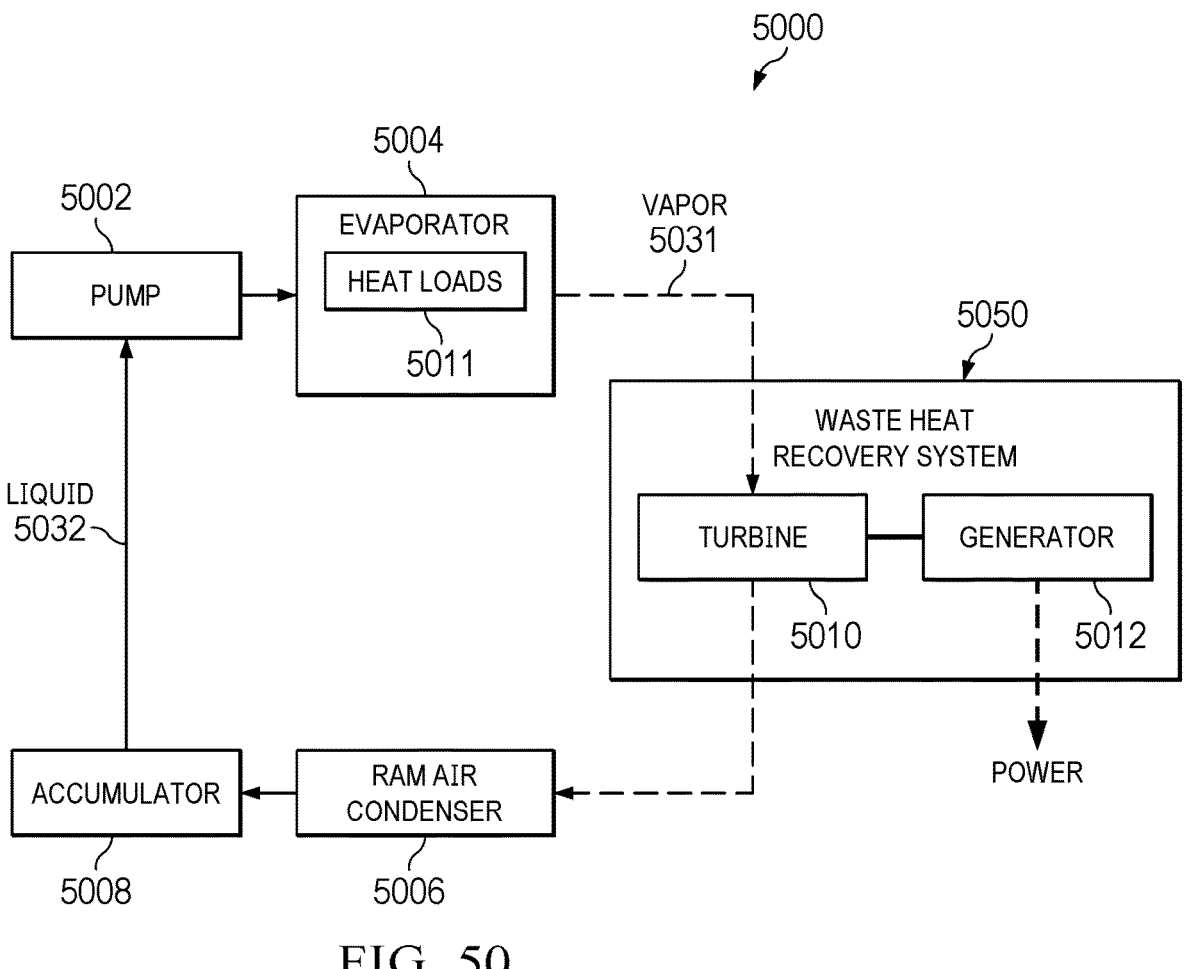

FIG. 15 is an illustration of airflow through a nacelle to provide cooling for a fuel cell stack in accordance with an illustrative embodiment;

FIG. 16 is an illustration of a front view of nacelle with a nacelle heat exchanger in accordance with an illustrative embodiment;

FIG. 17 is an illustration of a nacelle heat exchanger in accordance with an illustrative embodiment;

FIG. 18 is an illustration of airflow through a nacelle heat exchanger in accordance with an illustrative embodiment;

FIG. 19 is an illustration of a block diagram of a startup system for an aircraft in accordance with an illustrative embodiment;

FIG. 20 is an illustration of a flowchart of a process for managing starting and operation of fuel cell stacks for aircraft in accordance with an illustrative embodiment;

FIG. 21 is an illustration of a flowchart of a process for heating fuel cell stacks in accordance with an illustrative embodiment;

FIG. 22 is an illustration of a flowchart of a process for managing starting and operation of fuel cell stacks for aircraft in accordance with an illustrative embodiment;

FIG. 23 is an illustration of a flowchart of a process for circulating heated coolant in accordance with an illustrative embodiment;

FIG. 24 is an illustration of a flowchart of a process for sending power to fuel cell stacks in accordance with an illustrative embodiment;

FIG. 25 is an illustration of a flowchart of a process for halting heating of coolant in accordance with an illustrative embodiment;

FIG. 26 is an illustration of an aircraft with a propulsion and power system in accordance with an illustrative embodiment;

FIG. 27 is an illustration of an integrated power and propulsion unit in accordance with an illustrative embodiment;

FIG. 28 is an illustration of a schematic diagram of a fuel cell stack startup system in accordance with an illustrative embodiment;

FIG. 29 is an illustration of a schematic diagram of a fuel cell stack startup system in a thermal management system in accordance with an illustrative embodiment;

FIG. 30 is an illustration of a schematic diagram of a fuel cell stack startup system in a thermal management system in accordance with an illustrative embodiment;

FIG. 31 is an illustration of a block diagram of an aircraft management system in accordance with an illustrative embodiment;

FIG. 32 is an illustration of a flowchart of a process for air management in accordance with an illustrative embodiment;

FIG. 33 is an illustration of a schematic diagram of an aircraft air management system for fuel cell stack in accordance with an illustrative embodiment;

FIG. 34 is an illustration of a block diagram of an aircraft thermal management system in accordance with an illustrative embodiment;

FIG. 35 is an illustration of a flowchart of a process for thermal management in accordance with an illustrative embodiment;

FIG. 36 is an illustration of a flowchart of a process for managing the temperature of a fuel cell stack in accordance with an illustrative embodiment;

FIG. 37 is an illustration of a thermal management system with a low temperature loop and a high temperature loop in accordance with an illustrative embodiment;

FIG. 38 is an illustration of a hydrogen recirculating system in accordance with an illustrative embodiment;

FIG. 39 is an illustration of a flowchart of a process for recirculating hydrogen in accordance with an illustrative embodiment;

FIG. 40 is an illustration of a flowchart of a process for recirculating hydrogen in accordance with an illustrative embodiment;

FIG. 41 is an illustration of a flowchart of a process for recirculating hydrogen in accordance with an illustrative embodiment;

FIG. 42 is an illustration of a recirculating system for liquid hydrogen for tank pressure control in accordance with an illustrative embodiment;

FIG. 43 is an illustration of a venting system for gaseous hydrogen in accordance with an illustrative embodiment;

FIG. 44 is an illustration of a system for recirculating gaseous hydrogen for tank pressure control in accordance with an illustrative embodiment;

FIG. 45 is an illustration of a block diagram of an aircraft cooling system in accordance with an illustrative embodiment;

FIG. 46 is an illustration of a flowchart of a process for cooling heat loads in accordance with an illustrative embodiment;

FIG. 47 is an illustration of a flowchart of a process for cooling heat loads in accordance with an illustrative embodiment;

FIG. 48 is an illustration of a pumped two-phase (P2P) cooling loop in accordance with an illustrative embodiment;

FIG. 49 is an illustration of a hybrid two-phase (P2P) cooling loop in accordance with an illustrative embodiment; and FIG. 50 is an illustration of a pumped two-phase (P2P) cooling loop with waste heat recovery in accordance with an illustrative embodiment.

DETAILED DESCRIPTION

1. Configuration for a LH2 Fuel Cell Aircraft with Distributed Systems

The illustrative embodiments recognize and take into account a number of different issues with respect to aircraft that operate using liquid hydrogen fuel. The issues recognized by the different illustrative embodiments are described herein.

The illustrative embodiments recognize and take into account that integrating a liquid hydrogen (LH2) system into a passenger aircraft, such as a 50 passenger aircraft, can be challenging. For example, design challenges are present in determining where to locate the large liquid hydrogen tanks safely and how to package the thermal management and fuel cell stack systems, both of which have large volume requirements.

In these illustrative examples, the location of the fuel tanks ends above the wing and along the side of the fuselage. This type of configuration can integrate the tanks in a safe manner while keeping the added weight and wetted area as small as possible. In one illustrative example, six engine nacelles are used to add redundancy and enable packaging the thermal management and fuel cell system in a manner using as little volume in each nacelle as possible, while also reducing the electric motor power requirements.

Increased redundancy can occur through increasing the number of engines. As used herein, a "number of" when used with reference to items means one or more items. For example, a number of engines is one or more engines.

Further, the illustrative examples can use a high temperature proton exchange membrane fuel cell rather than a low temperature proton exchange membrane. The use of a high temperature proton exchange membrane fuel cell helps reduce heat exchanger sizing and a heat exchanger with microchannel flow passages which further reduces the size. Systems such as these are optional in the illustrative examples.

Additional conduits in a conduit system that lead from the liquid hydrogen tanks to the top of the vertical tail can be implemented. These conduits can be used to provide venting to relieve excess pressure in the liquid hydrogen tanks during flight. The conduit system can also be referred to as plumbing or a plumbing system in the different illustrative examples.

Figure 1:
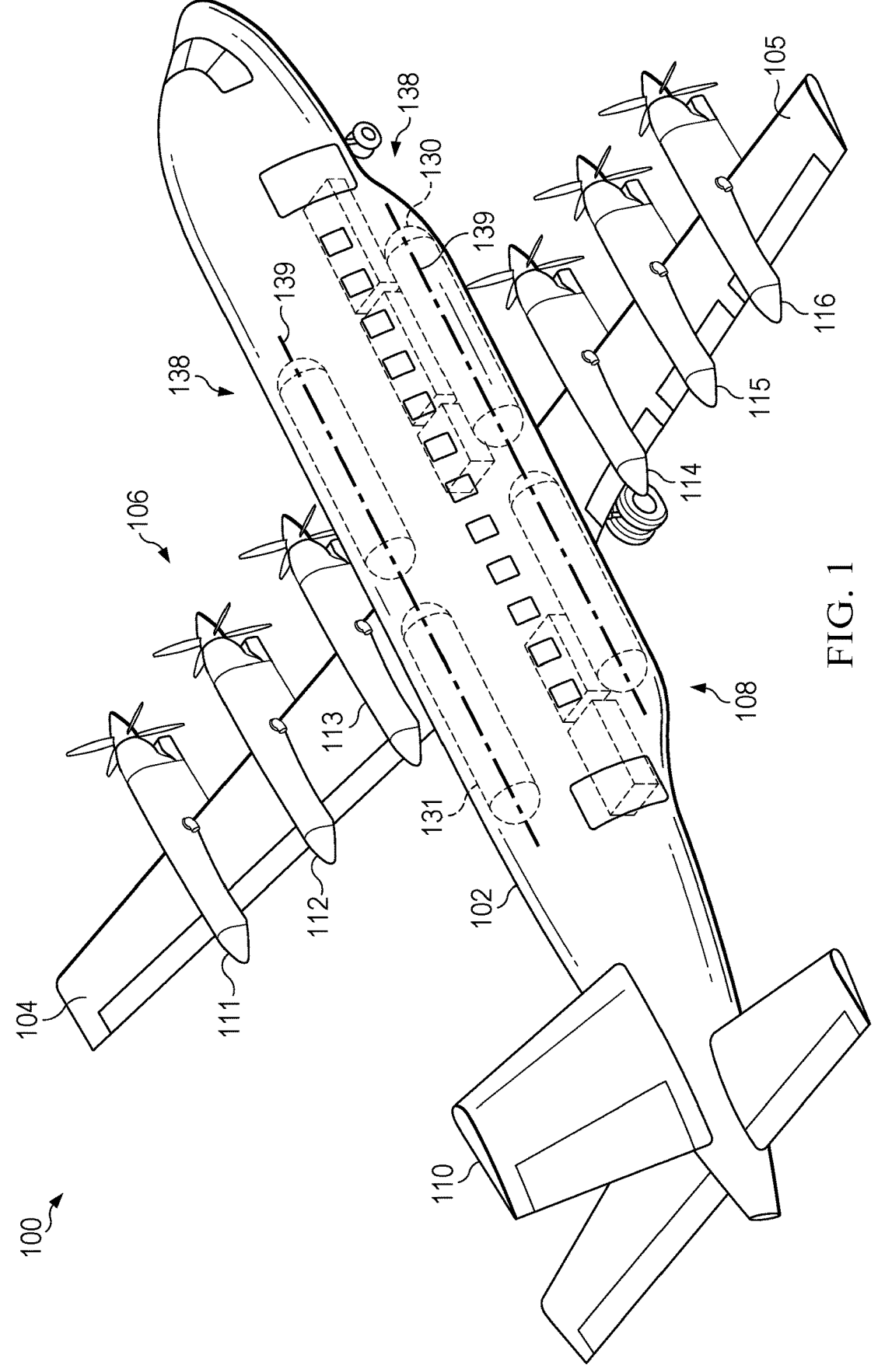
FIG. 1 is an illustration of a hydrogen fuel cell vehicle with distributed propulsion systems in accordance with an illustrative embodiment.

With reference to FIG. 1, an illustration of a hydrogen fuel cell vehicle with distributed propulsion systems is depicted in accordance with an illustrative embodiment. In the different illustrative examples, the same reference numeral may be used in more than one figure. This reuse of a reference numeral in different figures represents the same element in the different figures.

In this illustrative example, aircraft 100 is an example of a liquid hydrogen fuel cell vehicle. Aircraft 100 is an airplane that can carry various numbers of passengers. For example, aircraft 100 is an airplane designed to carry 50 passengers, 100 passengers, 130 passengers, or some other number of passengers. In other illustrative examples, aircraft 100 can be a cargo airplane or a cargo and passenger airplane.

As depicted in this example, aircraft 100 comprises fuselage 102 with wing 104 and wing 105. In this example, engines 106 and liquid hydrogen tanks 108 are located on wing 104 and wing 105. As depicted, engines 106 comprises six engines. Engine 111, engine 112, engine 113 are connected to wing 104, and engine 114, engine 115, and engine 116 are connected to wing 105.

In this example, when one component is "connected" to another component, the connection is a physical connection. For example, a first component, such as an engine, can be considered to be physically connected to a second component, such as a wing by at least one of being secured to the second component, bonded to the second component, mounted to the second component, welded to the second component, fastened to the second component, or connected to the second component in some other suitable manner. The first component also can be connected to the second component using a third component. The first component can also be considered to be physically connected to the second component by being formed as part of the second component, an extension of the second component, or both. In some examples, the first component can be physically connected to the second component by being located within the second component.

In this example, liquid hydrogen tanks 108 are connected to fuselage 102. These liquid hydrogen tanks are located along the sides of fuselage 102 above wing 104. These liquid hydrogen tanks have a substantially cylindrical shape. The liquid hydrogen tanks can also have other shapes such as an annular shape, a rounded rectangular prism, teardrop, or other suitable shape. In this example, liquid hydrogen tanks 108 are cryogenic tanks that carry liquid hydrogen.

In this example, liquid hydrogen tank 130 in liquid hydrogen tanks 108 is located above wing 105 and liquid hydrogen tank 131 in liquid hydrogen tanks 108 is located above wing 104. The locations of liquid hydrogen tanks 108 are selected to provide desirable center of gravity (CG)

characteristics for the aircraft 100. As depicted in this example, liquid hydrogen tanks 108 are located below windows 138 in fuselage 102. As depicted in this example, windows 138 are located along window lines 139 on fuselage 102.

The location of these two liquid hydrogen tanks reduces wetted area by placing these fuel tanks against some surfaces of aircraft 100. In other words, the surface area of fuselage 102 surrounding liquid hydrogen tanks 108 in contact with air during flight is reduced as compared to other locations that can be selected on aircraft 100. By reducing this wetted area for fuselage 102 surrounding liquid hydrogen tanks 108, improved aerodynamic performance can be achieved.

Further, the location of liquid hydrogen tanks 108 can protect these components from hard landings. Also, the location of liquid hydrogen tanks can protect these tanks from ground strike damage.

Further, in this example, six engines are used for aircraft 100. Increasing the number of engines can enable greater distribution of different components for the thermal management system and other components in the engines into smaller components. These components can be located within the nacelle volume for the individual engines.

This distribution also provides an ability for using a blown wing for higher lift at lower speeds, increased redundancy, and lower power requirements for the electric motors. Further, by increasing the number of engines, the fuel cell stack sizes may be smaller in each engine.

Further, increased redundancy is present by using six engines rather than two or four engines. As the number of engines increases, electric motors can have smaller size and power requirements. In similar fashion, the heat exchangers within the nacelles for these engines can also be smaller in size. In a similar fashion, the number of fuel cells in a fuel cell stack can be smaller in size making it easier to package and integrate these components into aircraft 100.

In this example, venting of gaseous hydrogen (GH2) from liquid hydrogen tanks 108 can be provided through conduits to the venting system. This venting system can vent the gaseous hydrogen out of an area that is remote and above passengers, crew, and ground personnel such as vertical tail 110.

Figure 2:
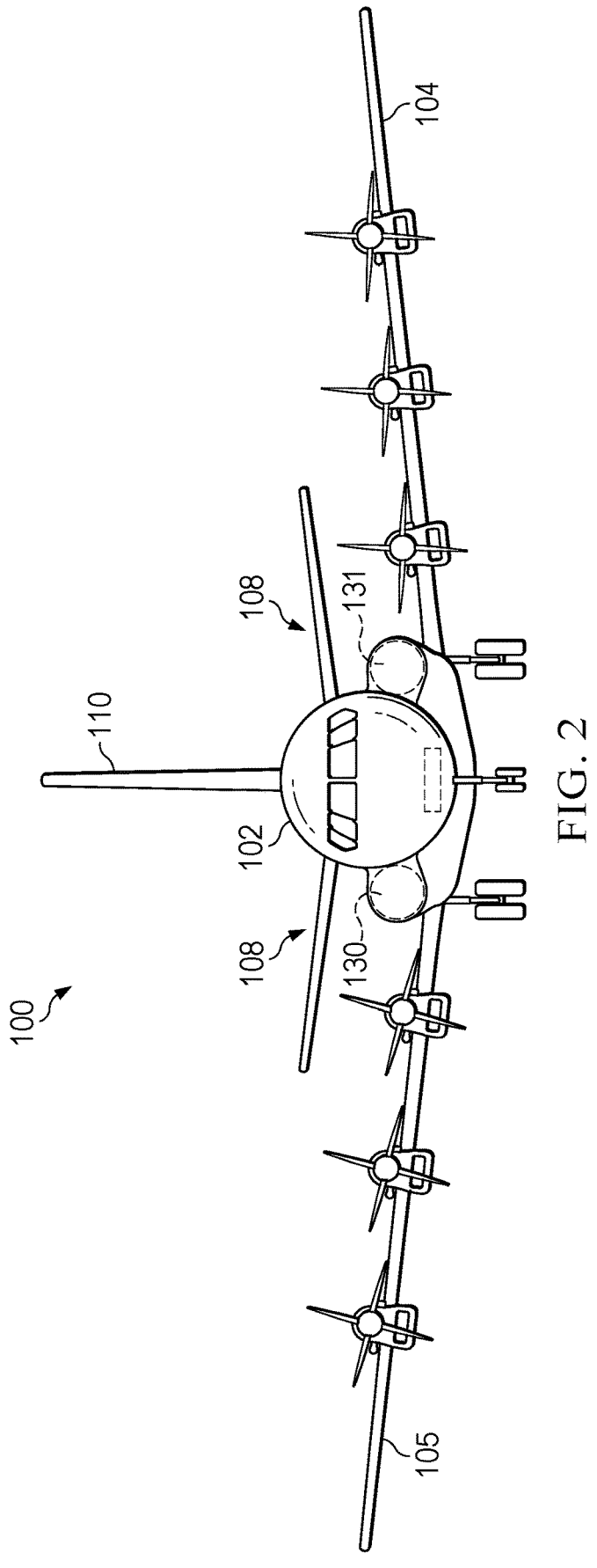
FIG. 2 is an illustration of a front view of liquid hydrogen tank locations in accordance with an illustrative embodiment.

FIG. 2 is an illustration of a front view of liquid hydrogen tank locations in accordance with an illustrative embodiment. In this figure, a front view of aircraft 100 provides an additional view of the locations of liquid hydrogen tank 130 above wing 105 and liquid hydrogen tank 131 above wing 104. As depicted, liquid hydrogen tank 131 is located above wing 104 and liquid hydrogen tank 130 is located above wing 105 on the sides of fuselage 102 for aircraft 100.

These locations for liquid hydrogen tanks 108 can reduce trimming issues and hydrogen gas entrapment in the fuselage. Further, lower drag and weights of integrated liquid hydrogen tanks can be achieved with easier integration as compared to liquid hydrogen tanks used under the wing of an aircraft. Additional tanks can be used to reduce liquid sloshing and increase redundancy.

The illustration of aircraft 100 in FIG. 1 and FIG. 2 are provided as one illustrative example and is not meant to limit the manner in which other illustrative examples can be implemented. For example, although liquid hydrogen tanks 108 are shown as comprising two liquid hydrogen tanks, other illustrative examples can have other numbers of hydrogen fuel tanks. For example, liquid hydrogen tanks can include four liquid hydrogen tanks with two liquid hydrogen tanks being located over the wings and under the windows on either side of aircraft 100.

Figure 3:
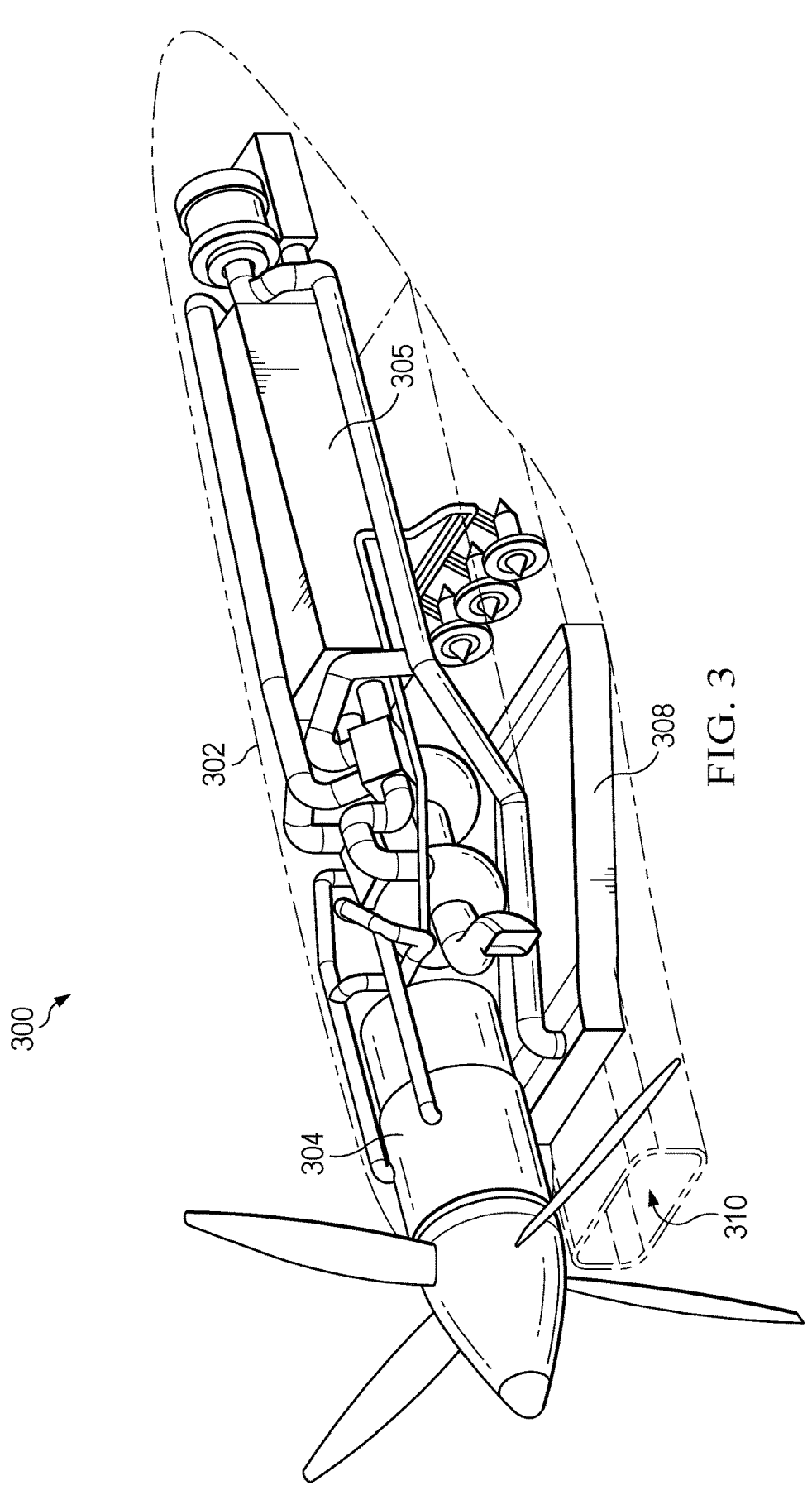
FIG. 3 is an illustration of a nacelle layout in accordance with an illustrative embodiment.

Turning next to FIG. 3, an illustration of a nacelle layout is depicted in accordance with an illustrative embodiment. Engine 300 is an example of engines 106 in FIG. 1 and FIG. 2. In this example, engine 300 comprises nacelle 302, electric motor 304, fuel cell stack 305, and heat exchanger 308. In this illustrative example, nacelle 302 is a structure that encloses electric motor 304, fuel cell stack 305, and heat exchanger 308.

In this example, heat exchanger 308 has a rectangular shape and is positioned at a slant relative to opening for inlet 310. This slant can have an acute angle that is less than 90 degree. This shape and positioning of heat exchanger 308 enables reducing the frontal area of nacelle 302. A reduction in the size of electric motor 304, fuel cell stack 305, and heat exchanger 308 can be achieved as the number of engines are increased.

Figure 4:
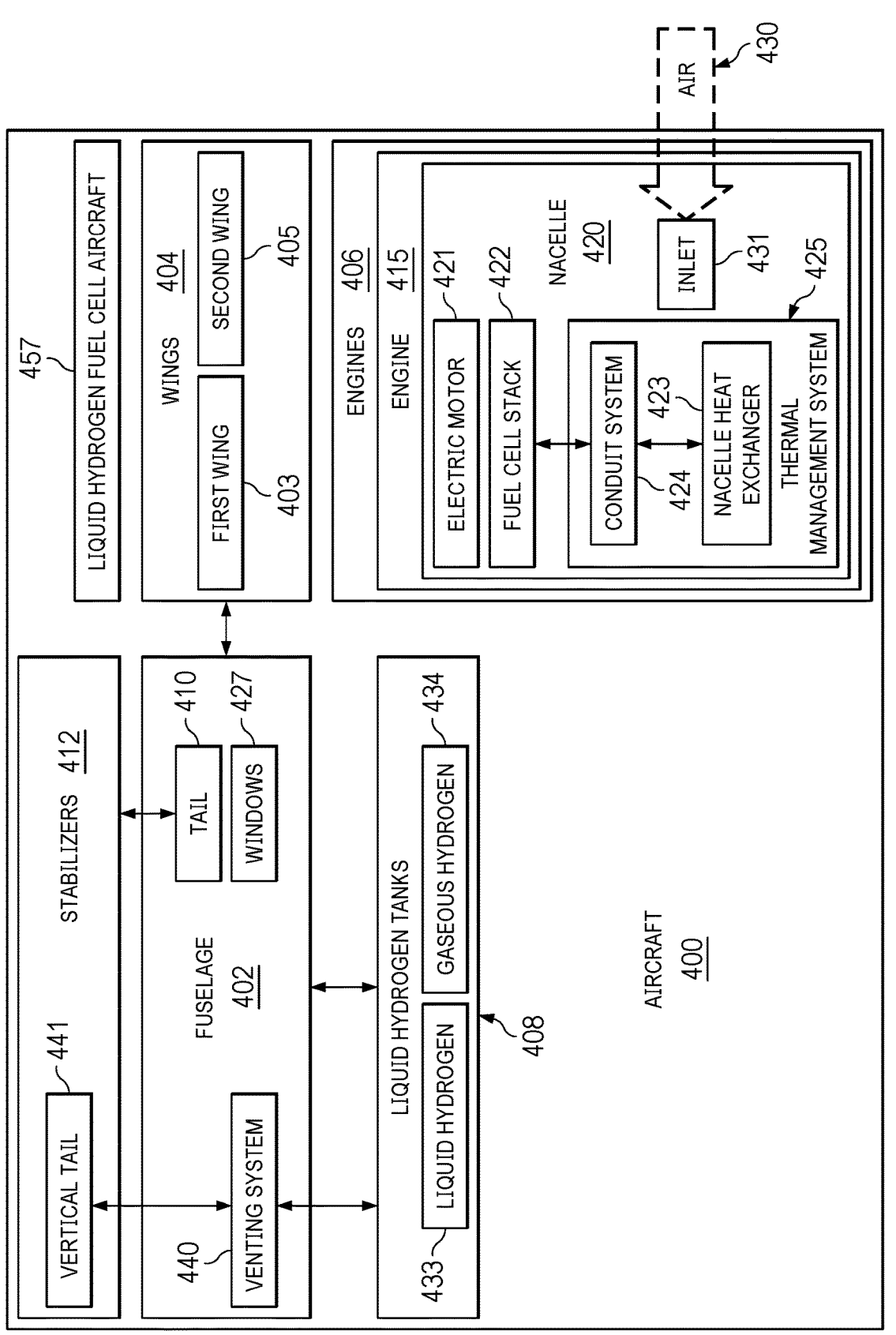
FIG. 4 is an illustration of a block diagram of a liquid hydrogen fuel cell aircraft in accordance with an illustrative embodiment.

With reference next to FIG. 4, an illustration of a block diagram of a liquid hydrogen fuel cell aircraft is depicted in accordance with an illustrative embodiment. In this illustrative example, aircraft 100 and the components for aircraft 100 as depicted in FIG. 1, FIG. 2, and FIG. 3 are an example of an implementation for aircraft 400. In this example, aircraft 400 takes the form of liquid hydrogen fuel cell aircraft 457 having distributed systems. Aircraft 400 can be selected from a group comprising an unmanned aircraft, a manned aircraft, a remotely piloted aircraft, a passenger airplane, a cargo airplane, a commercial airplane, an autonomous aircraft, or other types of aircraft. In one example, aircraft 400 can be a passenger aircraft such as a 50 passenger aircraft.

In this example, aircraft 400 has a number of different components. As depicted, aircraft 400 comprises fuselage 402, wings 404, engines 406, stabilizers 412, and a set of liquid hydrogen tanks 408. As used herein, a "set of" when used with reference to items means one or more items. For example, a set of liquid hydrogen tanks is one or more liquid hydrogen tanks.

In this illustrative example, wings 404 comprises first wing 403 and second wing 405. These are connected to fuselage 402. Engines 406 are connected to first wing 403 and second wing 405. In one example, engines 406 can be four engines, six engines, ten engines, or some other suitable number of engines.

In this illustrative example, the set of liquid hydrogen tanks 408 are connected to fuselage 402. Stabilizers 412 are connected to tail 410 of fuselage 402.

In this example, each engine contains a number of components. For example, engine 415 in engines 406 comprises nacelle 420, electric motor 421, fuel cell stack 422, and nacelle heat exchanger 423. In this example, electric motor 421, fuel cell stack 422, and nacelle heat exchanger 423 are located in nacelle 420.

Nacelle 420 is an enclosure that houses components for engine 415. This enclosure can provide aerodynamic properties. Nacelle 420 can also provide structural support for components in engine 415.

Further in this illustrative example, nacelle heat exchanger receives air 430 flowing through inlet 431 in nacelle 420. Nacelle heat exchanger 423 provides cooling for fuel cell stack 422 in nacelle 420. This cooling can be implemented in a high temperature cooling loop such as high temperature loop 3401 in FIG. 34 below.

For example, conduit system 424 is fluidically connected to nacelle heat exchanger 423 and fuel cell stack 422. Conduit system 424 comprises one or more conduits that carry coolant that can be used to cool fuel cell stack 422. These conduits can be, for example, pipes, tubes, or other suitable structures. Conduit system 424 can also include valves that can control the flow of coolant within conduits. Further, conduit system 424 can include pumps to move fluids.

In this manner, the flow of coolant can be controlled to flow to or through various components. Further, these valves can be used to control the flow of coolant to form different loops for cooling or heating components.

In this example, nacelle heat exchanger 423 and conduit system 424 form thermal management system 425. This thermal management system 425 cools fuel cell stack 422. A high temperature proton exchange membrane (HTPEM) fuel cell requires coolant at a temperature too high to work as coolant for other engine components. Another low temperature coolant loop is required to cool engine components other than the fuel cell stack 422. This low temp coolant loop either uses its own ram air radiator or cools the coolant in another heat exchanger or cooling method. This vehicle cools its low temperature coolant as part of its pressure control system for the tanks, which requires the heating and recirculating of hydrogen.

In this illustrative example, the set of liquid hydrogen tanks 408 are located outside of fuselage 402. These liquid hydrogen tanks store liquid hydrogen 433 that is used in fuel cell stack 422 to generate electricity to power electric motor 421.

Further, in this example, these liquid hydrogen tanks extend along the outside of fuselage 402 above wings 404. Further, the set of liquid hydrogen tanks 408 can be located below windows 427 in fuselage 402. In this example, windows 427 are arranged along a line on either side of fuselage 402. In this example, the set of liquid hydrogen tanks 408 extend along a number of sides of fuselage 402. Liquid hydrogen tanks 408 are cryogenic tanks.

In this illustrative example, aircraft 400 also includes venting system 440. Venting system 440 is connected to the set of liquid hydrogen tanks 408. Venting system 440 operates to vent gaseous hydrogen 434 from the liquid hydrogen tanks 408.

In one illustrative example, venting system 440 extends through fuselage 402 to vertical tail 441 in stabilizers 412. Vertical tail 441 is connected to tail 410 of fuselage 402. With this example, venting system 440 vents gaseous hydrogen 434 through the vertical tail 441.

Thus, in these examples, as the number of engines 106 increases, different components can be further distributed through these engines. This distribution can provide for an increase in redundancy. Additionally, the size of the components can be reduced within the engines as a number of engines 406 increase.

Liquid hydrogen tank placement and reducing the size of the package for the thermal management and fuel cell systems are examples of one or more features that result from the different illustrative examples. For example, the distribution of the propulsive power, thermal management, and fuel cell system over a greater number of nacelles can enable electric motors in those nacelles to have a smaller power requirement and for the heat exchangers, and fuel cells to be broken into smaller sizes that are easier to manufacture and integrate into the airplane.

The block diagram illustration of aircraft 400 in FIG. 4 and illustration of aircraft 100 in FIG. 1 and FIG. 2 are examples of an implementation for aircraft not meant to imply physical or architectural limitations to the manner in which an illustrative embodiment may be implemented.

Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

In another illustrative example, a different liquid hydrogen tank position can be used rather than on top of the wing and by the sides of the fuselage. Further, in another illustrative example, other numbers of the fuel cell stacks can be used in an engine such as 2, 3 or some other number of fuel cell stacks. Additionally, other features may be implemented to decrease the volume required for the thermal management system or fuel cell stacks to further help with packaging. Features such as a microchannel heat exchanger or a high temperature proton exchange membrane fuel cell in the fuel cell stacks can be used.

As another example, hydrogen can be stored and other forms other than liquid hydrogen. For example, different hydrogen carriers such as liquid or gaseous methane or other hydrocarbon molecules. With this example, these types of hydrocarbon fuels can be processed using reformation to separate the hydrogen for use in the fuel cell stacks. In other words, other types of storage tanks can be used in addition to liquid hydrogen tanks 408 that store other types of hydrocarbon fuel that can be processed to obtain gaseous hydrogen 434 for use in the fuel cell stacks to generate electricity.

2. Method of Nacelle Heat Exchanger Integration for a Hydrogen Fueled Fuel Cell Powered Aircraft The illustrative examples recognize and take into account that hydrogen powered aircraft can use fuel cells to drive an electric motor driven propeller. The fuel cells in general produce a significant amount of waste heat. This waste heat is removed from the fuel cells and dissipated into the ambient air during operation of aircraft.

For example, fuel cell stacks that use high temperature proton exchange membrane (HTPEM) fuel cells and low temperature proton exchange membrane (LTPEM) fuel cells both generate significant amounts of heat compared to the power produced. This heat is rejected into ambient air from the engines. The heat rejection is more difficult during phases of flight such as taxi, takeoff and climb. During these phases, the amount of ambient air is not always available in the desired amounts to provide the desired cooling. Further, during these phases of flight, the temperature difference between the ambient air and fuel cell coolant is typically lower than at cruise.

This removal of heat can be also referred to as heat rejection. This heat rejection can cause significant ram drag especially during take-off and climb phases. Significant ram drag can be present when adequate ram air is unavailable and the temperature difference between the ambient air and the fuel cell coolant is also lower.

One solution can involve using large inlet areas and variable exhaust systems. However, increasing the size of the frontal area can lead to issues related to the packaging of the heat exchangers within the nacelle.

Ram drag is the difference in the change in momentum between the exit and the inlet of a system. It can be positive which means produces thrust or negative which is a drag to the aircraft. Due to the large amount of heat to be removed and the lower temperature difference between the coolant and ambient air, the size of current heat exchangers needed are considered to be large.

Typical fuel cells operate with efficiencies in the range of 40 to 60 percent. The general power required based on the aircraft size can be hundreds of kilowatts to thousands of kilowatts. This operation implies the amount of heat rejected by the fuel cells in the fuel cell stacks could be the same order of magnitude as the power produced by the aircraft.

The temperature difference between the coolant and the ambient air can be as low as 20 degrees centigrade in the case of low temperature proton exchange membrane (PEM) fuel cells and as low as 70 degrees centigrade in the case of high temperature PEM fuel cells. This disclosure addresses an issue involving installing the nacelle heat exchangers with minimum drag penalty and options related to getting the ambient cooling air in and out of the heat exchangers as well as potentially other issues.

The illustrative examples provide a fuel cell based electric powered aircraft with hydrogen as a fuel. In these examples, a fuel cell stack is comprised of fuel cells. These fuel cell stacks can be located with the engines of aircraft. In other words, a fuel cell stack to be located in the same nacelle that contains the engine. A fuel cell stack is cooled by various options and the heat from the fuel cell stack has to be rejected to the ambient air using coolant to ambient air heat exchangers also located in the nacelles.

Further, a fan system can be included in each nacelle. The electric fan system can include a number of fans that can change speed depending on the cooling needed. In this example, a fan system increases airflow through the heat exchangers. This increased airflow using a fan system can reduce the size of the heat exchanger within the nacelle.

Also, a fixed area nozzle can enable useful thrust recovery by the ram air. Use of a variable area nozzle can optimize the power required by the fan system and increase the thrust contribution from the overall cooling system at various phases of the flight.

The illustrative examples provide an integration of these heat exchangers into the nacelles instead of within the fuselage.

In one illustrative example, a fuel cell based electric powered aircraft with hydrogen as a fuel is depicted. In these examples, a fuel cell stack is comprised of fuel cells. Fuel cell stacks can be located with the engines of aircraft. In other words, a fuel cell stack can be located in the same nacelle that contains the engine. A fuel cell stack is cooled by various options and the heat from the fuel cell stack has to be rejected to the ambient air using coolant to ambient air heat exchangers.

Further, an electric fan system can be included in each nacelle. The electric fan system can include a number of variable speed fans that can change speed depending on the cooling needed. Also, a fixed area nozzle can enable useful thrust recovery by the ambient ram air. In this example, ambient air is the air surrounding or around the aircraft. Further, in the illustrative examples, increasing the area of the nacelle heat exchanger can reduce ram drag.

Thus, heat exchangers and fan systems can be used within the nacelles for the engines to deliver the desired cooling air flow. The heat exchangers can be positioned within the nacelles to be substantially parallel to aircraft flight direction.

As a result, the illustrative examples can also provide at least one of reduced drag or production of thrust. In these examples, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combination of these items can be present. In some illustrative examples, "at least one of" can be, for example, without limitation, two of item A; one of item B; and ten of item C; four of item B and seven of item C; or other suitable combinations.

Also, a variable area nozzle can be used to reduce the fan power. In this example, a variable area means that the cross sectional area of the nozzle can be adjusted during operation. This area change can change the exhaust velocity. A fixed area means that the cross sectional area of the nozzle remains fixed without changing.

In the different examples, a heat exchanger can have different shapes to reduce the frontal area with respect to the inlet for the nacelle. This frontal area can be substantially perpendicular to the inlet. The heat exchanger can also include a fan system such as an electrically driven axial fan or radial blower to provide a desired level of airflow during the different phases of flight including when the aircraft is on the ground.

Figure 5:
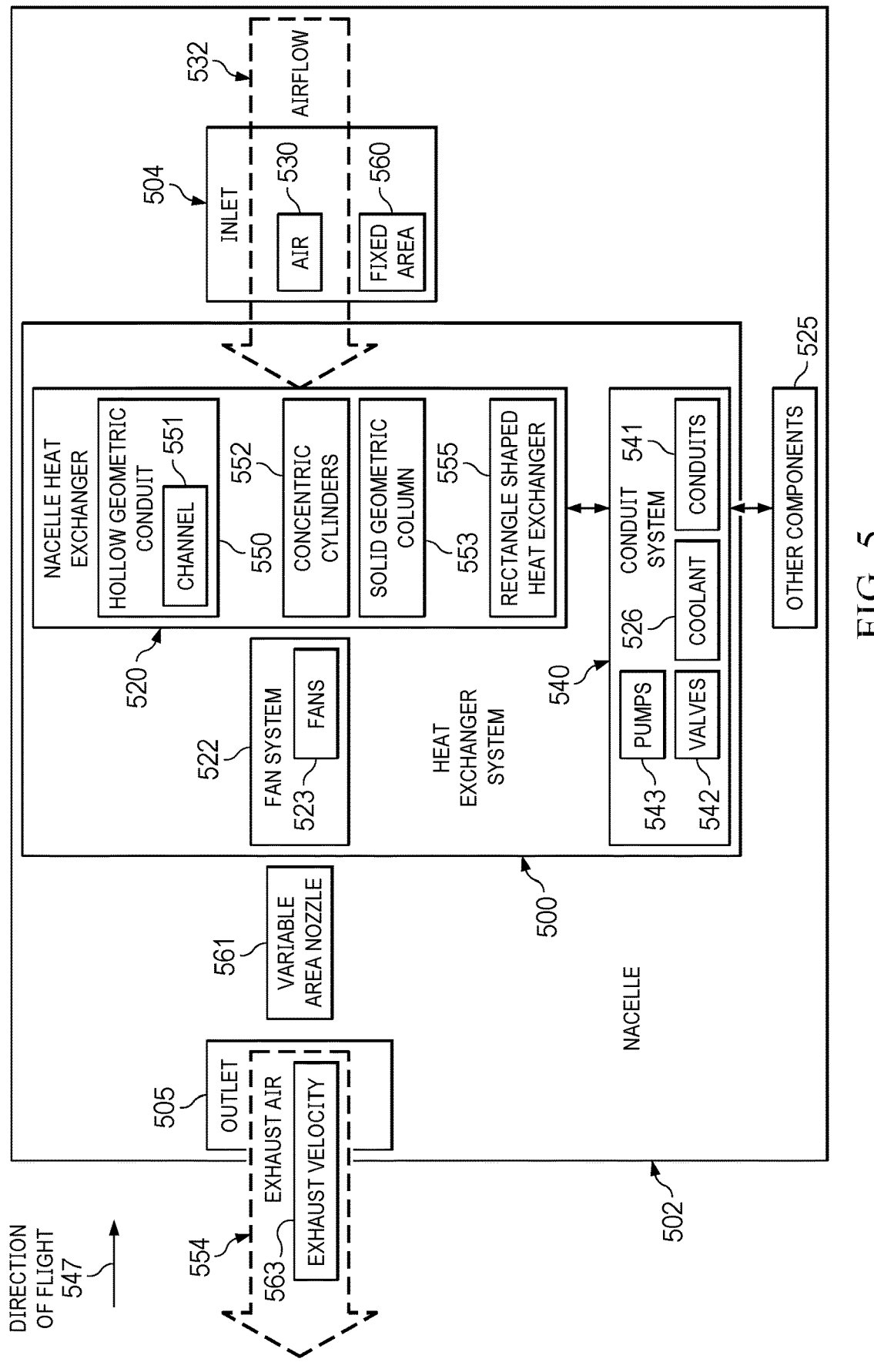
FIG. 5 is an illustration of a block diagram of a heat exchanger system for an aircraft in accordance with an illustrative embodiment.

With reference next to FIG. 5, an illustration of a block diagram of a heat exchanger system for an aircraft is depicted in accordance with an illustrative embodiment. In this illustrative example, heat exchanger system 500 is located in nacelle 502. Nacelle 502 is an example of nacelle 420 for engine 415 and aircraft 400 in FIG. 4. In this illustrative example, nacelle heat exchanger 520 can be oriented substantially parallel to direction of flight 547 of an aircraft. For example, the length of nacelle heat exchanger 520 is greater than the width or thickness, this longer dimension of nacelle heat exchanger 520 can be oriented substantially parallel to direction of flight 547. Heat exchanger system 500 can also be referred to as a ram air radiator.

In this illustrative example, nacelle 502 has inlet 504 and outlet 505. Air 530 flows into nacelle 502 through inlet 504 and out of nacelle 502 through outlet 505.

In this illustrative example, heat exchanger system 500 comprises nacelle heat exchanger 520. In some illustrative examples, heat exchanger system 500 can also include fan system 522.

Nacelle heat exchanger operates to transfer heat away from coolant 526 using air 530 in an airflow 532 to nacelle heat exchanger 520.

In this illustrative example, airflow 532 to nacelle heat exchanger 520 can take one or more different forms. For example, airflow 532 can move over a surface of nacelle heat exchanger 520, through nacelle heat exchanger 520, or some combination thereof. For example, nacelle heat exchanger 520 can have a solid surface over which air 530 flows in airflow 532. In another example, nacelle heat exchanger 520 can have conduits, channels or openings through which air 530 in airflow 532 travels.

Nacelle heat exchanger 520 can be comprised of a number of different types of materials. For example, nacelle heat exchanger 520 can be comprised of a number of materials selected from at least one of aluminum, copper, a copper alloy, an aluminum alloy, titanium, a titanium alloy, a composite material, or some other suitable material.

Nacelle heat exchanger 520 can take a number of different forms. For example, nacelle heat exchanger 520 can comprise hollow geometric conduit 550 with channel 551. In this example, airflow 532 passes at least one of though a surface in channel 551 or the surface on an exterior of hollow geometric conduit 550. Hollow geometric conduit 550, can be, for example, a cylinder, a rectangular prism, an ellipsoidal, or some other suitable form.

In another illustrative example, nacelle heat exchanger 520 can be comprised of concentric cylinders 552 positioned in nacelle 502. In still another illustrative example, nacelle heat exchanger 520 can comprise solid geometric column 553 positioned within nacelle 502. With this example, airflow 532 passes over an exterior of solid geometric column 553 positioned within the nacelle, wherein the airflow passes over an exterior of the solid geometric column 553.

In yet another example, nacelle heat exchanger 520 can comprise rectangle shaped heat exchanger 555 positioned at an angle to the airflow 532. This rectangle shaped heat exchanger can have a shape of a rectangular prism or cuboid.

When used in heat exchanger system 500, fan system 522 operates to increase airflow 532 to the nacelle heat exchanger 520. This increased airflow can reduce the size of nacelle heat exchanger 520 while still providing a desired level of cooling.

In this illustrative example, fan system 522 is a hardware system and comprises a number of fans 523. The number of fans 523 can be located at least one of in front of nacelle heat exchanger 520 or behind nacelle heat exchanger 520. As another example, fans 523 and fan system 522 can be arranged in a ring within nacelle 502.

In this example, the front of nacelle heat exchanger 520 is closer to inlet 504 than outlet 505. Fans 523 can be selected from at least one of an axial fan, an annular fan, a radial blower, a rim-driven fan, or some other suitable type of fan.

Coolant 526 can be used within conduit system 540 to cool various components within nacelle 502. For example, coolant 526 can be located in conduit system 540. Conduit system 540 comprises conduits 541, which are pipes or tubes through which fluids can travel. Further, conduit system 540 can also include valves 542 to control the flow of fluids through conduit system 540. In this example, conduit system 540 can include pumps 543 to move fluids.

Conduit system 540 is a hardware system comprised of one or more conduits. These conduits can be a pipe, a tube, or other structure through which coolant 526 can flow between nacelle heat exchanger 520 and other components 525 in nacelle 502. Conduit system 540 is thermally connected to nacelle heat exchanger 520 and other components 525 in nacelle 502. In these illustrative examples, thermally connected means that heat transfer can occur between two components.

For example, a conduit in conduit system 540 can be in contact with or close proximity to the heat load. In other illustrative examples, conduit can be connected to the heat load such that coolant 526 can flow through the heat load from conduit system 540.

In this example, conduit system 540 can use coolant 526 to cool at least one of a fuel cell stack, a motor, or an electronic system in other components 525. Further in these illustrative examples, one or more of other components 525 can located in different positions relative to nacelle heat exchanger 520. For example, when nacelle heat exchanger 520 takes the form of hollow geometric conduit 550, components such as a fuel cell stack can be located within channel 551 in hollow geometric conduit 550.

In one illustrative example, inlet 504 can have fixed area 560. With this example, variable area nozzle 561 can be positioned between fan system 522 and outlet 505. The variable area means that the area in a cross-section of variable area nozzle 561 can change. Airflow 532 through variable area nozzle 561 can result in exhaust velocity 563 of exhaust air 554 exiting outlet 505 that is greater than a free stream velocity.

The block diagram illustration of heat exchanger system 500 in FIG. 5 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, nacelle heat exchanger 520 can add other shapes such as a prism, or other suitable shape. Also, one or more nacelle heat exchangers can be used in addition to or in place of nacelle heat exchanger 520 in heat exchanger system 500. This heat exchanger system may also be referred to as a ram air radiator.

In another illustrative example, nacelle heat exchangers can be used in a dedicated nacelle that provides cooling. In yet another illustrative example, a tip-driven fan can be used in the fan system. In yet other illustrative examples, the heat exchangers with an air inlet and fan system can be located in other locations in aircraft such as the fuselage in addition to or in place of in the nacelles for the engines. Further, heat exchanger can have flow steering features such as guide vanes to ensure the airflow enters and exits the heat exchanger in a desired orientation.

With reference now to FIGS. 6-18, illustrations of nacelle heat exchanger configurations are depicted in accordance with an illustrative embodiment. In this example, different layouts are shown in cross-section as examples of configurations that can be used when implementing heat exchangers in the nacelle of the engines.

Figure 6:
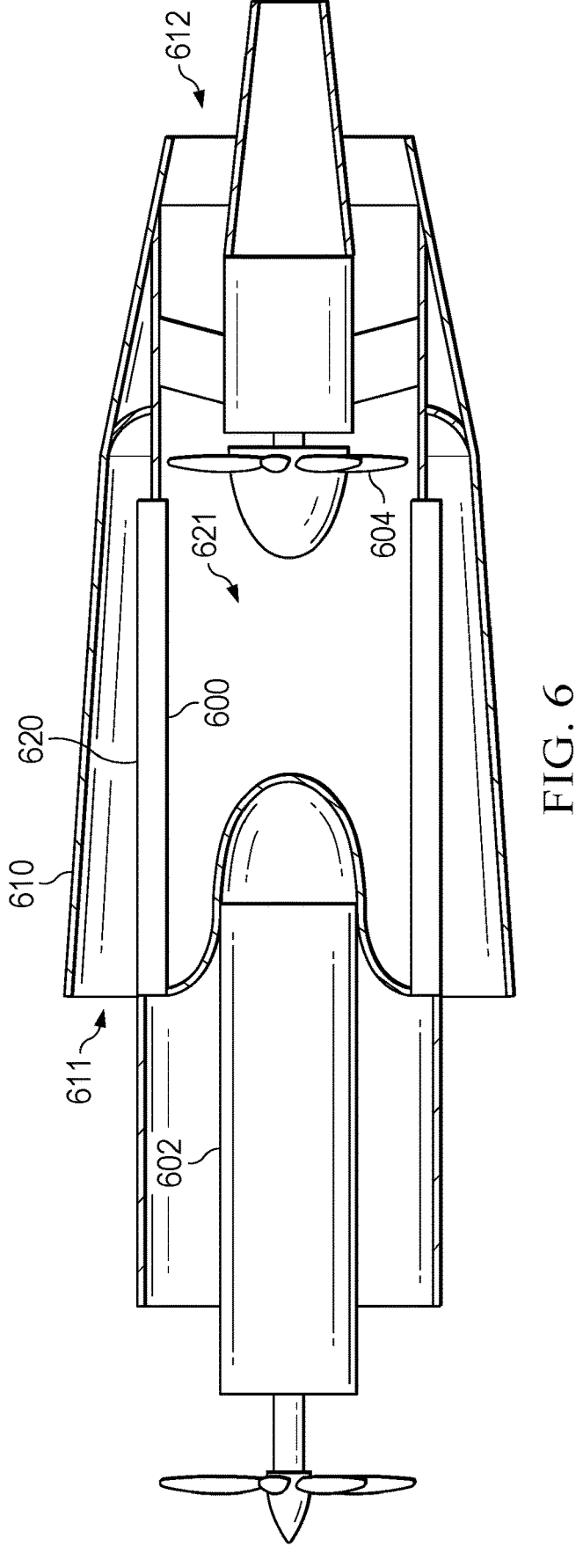
FIG. 6 is a cross-sectional view of a portion of a nacelle with a heat exchanger in accordance with an illustrative embodiment.

Turning to FIG. 6, the cross-sectional view of a portion of a nacelle with a nacelle heat exchanger is depicted in accordance with an illustrative embodiment. In this illustrative example, nacelle heat exchanger 600 is located in nacelle 610, which has inlet 611 and outlet 612. As depicted, nacelle heat exchanger 600 is a hollow geometric conduit in the form of the cylinder 620 having a channel 621. This hollow geometric can also take the form of an ellipsoid cylinder, annular cone, polygonal prism, or other shape.

As depicted, components 602 are located at least at one of forward of or partially within channel 621 in nacelle heat exchanger (HEX) 600. These components can be, for example, a fuel cell power system, a fuel cell stack, an electric motor, a controller, shaft, propeller, or other components for the engine of aircraft.

As depicted, fan 604 is located aft of nacelle heat exchanger 600. In other examples, fan 604 can be located forward of nacelle heat exchanger 600.

Fan 604 operates to increase the airflow passing through nacelle heat exchanger 600. This type of airflow may be useful when aircraft is operating on the ground or at altitudes and speeds that do not provide the desired levels of airflow or heat rejection required to cool the fuel cell.

Figure 7:
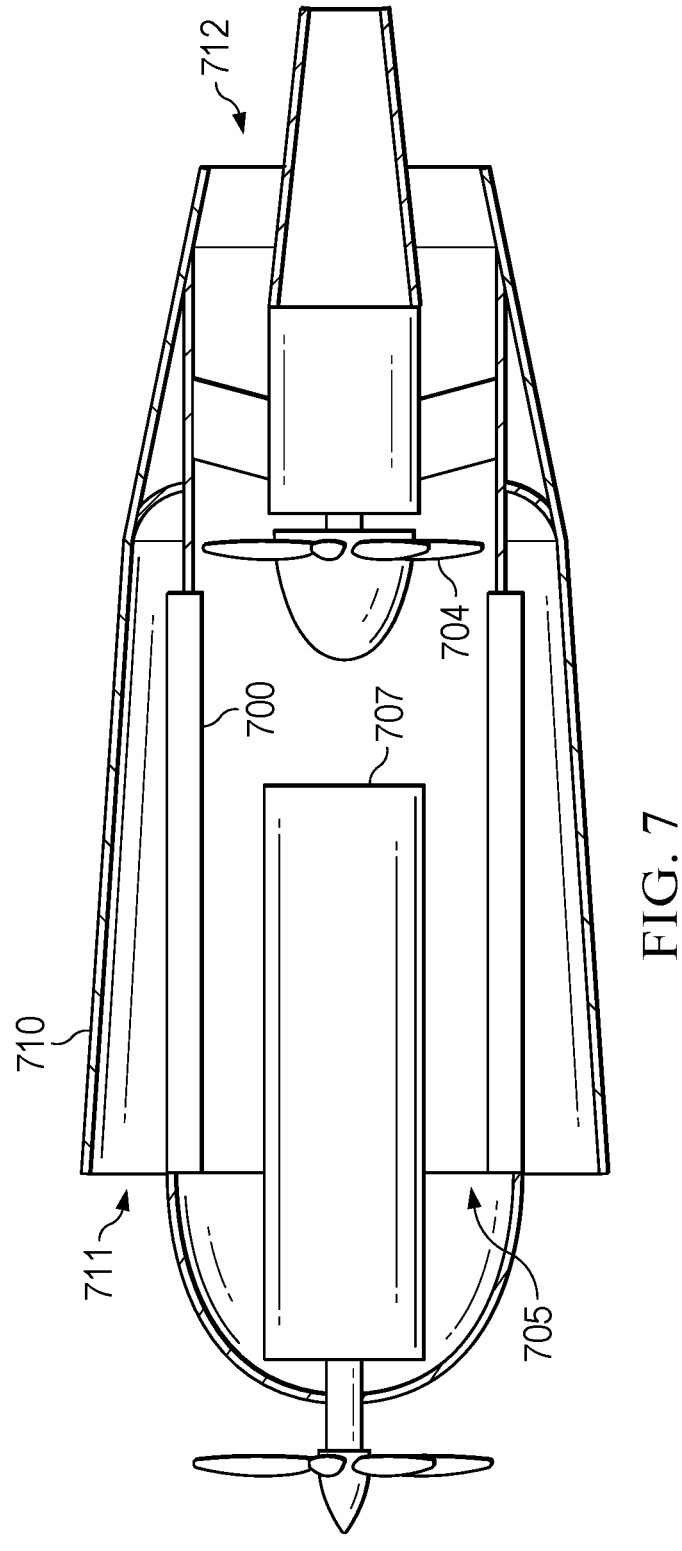
FIG. 7 is another illustration of a cross-sectional view of a portion of a nacelle with a nacelle heat exchanger in accordance with an illustrative embodiment.

Turning next to FIG. 7, another illustration of a cross-sectional view of a portion of a nacelle with a nacelle heat exchanger is depicted in accordance with an illustrative embodiment. In this example, nacelle heat exchanger (HEX) 700 is located in nacelle 710, which has inlet 711 and outlet 712. In this example, nacelle heat exchanger (HEX) 700 is annular with channel 705.

As depicted, fan 704 is located aft of nacelle heat exchanger 700. In other examples, fan 704 can be located forward of nacelle heat exchanger 700. In this example, other components 707 are illustrated as being further within the channel 705 of nacelle heat exchanger 700 as compared to other components 602 in FIG. 6.

Figure 8:
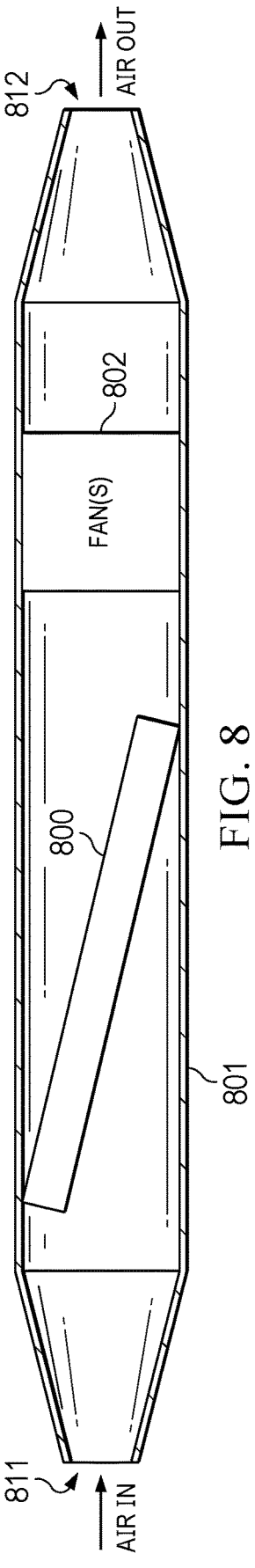
FIG. 8 is another illustration of a cross-sectional view of a portion of a nacelle with the nacelle heat exchanger in accordance with an illustrative embodiment.

With reference to FIG. 8, another illustration of a cross-sectional view of a nacelle with the nacelle heat exchanger is depicted in accordance with an illustrative embodiment. In this example, heat exchanger 800 is located in nacelle 801, which has inlet 811 and outlet 812.

As depicted, nacelle heat exchanger 800 has a rectangular shape and is positioned at a shallow angle within nacelle 801 with fan 802 being located aft of heat exchanger 800. This angle is considered to be a shallow angle. In this example, a shallow angle is an angle that is 45° or less.

The position of nacelle heat exchanger 800 at the shallow angle reduces the exposed frontal nacelle area and reduces the degree of airflow turning as it passes through nacelle heat exchanger 800 to maintain a low pressure drop across the heat exchanger.

In this example, fan 802 is shown as being positioned aft of heat exchanger 800. In other examples, fan 802 can be located forward of nacelle heat exchanger 800.

The diagrams of layouts for heat exchangers shown in FIGS. 6-8 are not meant to limit the manner in which heat exchanger designs in nacelles are implemented. For example, one or more fans can be used in addition to the fans depicted in these examples.

Figure 9:
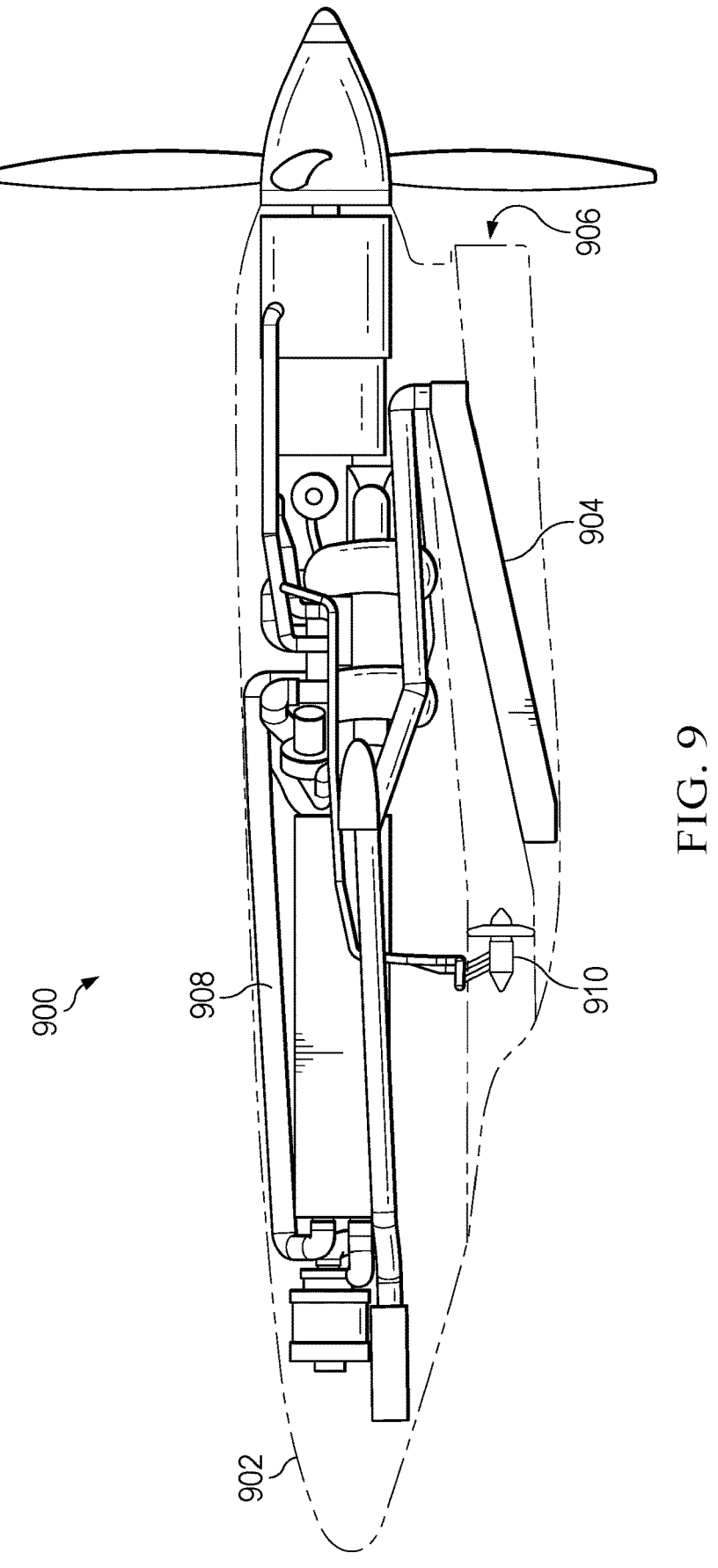
FIG. 9 is a pictorial illustration of an engine with a nacelle heat exchanger in accordance with an illustrative embodiment.

With reference to FIG. 9, a pictorial illustration of an engine with a nacelle heat exchanger is depicted in accordance with an illustrative embodiment. As depicted in the example, a side view of engine 900 is shown within nacelle 902 being shown in an exposed view and partially in phantom.

In this view, nacelle heat exchanger 904 can be seen at a shallow angle with respect to inlet 906 in nacelle 902. In this illustrative example, the shallow angle and being angle that is up to 45 degrees. Also depicted is conduit system 908 connected to heat exchanger 904. Conduit system 908 can circulate a fluid such as a gas or liquid for cooling in response to air flowing through inlet 906 in nacelle 902 through nacelle heat exchanger 904. The air flowing through inlet 906 to nacelle heat exchanger 904 can reduce the temperature of the coolant flowing within conduit system 908.

In this example, fan system 910 is located aft of nacelle heat exchanger 904. Fan system 910 can be used to cause or increase airflow through inlet 906 and through nacelle heat exchanger 904. Fan system 910 can be used to generate or increase airflow to nacelle heat exchanger 904 when the aircraft is stationary or moving at slower speeds.

Figure 10:
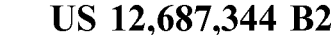
FIG. 10 is a pictorial illustration of an engine with a nacelle heat exchanger in accordance with an illustrative embodiment.

With reference to FIG. 10, a pictorial illustration of an engine with a nacelle heat exchanger is depicted in accordance with an illustrative embodiment. In this example, engine 900 in FIG. 9 is shown in perspective view.

As shown in this view, fan system 910 comprises fan 1001, fan 1002, and fan 1003. In some illustrative examples, fan system 910 can be located forward or in front of nacelle heat exchanger 904. In other illustrative examples, other numbers of fans can be present in fan system 910. For example, fan system 910 can have one fan, five fans, or some other number of fans.

Figure 11:
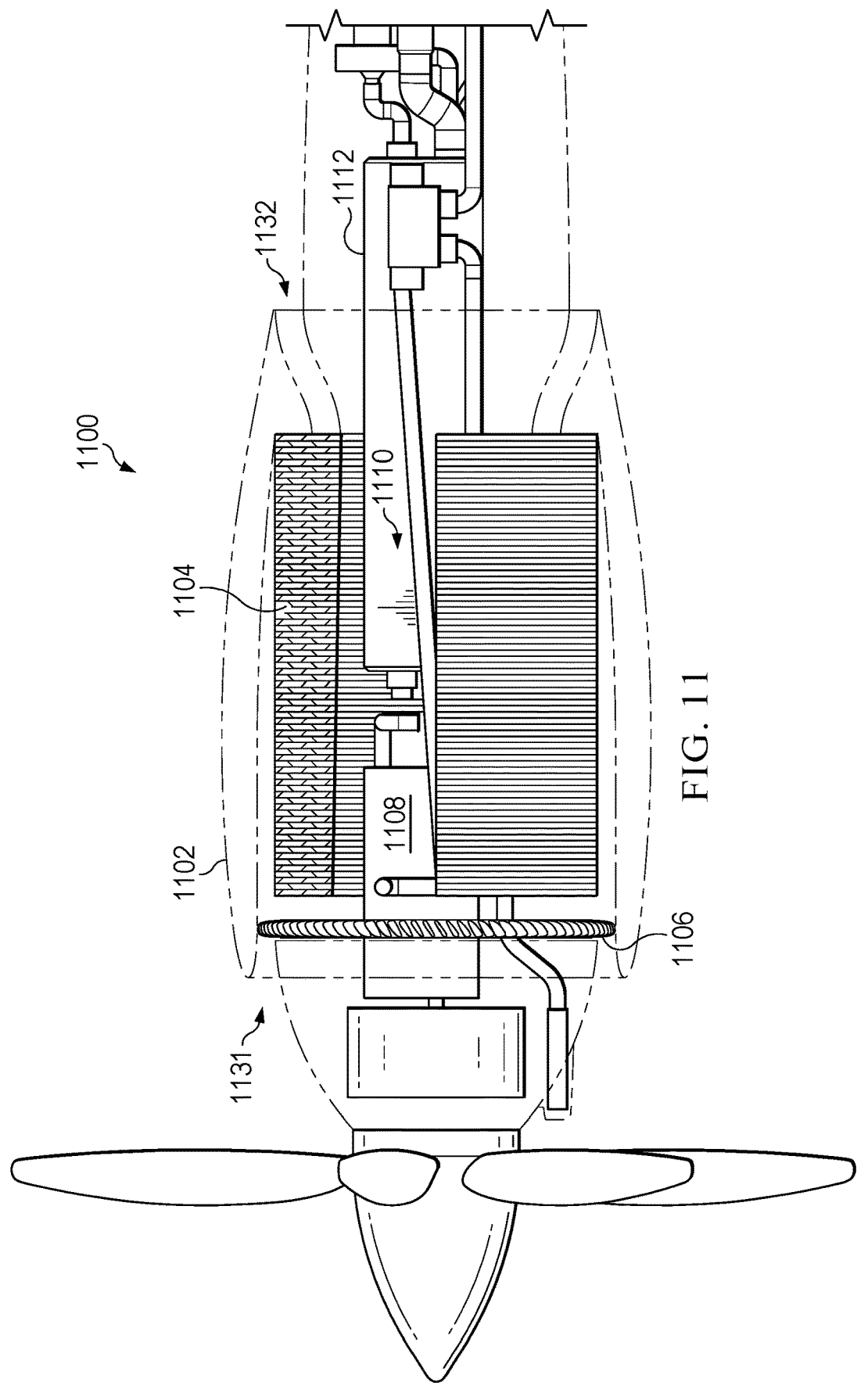
FIG. 11 is a pictorial illustration of an engine with a nacelle heat exchanger in accordance with an illustrative embodiment.

Turning to FIG. 11, a pictorial illustration of an engine with a nacelle heat exchanger is depicted in accordance with an illustrative embodiment. In this illustrative example, engine 1100 is shown from a side view. Engine 1100 comprises nacelle 1102 that houses components for engine 1100. Nacelle 1102 has inlet 1131 and outlet 1132.

A portion of nacelle 1102 is shown in phantom while another portion of nacelle 1102 is shown in cross-section such that other components within engine 1100 are shown.

As depicted, nacelle heat exchanger 1104 is located within nacelle 1102. In this illustrative example, nacelle heat exchanger 1104 is annular cylindrical in shape and has channel 1110.

Nacelle heat exchanger 1104 is positioned within nacelle 1102 such that the components can be positioned within channel 1110 in nacelle heat exchanger 1104. Further in this view, fan 1106 is located forward of nacelle heat exchanger 1104. In this depicted example, fan 1106 is an annular fan.

Also, in this example, electric motor 1108 is located within channel 1110 of nacelle heat exchanger 1104, which can be seen in this exposed view of nacelle heat exchanger 1104. Further, a portion of fuel cell stack 1112 can also be seen as being located within channel 1110 of nacelle heat exchanger 1104.

Figure 12:
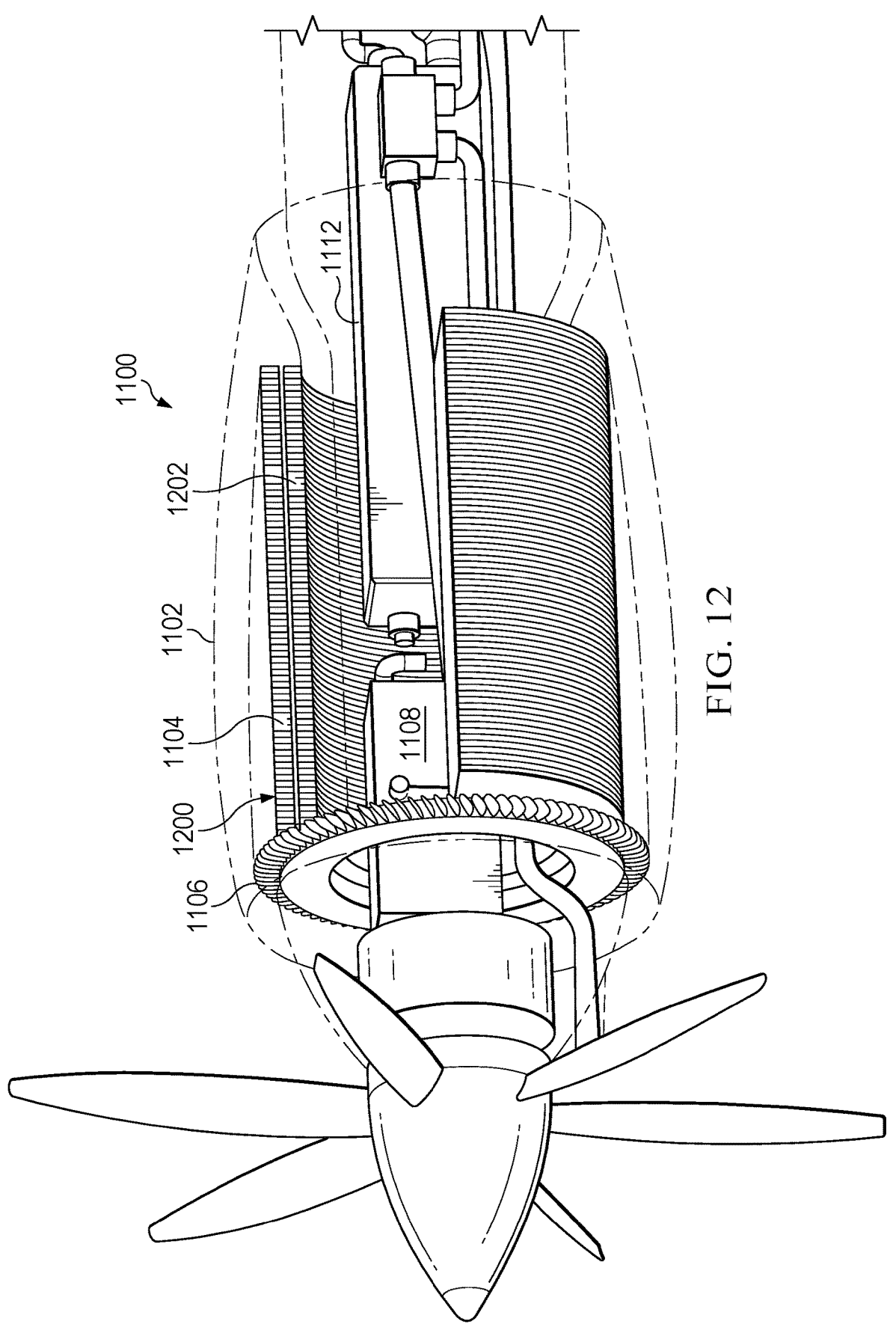
FIG. 12 is another pictorial illustration of an engine with a nacelle heat exchanger in accordance with an illustrative embodiment.

In FIG. 12, another pictorial illustration of an engine with a nacelle heat exchanger is depicted in accordance with an illustrative embodiment. In this figure, a perspective view of engine 1100 is shown. Cross-sectional view of heat exchanger 1104 is shown in this figure. Nacelle heat exchanger 1104 is shown as two concentric cylinders 1200. In this example, cylinder 1202 is located within cylinder 1204.

Figure 13:
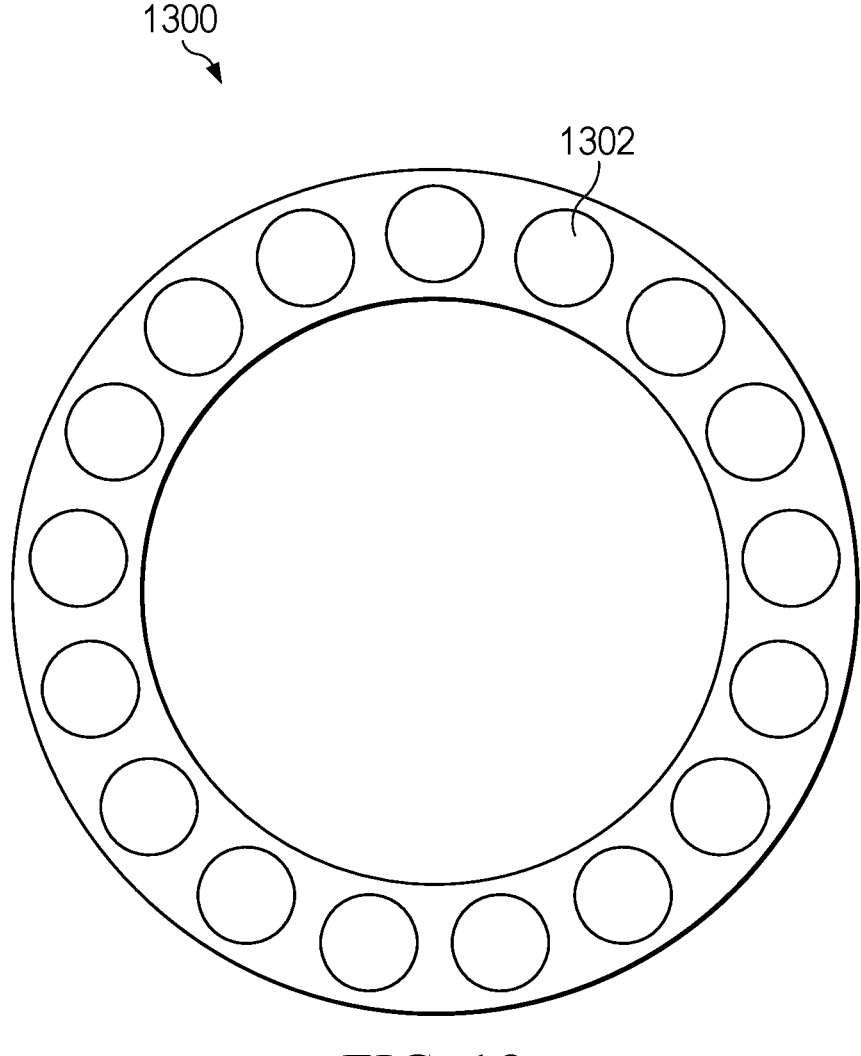
FIG. 13 is a schematic illustration of a fan configuration for use with a nacelle heat exchanger within a nacelle in points with an illustrative embodiment.

Next in FIG. 13, a schematic illustration of a fan configuration for use with a nacelle heat exchanger within a nacelle is depicted in accordance with an illustrative embodiment. As depicted, fans 1300 are arranged in a 360-degree ring 1302. This arrangement of fans can be used in place of the annular fan in FIG. 11 and in FIG. 12.

Figure 14:
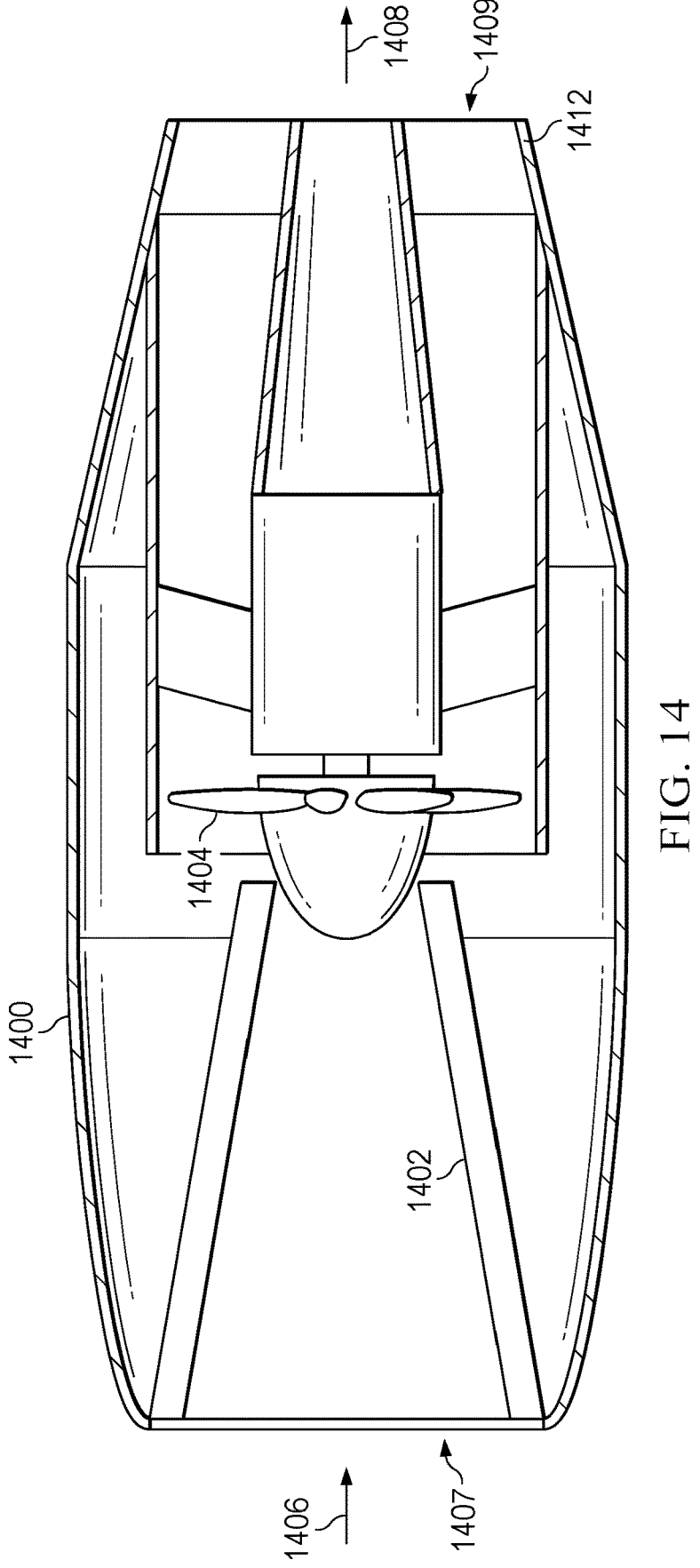
FIG. 14 is a cross-sectional view of a nacelle with the nacelle heat exchanger in accordance with an illustrative embodiment.

With reference now to FIG. 14, a cross-sectional view of a nacelle with the nacelle heat exchanger is depicted in accordance with an illustrative embodiment. In this example, a cross-sectional view is depicted of nacelle 1400 with inlet 1407 and outlet 1409. Example, nacelle 1400 is a dedicated nacelle for nacelle heat exchanger 1402.

Nacelle heat exchanger 1402 is also shown in a cross-sectional view within nacelle 1400. In this example, nacelle heat exchanger 1402 has a conical annular shape. In other words, nacelle heat exchanger 1402 can be a hollow geometric conduit with a channel. With this example, airflow by air 1406 passes at least one of though a surface in the channel or the surface on an exterior of the hollow geometric conduit. In one illustrative example, nacelle heat exchanger 1402 can also be in the shape of a pyramidal frustum.

Further in this example, fan 1404 is shown as being located aft of nacelle heat exchanger 1402. In the different examples, aft means fan 1404 is located behind nacelle heat exchanger 1402 with respect to the flow of air 1406 into inlet 1407 and the flow of air 1406 as exhaust 1408 through outlet 1409.

Further in this example, outlet 1409 takes the form of nozzle 1412. The nozzle can be a fixed area nozzle or a variable area nozzle depending on the particular implementation. This nozzle can increase exhaust velocities by air 1406 exiting nacelle 1400 as exhaust 1408. This higher exhaust velocity is achieved relative to the free stream velocity of the aircraft, leading to thrust recovery by this system.

In some illustrative examples, a fan system with one or more fans can be located forward or in front of the heat exchanger. A conduit system, fuel cell stack, and other components for the electric engine can also be seen in these views.

Turning now to FIG. 15, an illustration of airflow through a nacelle to provide cooling for a fuel cell stack is depicted in accordance with an illustrative embodiment. As depicted, arrows 1500 illustrate airflow into the substantially rectangular inlet at the bottom of the nacelle 1502. In this example, this airflow enters nacelle 1502 through inlet 1551, passes through the front of nacelle heat exchanger 1504 and exits out the back of nacelle heat exchanger 1504. The air then passes through fans 1506 before exiting out of the nozzle 1554 in outlet 1552 of nacelle 1502.

As depicted, fans 1506 can increase airflow shown by arrows 1500 during different phases of flight to provide desired airflow for cooling. For example, increased airflow can be achieved while the aircraft is stationary or taxiing prior to takeoff. In this example, conduit system 1508 is present and is connected to the forward end of heat exchanger 1504 and provides cooling for fuel cell stack 1510. Conduit system 1508 can provide for a flow of coolant through nacelle heat exchanger 1504, wherein the coolant is cooled by airflow through heat exchanger 1504.

Turning to FIG. 16, an illustration of a front view of the nacelle with a nacelle heat exchanger is depicted in accordance with an illustrative embodiment. As depicted, nacelle heat exchanger 1600 is seen in inlet 1630 of nacelle 1631. In this example, coolant enters through coolant inlet 1612 and exits through coolant exit 1610. This coolant can be cooled by heat exchanger 1600. The coolant can be cooled by airflow entering inlet 1630 of nacelle 1631 and passing through nacelle heat exchanger 1600.

Next in FIG. 17, an illustration of a nacelle heat exchanger is depicted in accordance with an illustrative embodiment. In this example, a top view of heat exchanger 1600 is shown. nacelle heat exchanger 1600 is a rectangular heat exchanger. As depicted, coolant enters nacelle heat exchanger 1600 through coolant inlet 1612 flows though heat exchanger 1600 and exits through coolant exit 1610.

Next in FIG. 18, an illustration of airflow through a nacelle heat exchanger is depicted in accordance with an illustrative embodiment. In this figure, arrows 1840 show the flow of coolant in an enlarged view of section 1704 of nacelle heat exchanger 1600. In this enlarged view, the coolant flows through multiple rows of tubes 1830 stacked on top of each other that form panels 1814 for heat exchanger 1600. The coolant is cooled by airflow traveling through fins 1831 in heat exchanger 1600.

The different illustrations of heat exchanger systems implemented in nacelles in FIGS. 6-18 are presented as some implementations for heat exchanger system 500 in FIG. 5. These illustrations are not meant to limit the manner in which other heat exchanger systems can be implemented in other illustrative examples. Other heat exchanger shapes and locations of components can be present in other illustrative examples. In another example, two heat exchangers can be implemented in one illustrative example.

In these examples, a single inlet and a single outlet are shown for a nacelle. In other examples, the nacelle can have more than one inlet and more than one outlet. For example, one inlet and outlet can be present in the nacelle for the main airflow to the fuel cell. Another inlet and another outlet and be present for the cooling airflow to a heat exchanger that cools other components such as electric motors and motor controllers. In these examples a unique installation can be used in which a dedicated nacelle is present for the nacelle heat exchanger such as in FIG. 14. In this example, only one inlet and outlet for the cooling air flow.

3. Start-Up of High Temperature Proton Exchange Membrane (HTPEM) Fuel Cell Aircraft with Multiple Power Generating Units High temperature proton exchange membrane (HTPEM) fuel cells, with their higher operating temperature, offer a substantial improvement in thermal driving potential compared to conventional low temperature proton exchange membrane (LTPEM) technology, allowing significant downsizing of fuel cell aircraft thermal management systems (TMSs). However, in having a much higher minimum operation temperature of around 120° C., the start-up process can be a time and energy intensive process when using high temperature proton exchange membrane (HTPEM) fuel cells in a fuel cell stack. In these examples, the startup process is a process in which the fuel cell stack is brought up to a minimum operating temperature and then fed fuel and oxidant to cause the fuel cell stack to begin generating power on its own.

The illustrative examples recognize and take into account that it is desirable to reduce the amount of time and electrical energy required to start HTPEM fuel cell stacks. This time element can be critical, as start-up time is allocated as down time in the conceptual operations (CONOPS) of fuel cell aircraft. The down time is an unwanted expense to operating aircraft for airlines.

An energy element is needed before the fuel cell stacks are started because power is not available from these fuel cell stacks before an operating temperature. Therefore, energy spent for start-up comes from another source.

Batteries are one solution for this start-up energy. However, batteries have an undesired weight. Further, batteries also have a low gravimetric energy density (Wh/kg). Thus, minimizing the start-up energy from batteries is useful in reducing aircraft weight and improving the performance in operating these type of aircraft.

The illustrative embodiments recognize and take into account that no existing solutions are present for aerospace applications. An alternate solution may be used in ground applications of HTPEM fuel cells. This solution can involve heating the stack via electrical resistive "blankets" or "mats" surrounding the stack edge or resistive heaters embedded in the stack end plate.

This solution relies on heat reaching the fuel cell stack internal active area through the exterior of the stack. This type of heating uses a more thermally resistive heat flow path, resulting in much wasted heat to the surroundings and slower time to bring the fuel cell stack internals up to the operating temperature. This situation can be especially present with fuel cell stack geometries with a large cross-sectional area, and can generate uneven temperature gradients within the stack.

Another alternate approach can push heated air through the fuel cell stack using an air management system (AMS) for the fuel cell stack. This approach wastes heat by rejecting the heated air through the fuel cell stack outlet and suffers from poorer effective thermal conductivity between the heating fluid (air) and the stack medium as compared to coolant.

Another solution may employ heating the fuel cell stack via cooling fluid as described in the different illustrative examples. This approach can operate to heat all of the fuel cell stacks at once but uses significantly more energy.

For example, in the case of an aircraft configuration with 6 engines located in six nacelles, three fuel cell power units are present per wing. With this configuration, the energy usage can be three times the total energy as compared to only starting one fuel cell stack size per wing before utilizing their generated power to start the other fuel cell stacks.

Thus, the illustrative examples provide a method, apparatus, and system to minimize the total energy and time required to complete the start-up of multiple HTPEM fuel cell stacks contained on a fuel cell powered aircraft. In one illustrative example, coolant heaters and the existing thermal management systems are used to start HTPEM fuel cell stacks by heating and circulating the fuel cell stack coolant. In this example, the coolant is first used to heat a subset of the total number of fuel cell stacks on the aircraft. After these fuel cell stacks reach operating temperature and start generating power, this power can be used to start the remaining fuel cell power stacks.

This feature involves a unique configuration of the coolant heating architecture in the illustrative examples. One illustrative example uses an electric coolant heater. This heater can be integrated into the conduits for the coolant system such that the existing cooling pump would be utilized to circulate the coolant through the stack and the start-up heater. Some bypasses would also be included in the architecture to allow the coolant to skip past the heater in normal operation after start-up, and a bypass to allow the coolant to skip past the heat exchanger during startup to avoid needing to heat the heat exchanger in addition to the stack-minimizing start-up time and energy required.

Another feature in the illustrative examples implements a startup process that produces the amount of energy needed to start fuel cell stacks. In a configuration with multiple fuel cell stacks on the aircraft, a subset of the total number of fuel cell stacks can be started initially using the on-board battery sized for only starting that subset of fuel cell stacks.

Once the subset of fuel cell stacks is started, the power generated by that subset of fuel cell power units now running can be used to start the remaining fuel cell stacks. Additionally, when the fuel cell stacks reach a minimum operating temperature required for electrochemical activity, fuel and air can be supplied to the fuel cell stacks along with applying a modest power draw to the fuel cell stack operating that generates sufficient heat to heat itself even faster.

Thus, the illustrative example can implement direct heating of the coolant in using a subset of the fuel cell stacks started by this type of heating to heat the other fuel cell stacks. This type of feature is enabled through the use of a coolant heater and configuration of conduits to supply heated coolant to fuel cell stacks.

Electrical cross ties can be used to allow the initial warmed and operating fuel cell power units to power coolant heaters and the air management systems (AMSs) of the other, not yet started fuel cell stacks to start those fuel cell stacks. This type of starting of fuel cell stacks can be performed for any aircraft system with multiple fuel cell stacks.

In another example, combustion-based coolant heaters that utilize the fuel, hydrogen or otherwise, can be used to heat the coolant and bring the fuel cell stacks up to temperature.

Further, a ground power hook-up can be implemented in some examples. This ground power hookup can be utilized to start all the stacks in unison when an aircraft is on the ground near an available ground power hookup.

This feature enables sizing the battery on-board to only start the initial subset of fuel cell power units, keeping the system lightweight but allowing for an even faster startup when ground power hookup is available, and the operator is not required to rely on the energy contained within the batteries.

With reference next to FIG. 19, an illustration of a block diagram of a startup system for an aircraft is depicted in accordance with an illustrative embodiment. In this illustrative example, fuel cell stack startup system 1900 can be used in aircraft 400 in FIG. 4 to startup operation for fuel cell stacks in engines 406 in FIG. 4.

In this illustrative example, fuel cell stack startup system 1900 is configured to start operation of fuel cell stacks 1920. Each fuel cell stack in fuel cell stacks 1920 can be located in a nacelle for an engine. In this example, fuel cell stacks 1920 are high-temperature proton exchange membrane (HTPEM) fuel cell stacks.

Fuel cell stack startup system 1900 is configured to assist or cause fuel cell stacks 1920 to reach operating temperature 1925. Operating temperature 1925 is one or more temperatures for fuel cell stacks 1920 to generate electricity. This electricity can be used to power at least one of the motors or other components in the engines or elsewhere in the aircraft. This operating temperature is the temperature needed to sustain a reaction in a fuel cell stack to generate electricity from hydrogen gas and oxygen.

For example, fuel cell stack startup system 1900 circulates heated coolant 1916 to a subset of fuel cell stacks 1920 in fuel cell system 1921 such that the subset of fuel cell stacks 1920 reach operating temperature 1925 and generate power that heats coolant 1917 to start up other fuel cell stacks in fuel cell stacks 1920 in the fuel cell system 1921. In this example, the power is electrical power.

In this illustrative example, fuel cell stack startup system 1900 is comprised of a number of different components. As depicted in this example, fuel cell stack startup system 1900 comprises heater system 1901, conduit system 1902, pump system 1904, and controller 1905.

In this example, heater system 1901 operates to heat coolant 1917. Heater system 1901 can comprise a number of heaters 1915. In one example, a heater in the number of heaters 1915 and a fuel cell stack in fuel cell stacks 1920 can be present in each nacelle.

Heater system 1901 can comprise electric heater 1930 connected to battery system 1931. In another example, heater system 1901 comprises combustion heater 1933 that generates heat to heated coolant 1916 using a hydrogen gas. With this example, combustion heater 1933 can be a conduit or radiator that is thermally connected to a component combusting hydrogen fuel. The hydrogen fuel can be delivered to the burner component as a gas.

Conduit system 1902 is thermally connected to heater system 1901 and fuel cell stacks 1920. Pump system 1904 is configured to circulate the heated coolant 1916 through conduit system 1902 to fuel cell stacks 1920.

In this illustrative example, controller 1905 is a hardware system that can include software. When software is used, the operations performed by controller 1905 can be implemented in program instructions configured to run on hardware, such as a processor unit. When firmware is used, the operations performed by controller 1905 can be implemented in program instructions and data and stored in persistent memory to run on a processor unit. When hardware is employed, the hardware can include circuits that operate to perform the operations in controller 1905.

In the illustrative examples, the hardware for controller 1905 can take a form selected from at least one of a circuit system, an integrated circuit, an application-specific integrated circuit (ASIC), a programmable logic device, or some other suitable type of hardware configured to perform a number of operations. With a programmable logic device, the device can be configured to perform the number of operations. The device can be reconfigured at a later time or can be permanently configured to perform the number of operations. Programmable logic devices include, for example, a programmable logic array, a programmable array logic, a field-programmable logic array, a field-programmable gate array, and other suitable hardware devices. Additionally, the processes can be implemented in organic components integrated with inorganic components and can be comprised entirely of organic components excluding a human being. For example, the processes can be implemented as circuits in organic semiconductors. Controller 1905 can also be selected from at least one of a single core processor, a dual-core processor, a multi-processor core, a general-purpose central processing unit (CPU), a graphics processing unit (GPU), a digital signal processor (DSP), or some other type of processor unit.

In this illustrative example, controller 1905 can control heater system 1901 to heat coolant 1917 to form heated coolant 1916. Controller 1905 can control pump system 1904 to circulate heated coolant 1916 through conduit system 1902. Further, controller 1905 can control conduit system 1902 to circulate heated coolant 1917 to a subset of fuel cell stacks 1920. In this example, heated coolant 1916 causes the subset of fuel cell stacks 1920 to reach operating temperature 1925. In this example, operating temperature 1925 is minimum operating temperature 1923 that is needed for the subset of fuel cell stacks 1920 to start generating electricity.

In this illustrative example, controller 1905 can control conduit system 1902 to circulate heated coolant 1916 to all of fuel cell stacks 1920 in response to the subset of fuel cell stacks 1920 reaching operating temperature 1925. In this example, heated coolant 1916 is heated by the subset of fuel cell stacks 1920 generating power. The remaining fuel cell stacks reach the operating temperature 1925 from heated coolant 1916 being heated by the subset of fuel cell stacks 1920. In this example, heated coolant 1916 is heated by the subset of fuel cell stacks 1920. Heater system 1901 no longer needs to heat coolant 1917.

In one example, heater system 1901 is comprised of heaters 1915 and in this example each fuel cell stack in fuel cell stacks 1920 and each heater in heaters 1915 is located in a nacelle. Further in this example, each fuel cell stack is thermally connected to a heater in the heaters 1915 by conduit system 1902. With this example, controller 1905 sends power generated by the subset of the fuel cell stacks 1920 to heaters 1915 for other fuel cell stacks that are not generating the power.

Further in this example, controller 1905 controls conduit system 1902 to bypass heater system 1901 after startup of fuel cell stacks 1920. The heating of coolant 1917 by heater system 1901 is no longer needed with fuel cell stacks 1920 now operating at operating temperature 1925. For example, controller 1905 halts heating of coolant 1917 by heaters 1915 in heater system 1901 for the subset of fuel cell stacks 1920 generating power in response to the subset of fuel cell stacks 1920 generating power.

During this start up process, controller 1905 controls conduit system 1902 to bypass nacelle heat exchangers 1960 during startup of the fuel cell stacks. Bypass of nacelle heat exchangers 1960 avoids cooling heated coolant 1916 by nacelle heat exchangers 1960. In this example, a nacelle heat exchanger in nacelle heat exchangers 1960 and a fuel cell stack in fuel cell stacks 1920 is present in each nacelle.

In one illustrative example, controller 1905 controls the conduit system 1902 to circulate the heated coolant to a number of the fuel cell stacks, wherein the heated coolant causes the number of fuel cell stacks to reach an operating temperature 1925 to a number of fuel cell stacks 1920, wherein the heated coolant causes the number of fuel cell stacks 1920 to reach operating temperature 1925. In this example, the number of fuel cell stacks 1920 is selected from a group comprising all of fuel cell stacks 1920 and a subset of fuel cell stacks 1920. In other words, the circulation of heated coolant can be to all or a portion of fuel cell stacks 1920.

Further in this example, conduit system 1902 and pump system 1904 operate to circulate coolant 1917 to nacelle heat exchangers 1960 during operation of electric engines for the aircraft.

The block diagram illustration of fuel cell stack startup system 1900 in FIG. 19 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although not shown, conduit system 1902 includes conduits. Conduit system 1902 can also include valves, pumps, or some combination thereof.

Turning next to FIG. 20, an illustration of a flowchart of a process for managing starting and operation of fuel cell stacks for aircraft is depicted in accordance with an illustrative embodiment. The process in FIG. 20 can be implemented in hardware, software, or both. For example, the process can be implemented in fuel cell stack startup system 1900 in FIG. 19.

The process heats a subset of the fuel cell stacks in the aircraft such that the fuel cell stacks reach an operating temperature to generate power (operation 2000). The process terminates thereafter.

With reference next to FIG. 21, an illustration of a flowchart of a process for heating fuel cell stacks is depicted in accordance with an illustrative embodiment. The process in this flowchart is an example of an additional operation that performs the operations in FIG. 20.

The process heats remaining fuel cell stacks to the operating temperature using heat occurring from the power generated by the subset of the fuel cell stacks (operation 2100). The process terminates thereafter.

Turning next to FIG. 22, an illustration of a flowchart of a process for managing starting and operation of fuel cell stacks for aircraft is depicted in accordance with an illustrative embodiment. The process in FIG. 22 can be implemented in hardware, software, or both. When implemented in software, the process can take the form of program instructions that are run by one of more processor units located in one or more hardware devices in one or more computer systems. For example, the process can be implemented in fuel cell stack startup system 1900 in FIG. 19.

The process begins by heating a coolant by heaters to form a heated coolant in a conduit system connected to fuel cell stacks (operation 2200). In operation 2200, heaters can be selected from at least one of electric heater connected to a battery system or a combustion heater that generates heat to heat the coolant using a hydrogen gas.

The process controls the conduit system to circulate the heated coolant to a subset of the fuel cell stacks, wherein the heated coolant causes the subset of the fuel cell stacks to reach an operating temperature (operation 2202). The process terminates thereafter.

With reference now to FIG. 23, an illustration of a flowchart of a process for circulating heated coolant is depicted in accordance with an illustrative. This process is an example of an additional operation that can be performed with the operations in FIG. 22.

The process circulates the heated coolant to all of the fuel cell stacks that have not reached the operating temperature in response to the subset of the fuel cell stacks reaching the operating temperature (operation 2300). The process terminates thereafter.

Next in FIG. 24, an illustration of a flowchart of a process for sending power to fuel cell stacks is depicted in accordance with an illustrative embodiment. The operation in this flowchart is an example of an additional operation that performs the operations in FIG. 24. In this example, each fuel cell stack in the fuel cell stacks and each heater in the heaters is located in a nacelle. Also, each fuel cell stack is thermally connected to a heater. This thermal connection can be formed using the conduit system.

The process sends power generated by the subset of the fuel cell stacks to the heaters for other fuel cell stacks that are not generating power (operation 2400). The process terminates thereafter.

Turning now to FIG. 25, an illustration of a flowchart of a process for halting heating of coolant is depicted in accordance with an illustrative embodiment. The process in this flowchart is an example of an additional operation that can be performed with the operations in FIG. 22.

The process halts heating of the coolant by the heating system for the subset of the fuel cell stacks generating power in response to the subset of fuel cell stacks generating the power (operation 2500). The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as program instructions, hardware, or a combination of the program instructions and hardware. When implemented in hardware, the hardware can, for example, take the form of integrated circuits that are manufactured or configured to perform one or more operations in the flowcharts or block diagrams. When implemented as a combination of program instructions and hardware, the implementation may take the form of firmware. Each block in the flowcharts or the block diagrams can be implemented using special purpose hardware systems that perform the different operations or combinations of special purpose hardware and program instructions run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

With reference to FIG. 26, an illustration of an aircraft with a propulsion and power system is depicted in accordance with an illustrative embodiment. Fuel cell stack startup system 1900 in FIG. 19 can be implemented in aircraft 2600.

In this illustrative example, aircraft 2600 is an airplane that comprises a fuselage 2630, first wing 2632 and second wing 2634 and a propulsion and power system in the form of engines 2601 and liquid hydrogen tanks 2602. These engines are electric engines.

As depicted, liquid hydrogen tanks 2602 comprises liquid hydrogen tank 2651, liquid hydrogen tank 2652, liquid hydrogen tank 2653, and liquid hydrogen tank 2654. In this illustrative example, two liquid hydrogen tanks are located over the wings on either side of aircraft 2600.

As depicted in this figure, engines 2601 comprise engine 2611, engine 2612, and engine 2613 connected to first wing 2632. Engines 2601 also comprise engine 2614, engine 2615, and engine 2616 connected to second wing 2634. These engines are all electric engines in this example.

In this example, each of these engines comprises a nacelle that contains a fuel cell stack, an air management system, a thermal management system, a motor, and a controller.

As depicted, two starter batteries are present. Starter battery 2603 is connected to engine 2613 and starter battery 2604 is connected to engine 2614. Starter battery 2603 can be used to start a fuel cell stack in engine 2613. Starter battery 2604 can be used at start a fuel cell stack in engine 2614. In this example, one starter battery is located on each side of aircraft 2600.

In this illustrative example, two starter batteries are depicted. In other illustrative examples, other numbers of starter batteries can be used. For example, an additional starter battery can be connected to engine 2612. In yet another illustrative example, a starter battery can be connected to engine 2616. In yet another illustrative example, a starter battery can be connected to more than one engine.

Next in FIG. 27, an illustration of an integrated power and propulsion unit is depicted in accordance with an illustrative embodiment. An exposed view of engine 2700 without a nacelle is depicted. In this illustrative example, engine 2700 is an integrated power and propulsion unit (IPPU) and is an example of an engine in engines 2601 shown in FIG. 26 without a nacelle.

Engine 2700 is an example of an engine that can implement a fuel cell startup system. Engine 2700 is comprised of a number of different components.

In this illustrative example, heat exchanger 2701 is a rectangular heat exchanger and operates to remove heat from fuel cell stack coolant and reject that heat to ambient air. Fan system 2702 operates to increase the airflow through heat exchanger 2701. This fan system can be used when the speed and temperature of ambient air moving through the inlet of the nacelle is insufficient to reject heat from the coolant for cooling different components in engine 2700.

Fuel cell stack 2703 converts hydrogen and oxygen reactants to electricity. In this example, the hydrogen is gaseous hydrogen and the oxygen is oxygen in the air. Heat and water also results from the generation of electricity using hydrogen and oxygen reactants.

Motor 2704 and controller 2705 convert electricity generated by fuel cell stack 2703 into rotational mechanical energy. This rotational mechanical energy is used to rotate a propeller. Controller 2705 controls the operation motor 2704.

Compressor 2706 compresses ambient air to provide sufficient oxygen reactant to the fuel cell stack cathode manifold. This compressor also operates to maintain cathode pressure for increased fuel cell stack performance. Turbine 2707 recovers energy from the air exiting fuel cell stack 2703 from the fuel cell stack cathode outlet.

Hydrogen (H2) recirculation blower 2708 operates to recirculate excess, unreacted hydrogen fuel flowing out of fuel cell stack 2703 from the fuel cell anode outlet back into fuel cell stack 2703 through fuel cell anode inlet. In this example, the heater is a starter heater that heats fuel cell stack 2703 to bring fuel cell stack 2703 up to an operating temperature. This operating temperature is the temperature needed to sustain the reaction to generate electricity from hydrogen gas and oxygen.

In this example, high temperature coolant pump 2710 circulates coolant to remove heat from fuel cell stack 2703 and transfer the heat to heat exchanger 2701 for rejection into the air. Low temperature coolant pump 2711 circulates coolant to remove heat from the low temperature components. These low temperature components need lower level cooling as compared to fuel cell stack 2703. The low temperature components can be, for example, motor 2704 and controller 2705. The heat is transferred to a low temperature heat exchanger, which is not shown as it is located within the wing, closer to the LH2 tanks.

Also depicted is an air management system (AMS) intake 2731. This intake receives air for the air management system that conditions air for the fuel cell stack 2703. This air management system includes compressor 2706 and charge air heat exchanger 2714.

Further in this example, exhaust 2713 is a location for exhausting vitiated, humid air from the fuel cell stack cathode outlet of fuel cell stack 2703 to the ambient air. Charge air heat exchanger 2714 thermally conditions the air compressor outlet air before it enters the fuel cell stack. Charge air heat exchanger 2714 is a charge air that provides heat exchange for compressed air in these examples. This conditioning can include increasing or reducing the temperature of the air such that fuel cell stack 2703 is at an operating temperature. Fuel cell air feeder duct 2715 routes compressed air from the outlet of compressor 2706 to the fuel cell stack cathode inlet for fuel cell stack 2703. Heater 2709 can heat the coolant in the high temperature loop as part of a startup process to heat fuel cell stack 2703 to the operating temperature.

The pictorial illustration of aircraft 2600 in FIG. 26 and engine 2700 in FIG. 27 are provided as an illustration of an aircraft in an engine in which a startup system can be implemented. This illustrative is not meant to limit the manner in which other illustrative examples can be implemented. For example, aircraft can have four engines or some other number of engines other than the six engines depicted for aircraft 2600. In another illustrative example, one starter battery or three starter batteries can be used in place of the two shown for aircraft 2600. Other illustrative examples can omit fan system 2702. In other illustrative examples, fan system 2702 can be located in front of heat exchanger 2701. In still other illustrative examples, heater 2709 can be emitted from engine 2700.

With reference next to FIG. 28, an illustration of a schematic diagram of a fuel cell stack startup system is depicted in accordance with an illustrative embodiment. In this illustrative example, fuel cell stack startup system 2800 is an example of a simplified implementation for fuel cell stack startup system 1900 in FIG. 19.

As depicted, fuel cell stack startup system 2800 comprises startup heater 2802, and conduit system 2803. These two components are used to start the operation of high temperature proton exchange membrane (HTPEM) fuel cell stack 2801. HTPEM fuel cell stack 2801 is an example of a fuel cell stack in fuel cell stacks 1920 In FIG. 19, startup heater 2802 is an example of a heater in heaters 1915 in heater system 1901 In FIG. 19, and conduit system 2803 is an example of conduit system 1902 in FIG. 19. As depicted, conduit system 2803 comprises conduits 2810, valve 2811, and valve 2812. In another illustrative example, these two valves can be replaced with a three-way valve.

In starting up, HTPEM fuel cell stack 2801 is warmed up to an operating temperature. As depicted, valve 2811 is in a closed position and valve 2812 is in an open position. This positioning of these valves causes air to flow through the startup heater 2802 instead of ram air radiator 2815.

The air is heated by startup heater 2802 and routed to HTPEM fuel cell stack 2801 as part of a process for heating up HTPEM fuel cell stack 2801 to operating temperature. When HTPEM fuel cell stack 2801 is at an operational temperature, valve 2811 is moved to an open position and valve 2812 is moved to a closed position such that coolant now flows through ram air radiator 2815 instead of startup heater 2802. Ram air radiator 2815 now operates to provide cooling to maintain HTPEM fuel cell stack 2801 at the operating temperature.

Turning next to FIG. 29, an illustration of a schematic diagram of a fuel cell stack startup system in a thermal management system is depicted in accordance with an illustrative embodiment. Fuel cell stack startup system 2997 in thermal management system 2996 is an example of an implementation for fuel cell stack startup system 1900 in FIG. 19. Fuel cell stack startup system 2997 depicts components that can be implemented in a single wing with three nacelles. For example, this wing can be first wing 2632 of aircraft 2600 in FIG. 26. In this example, components are shown for nacelle 2950, nacelle 2952, and nacelle 2954. Each of the nacelles can include components as shown in fuel cell stack startup system 2800 in FIG. 28.

In this illustrative example, the flow of fluids between components in these nacelles is facilitated using conduit system 2990. Conduit system 2990 comprises conduits such as tubes and pipes. The flow through these conduits can be controlled by valves to generate different flows through conduit system to heat loads 2933. Further, the conduit system can include pumps to move fluids. Conduit system 2990 is connected to different components. These connections can be thermal connections in which fluids are not exchanged components. In other examples, these connections can include introducing or receiving a fluid from a component.

As depicted, HTPEM fuel cell stack 2920 is located in nacelle 2950. Other components in this nacelle include startup heater 2910, pump 2911, charge air heat exchanger (HX) 2912, and high temperature and low temperature loop heat exchanger (HT-LT HX) 2914, and ram air radiator 2927. In this example, liquid Hydrogen heat exchanger (LH2 LX) 2913 is located in closer to the LH2 tanks 2971 such as in a wing. In some examples, this component can be present in each of the three nacelles or in just one of nacelles. This nacelle also includes heat loads 2933. These heat loads can include controllers, tanks, electric motors, and other components that generate heat. Pump 2925 is used to move coolant to these heat loads.

In this depicted example, HTPEM fuel cell stack 2921 is located in nacelle 2952. Other components in this nacelle include startup heater 2930, pump 2931, charge air heat exchanger (HX) 2932, and ram air radiator 2937. This nacelle also includes heat loads 2934. Pump 2935 is used to move coolant to these heat loads.

HTPEM fuel cell stack 2922 is located in nacelle 2954. Other components in this nacelle include startup heater 2960, pump 2961, charge air heat exchanger (HX) 2966, and ram air radiator 2967. This nacelle also includes heat loads 2945. Pump 2965 is used to move coolant to these heat loads.

In this configuration, the high temperature (HT) cooling loops in each nacelle are isolated from the other nacelles. Isolation between cooling loops can be performed by closing valve 2981, valve 2982, and valve 2983.

In this example, a startup process is performed for HTPEM fuel cell (FC) stack 2920, HTPEM fuel cell (FC) stack 2921, and HTPEM fuel cell (FC) stack 2922. The startup process involves starting up a subset of these HTPEM fuel cell stacks. In this example, the subset of the HTPEM fuel cell stacks is HTPEM fuel cell stack 2920 in nacelle 2950.

Starting the operation of the HTPEM FC stack 2920 in this configuration can be performed as follows:

1. Electrically power the startup heater 2910 and coolant pump 2911 using a starter battery. The starter battery can be battery 2603 in FIG. 26.
2. Open the bypass valve 2973 to have coolant to bypass ram air radiator 2927, ensuring that ram air radiator 2927 is not heated. At this point in time, that is used to heat coolant for bringing the fuel cell stacks up to an operating temperature. As a result, rejecting heat is not needed.

As depicted, flow path 2995 is a loop that enables startup heater 2910 to heat the coolant to form heated coolant that is used to heat HTPEM fuel cell stack 2920. As depicted in this flow path, the coolant flows from charge air HX 2912 to startup heater 2910, which heats the coolant. Heated coolant flows to HTPEM FC stack 2920 and then back to charge air HX 2912. In this example, pump 2911 operates to move the coolant in this flow path.

In this example, the flow of the heated coolant is through a subset of the fuel cell stacks, which is HTPEM FC stack 2920. Further, in this example, the flow is to HTPEM fuel cell stack 2920 and not the other fuel cell stacks, HTPEM fuel cell stack 2921 and HTPEM fuel cell stack 2922.

3. Once HTPEM FC stack 2920 reaches a minimum operating temperature for electrochemical activity, air (via powering the air management system) and fuel can be supplied to the stack so that HTPEM FC stack 2920 can begin generating power on its own. Additionally, applying a power draw on the HTPEM FC stack 2920 at this point will help it to heat itself due to the operational inefficiency at this initial operating temperature.

At this point, the electrical power generated by HTPEM FC stack 2920 can be used to power the neighboring nacelle's startup heaters to begin warming those HTPEM fuel cell stacks. Once these HTPEM fuel cell stacks reach an operating temperature, air (via the single started stack powering their air management systems) and fuel may be supplied to the remaining fuel cell stacks so that they too can begin producing power on their own.

For example, the high temperature (HT) coolant loops in each nacelle can be connected to each other to form a single loop. This connection can be performed in response to HTPEM FC stack 2920 reaching operating temperature. In other words, the coolant from this fuel cell stack can be used to heat other fuel cell stacks. This kind of heating can be performed in addition to or in place of using the startup heaters in other nacelles. This connection can be performed by placing valve 2981, valve 2982, and valve 2983 in an open position.

As a result, the heated coolant from HTPEM FC stack 2920 can be exchanged with the coolant in the other HT coolant loops for the other nacelles to begin heating those fuel cell stacks. Thus, heat generated by a fuel cell stack that has reached operational temperature can be used to heat other fuel cell stacks in other nacelles to initiate operation of those fuel cell stacks. Further, this type of heating can also enable the illuminating use of startup heaters in the other nacelles. As a result, a number of heaters can be reduced, reducing the weight of the aircraft.

In another illustrative example, this type of heating can be performed in conjunction with the electrical heating approach using starter triggers. As a result, the use of startup heaters and exchanging coolant with other nacelles can increase the speed at which fuel cell stacks reach an operating temperature and begin generating electricity.

Turning next to FIG. 30, an illustration of a schematic diagram of a fuel cell stack startup system in a thermal management system with is depicted in accordance with an illustrative embodiment. FIG. 30 depicts configuration of fuel cell stack startup system 2997 in which the high temperature cooling loops are isolated from each other by the configuration of conduit system 2990. Conduits are not present that enable exchanging high temperature coolant between fuel cell stacks in different nacelles.

In this example, the startup of HTPEM fuel cell (FC) stack 2921 and HTPEM fuel cell (FC) stack 2922 is initiated by power sent to startup heater 2930 and 2960 from HTPEM fuel cell (FC) stack 2920 in response to startup heater 2910 generating heat such that HTPEM fuel cell (FC) stack 2920 reaches an operating temperature. In this example, coolant is not exchanged between the different nacelles for use in starting up the different HTPEM fuel cell stacks.

The illustration of fuel cell stack startup system 2997 in FIG. 29 and FIG. 30 is presented as an illustration of implementation for fuel cell stack startup system 1900 in FIG. 19. This illustration is not meant to limit the manner in which other fuel cell stack systems can be implemented in other examples. For example, single startup heater can be used in other fuel cell stack startup systems. In another illustrative example, a battery can be included in a nacelle.

4. Low Temperature Proton Exchange Membrane Charge Air Heat Exchanger

Low temperature proton exchange membrane (LTPEM) fuel cells present a zero-emission, high-efficiency manner of generating at least one of propulsive power or systems power for aircraft. When using oxygen as one of the two reactants, LTPEM fuel cell systems often utilize compressors to maintain a sufficient supply of reactant and increase performance via increased cathode-side pressure. In this example the other reactant is gaseous hydrogen (H2).

This compression, however, can heat the inlet air beyond the operating temperature of the fuel cell stack. To avoid overheating in this situation, a cooling stage can be used.

In the illustrative example, cooling loads and efficiency are factors in cooling designing systems. It is desirable to reduce the overall cooling load and increase efficiency of the cooling system.

Existing low temperature proton exchange membrane (LTPEM) fuel cell systems require compressors to sufficiently pressurize ambient air and supply the fuel cell stack with one of the two reactants, which is oxygen, usually from air. In compressing the air, heat is also added. Depending on the degree of the compression, cooling the air before the air enters the fuel cell stack can be performed to avoid over-heating and drying out the fuel cell stack membranes.

This cooling can be performed using an air-to-liquid intercooler. However, this type of cooling puts the burden of cooling the air on the stack cooling system. Additionally, energy recovery opportunities are not taken advantage of with current systems.

The illustrative examples provide a method, apparatus, and system for cooling incoming compressed air, while allowing the capture of significant energy to increase overall system efficiency.

In one illustrative example, a charge air heat exchanger is used. The component utilizes cooled outgoing stack air to cool the hot, compressed compressor outlet air. The effect of this type of cooling is two-fold. This component cools the compressed air to enable reducing the air-to liquid inter-cooler as compared to not performing this type of cooling. Additionally, the use of the charge air heat exchanger enables heating the stack exhaust air to increase the energy recovery of the air management system (AMS) expander to increase overall system efficiency.

The cooling of the compressor outlet air is currently performed using a charge air intercooler. In ground vehicle fuel cell systems, the heat injected into the air during compression is less because of the relatively low-pressure ratio between stack and ambient pressure. As a result, less energy recovery is available by expansion for the same reason.

A charge air heat exchanger is a heat exchanger that provides heat exchange for compressed air. This heat exchanger can cool compressed air. A charge air intercooler is an intercooler that provides cooling for compressed air in these examples.

The illustrative examples recognize and take into account that the systems used in ground vehicles often either have no inlet air cooling or simply use a single air-to-liquid inter-cooler. Likewise, the current systems in vehicles often do not include an expander for energy recovery.

The illustrative examples recognize and take into account that current cooling in ground vehicle systems do not take into account the manner in which aircraft operates at vastly different altitudes as compared to ground goals. With air-craft, which operate at different altitudes, the need to cool the compressed air and to have energy available for recovery at the stack outlet are increased. The illustrative examples use a heat exchanger in addition to the intercooler to reduce the cooling load and increase energy recovery by the expander. In some illustrative examples, the charge air heat exchanger can replace charge air intercooler, rather than simply downsizing the charge air intercooler.

With reference next to FIG. 31, an illustration of a block diagram of an aircraft management system is depicted in accordance with an illustrative embodiment. In this illustra-tive example, aircraft air management system 3100 can be implemented in aircraft 400 in FIG. 4 to manage the operation of fuel cell stacks in engines 406 in FIG. 4 to generate electricity to operate engines 406. In this example, aircraft air management system 3100 manages the tempera-ture of air sent to fuel cell stack 3105 for use with gaseous hydrogen to generate electricity for operating electric motors in the aircraft. In this example, fuel cell stack 3105 com-prises low temperature proton exchange membrane fuel cells 3113.

In one illustrative example, aircraft air management sys-tem 3100 has a number of different components. As depicted, aircraft air management system 3100 comprises air heat exchanger 3102, intercooler 3103, and conduit system 3104.

In this example, conduit system 3104 is connected to air heat exchanger 3102, intercooler 3103 and fuel cell stack 3105. Heated air 3120 flows through conduit system 3104 to air heat exchanger 3102. Air heat exchanger 3102 cools heated air 3120 to form cooler air 3122. In this example, cooler air 3122 flows from the air heat exchanger 3102 through the conduit system to intercooler 3103. Intercooler 3103 further cools cooler air 3122 to form cooled air 3124. Cooled air 3124 flows from intercooler 3103 through con-duit system 3104 to fuel cell stack 3105. In this example, cooled air 3124 is at operating temperature 3125 for fuel cell stack 3105.

In one illustrative example, air heat exchanger 3102, intercooler 3103, conduit system 3104, and fuel cell stack 3105 are located in nacelle 3130 for engine 3132 for aircraft 3127.

Further, aircraft air management system 3100 also includes compressor 3107. Compressor 3107 is connected to conduit system 3104 and generates heated air 3120 that flows through air heat exchanger 3102.

In this example, heated air 3120, cooler air 3122, and cooled air 3124 are compressed air 3126.

Further, conduit system 3104 can also route gaseous hydrogen 3140 from fuel system 3142 to fuel cell stack 3105. Gaseous hydrogen 3140 can be used with cooled air 3124 to generate electricity to power engine 3132 for aircraft 3127. This routing is performed using separate conduits such that gaseous hydrogen 3140 is separate from air flowing in conduit system 3104. In other words, a first portion 3111 of conduit system 3104 can be used to route air while second portion 3112 of conduit system 3104 can be used to route gaseous hydrogen 3140. These two portions are separate from each other such that air and hydrogen do not mix within conduit system 3104.

In this example, second portion 3112 of conduit system 3104 routes heated air 3120 from intercooler 3103 to fuel system heat exchanger 3141 that heats liquid hydrogen 3143 to form gaseous hydrogen 3140. This second portion of conduit system 3104 routes gaseous hydrogen 3140 from the fuel system heat exchanger 3141 to fuel cell stack 3105. Fuel cell stack 3105 uses oxygen in cooled air 3124 and gaseous hydrogen 3140 to generate electricity. In this example, the air is cool to operating temperature 3125.

The block diagram illustration of aircraft air management system 3100 in FIG. 31 is not meant to imply physical or architectural limitations to the manner in which an illustra-tive embodiment may be implemented. Other components in addition to or in place of the ones illustrated may be used. Some components may be unnecessary. Also, the blocks are presented to illustrate some functional components. One or more of these blocks may be combined, divided, or com-bined and divided into different blocks when implemented in an illustrative embodiment.

For example, a nacelle may have more than one fuel cell stack in other illustrative examples. As another example, conduits are present in conduit system 3104. Additionally, valves and pumps also may be present in conduit system 3104. Although not shown in this block diagram, aircraft 3127 also includes other engines in addition to engine 3132.

Further, aircraft air management system 3100 can also heat compressed air 3126 depending on the temperature the compressed air relative to the coolant flowing through air heat exchanger 3102 to heat or cool heated air 3120 from compressor 3107. In this manner, compressed air 3126 can be managed for use in fuel cell stack 3105 by heating and cooling compressed air 3126 depending on the temperature of compressed air 3126 relative to the coolant in air heat exchanger 3102. In this manner, the temperature of compressed air 3126 reaching fuel cell stack 3105 can be managed to have a temperature that is sufficiently close to the temperature of fuel cell stack 3105 that enables a desired level of electricity generation. This type of management of compressed air 3126 reaching fuel cell stack 3105 is performed to avoid increases in temperature gradients that reduces the efficiency in generating electricity. As result, compressed air 3126 can be heated or cooled to have a temperature relative to the operating temperature for fuel cell stack 3105 that provides a desired level of electricity generation.

Turning next to FIG. 32, an illustration of a flowchart of a process for air management is depicted in accordance with an illustrative embodiment. The process in FIG. 32 can be implemented in hardware, software, or both. For example, the process can be implemented in fuel cell stack startup system 1900 in FIG. 19.

The process begins by receiving heated air (operation 3200). The process cools the heated air with an air heat exchanger to form cooler compressed air (operation 3202).

The process cools the cooler air with an intercooler to form cooled compressed air (operation 3204). The process sends the cooled air to a fuel cell stack (operation 3206). The process terminates thereafter.

In FIG. 32, the air heat exchanger, the intercooler, and the fuel cell stack are located in a nacelle for an engine of an aircraft. Ambient air is directed via the nacelle inlet, into the compressor, where the pressure is increased. The air, now having higher pressure and temperature, is ducted to the charge air heat exchanger where it is conditioned toward fuel cell stack temperature by exchanging heat with the fuel cell stack cathode outlet.

The temperature of the air is then further conditioned toward fuel cell stack temperature via exchanging heat with the fuel cell stack coolant in the charge air intercooler, after which, it is delivered to the stack. Within the fuel cell stack, the oxygen within the air reacts with the hydrogen as it moves across the individual fuel cells. Exiting the stack, the vitiated air also removes some amount of the water product to keep the fuel cell stack from flooding.

The air, once exhausted from the stack, passes through the charge air heat exchanger. The air then goes through the turbine, where the air is expanded to recover energy to utilize toward the compression process, and finally, exits the nacelle as exhaust air.

With reference now to FIG. 33, an illustration of a schematic diagram of an aircraft air management system is depicted in accordance with an illustrative embodiment. Air management system 3301 operates to cool fuel cell stack 3304. In this example, air management system 3301 includes charge air exchanger (HX) 3300 and charge air intercooler 3302 and conduit system 3303. Air management system 3301 also includes compressor (C) 3305, turbine (T) 3311, motor 3341, and controller 3342.

In this example, the compressor (C) 3305 receives inlet air 3317 that enters the nacelle and generates compressed air 3318 that has a higher pressure than inlet air 3317. In this example, compressor 3305 is operated by motor 3341 under the control of controller 3342. Further, compressed air 3318 has a higher temperature that may be higher than desired for use in fuel cell stack 3304. This compressed air can be cooled to form cooled compressed air 3319 using charge air heat exchanger (HX) 3300 and charge air intercooler 3302.

Charge air heat exchanger (HX) 3300 initially cools compressed air 3318 to form cooler air 3321. This cooler compressed air can be further cooled by charge air intercooler 3302 providing further cooling to form cooled compressed air 3319. As a result, cooled compressed air 3319 is compressed air that can have a desired temperature for use with fuel cell stack 3304.

Cooled compressed air 3319 can be used with gaseous hydrogen received from hydrogen (H2) fuel system 3320 in fuel cell stack 3304 to generate electricity that is used to power components such as motor 3341 and controller 3331. Motor 3341 in turn provides mechanical energy for rotating propulsor 3362. Hydrogen fuel system 3320 can include liquid hydrogen tanks, a recirculating system, a cooling system, and other components. In this example, a liquid hydrogen heat exchanger converts liquid hydrogen to gaseous hydrogen for use in fuel cell stack 3304.

In this example, the compressed air 3323 flowing through fuel cell stack 3304 is routed to charge air heat exchanger 3300, which heats this air as part of a process of cooling compressed air received from compressor 3305 to form heated air 3326. This heated air is used to turn turbine 3311. In this manner, some energy recovery can occur using turbine 3311. Air 3328 from turbine 3311 is then routed and exits the engine as exhaust air 3313.

A thermal management system operates to remove the heat from the fuel cell stack 3304, motor 3330, and controller 3331, while the ram air radiator 3350 rejects that heat to ambient air. The thermal management system warms and gasifies the liquid hydrogen fuel using liquid hydrogen heat exchanger (LH2 HX) 3335 for use in fuel cell stack 3304.

5. Fuel Cell Aircraft Thermal Management System

Both low temperature proton exchange membrane (LT-PEM) fuel cells and high temperature proton exchange membrane (HTPEM) fuel cells present a zero carbon emissions method for powering aircraft. Further, these types of fuel cells also can provide a high-efficiency manner of generating at least one of propulsive power or electrical power for aircraft systems.

The lower operating temperature as compared to conventional turbomachinery makes for large and heavy thermal management system (TMS) designs. The illustrative examples provide features for managing and rejecting the heat generated by fuel cell propulsion systems on board aircraft while reducing undesired impacts on performance.

High temperature proton exchange membrane (HTPEM) technology can be used to provide higher thermal driving potential that enables significant downsizing of the thermal management system. In this example, thermal driving potential is the temperature difference between the ambient air and coolant exiting the fuel cell. Other electric propulsion components such as motors, their controllers, and other power electronics, however, typically operate at temperatures much closer to that of LTPEM fuel cells. HTPEM fuel cell powered aircraft, therefore, can use a different approach for thermal management beyond that of having a single shared system for all electric propulsion components.

In this illustrative example, a dual loop architecture is employed to maintain separate temperature control of the HTPEM fuel cell stack and the lower temperature motors and controllers within the nacelle used for the fuel cell air management system, the cooling fans, and propulsion. In other words, one loop can be used for the HTPEM fuel cell stack and another loop can be used for generator components other than the fuel cell stack. These heat generating components can be motors, controllers, and power electronics in the nacelle.

In one example, the low temperature (LT) cooling loop comprises coolant that cools heat generating components. These heat generating components are also referred to as heat loads. The coolant in this loop is cooled by the heat capacity of the liquid hydrogen fuel on board. This type of cooling enables sufficient heat to be available to gasify the liquid hydrogen for the fuel cell stack. This type of cooling can also remove the need for a dedicated nacelle heat exchanger for the lower temperature, liquid-cooled components within the nacelle.

A high temperature (HT) loop comprises a coolant that is used to manage the temperature of the fuel cell stack. This management temperature can include at least one of heating or cooling the fuel cell stack to maintain the fuel cell stack at an operating temperature. In these examples, a range of operating temperatures can be present.

In this example, the high temperature loop includes a nacelle heat exchanger. This heat exchanger is a different heat exchanger used in the low temperature loop in the nacelle of the engine. The use of separate low temperature (LT) and high temperature (HT) cooling loops to cool the fuel cell stacks and the lower temperature heat loads. The lower temperature heat loads are heat loads that have a lower temperature than the fuel cell stack. These separate cooling loops remove the need for a separate low temperature heat exchanger to increase efficiency and effectiveness in cooling components by reducing the mass and drag caused by the thermal management system.

Turning next to FIG. 34, an illustration of a block diagram of an aircraft thermal management system is depicted in accordance with an illustrative embodiment. In this illustrative example, aircraft thermal management system 3400 can be implemented in aircraft 400 in FIG. 4 to provide thermal management during operation of fuel cell stacks and other components that generate heat in engines 406 in FIG. 4. In this example, aircraft thermal management system 3400 provides cooling for fuel cell stack 3405 and a number of heat loads 3416. In this example, fuel cell stack 3405 comprises high temperature proton exchange membrane fuel cells. The number of heat loads 3416 comprises at least one of an electric motor, a power circuit, a controller, power electronics, or some other component that generates heat.

In this illustrative example, aircraft thermal management system 3400 comprises high temperature loop 3401 and low temperature loop 3402. High temperature loop 3401 and low temperature loop 3402 are located in conduit system 3403.

High temperature loop 3401 is configured to manage temperature 3410 of fuel cell stack 3405 in nacelle 3406 using a nacelle heat exchanger 3421. In managing temperature 3410 of fuel cell stack 3405, high temperature loop 3401 is configured to maintain fuel cell stack 3405 at operating temperature 3411. Maintaining temperature 3410 can include at least one of cooling or heating fuel cell stack 3405. Operating temperature 3411 can be one or more temperatures and can be a range of temperatures within operating temperature limit 3419. In this example, operating temperature limit 3419 is the maximum or minimum temperature at which fuel cell stack 3405 can operate.

In this example, high temperature loop 3401 can remove heat from fuel cell stack 3405 using coolant 3430 in high temperature loop 3401. Coolant 3430 can be cooled using nacelle heat exchanger 3421 to a temperature that is sufficient to cool or heat fuel cell stack 3405 such that temperature 3410 for fuel cell stack 3405 is at operating temperature 3411 that is within operating temperature limit 3419 for fuel cell stack 3405.

In this example, heat is removed in response to operating temperature 3411 being greater than operating temperature limit 3419. With this example, coolant 3430 has a temperature that is lower than operating temperature 3411. In this case, heat is removed from fuel cell stack 3405 and is sent into ambient air as part of the exhaust air exiting nacelle 3406. Heat can be added to fuel cell stack 3405 in response to operating temperature 3411 being lower than operating temperature limit 3419. In other words, coolant 3430 can be warmer than operating temperature limit 3419. For example, coolant 3430 can be warmer than operating temperature limit 3419 during startup of fuel cell stack.

Low temperature loop 3402 is configured to cool a number of heat loads 3416 in nacelle 3406 using heat capacity 3407 of liquid hydrogen 3408. In this example, heat capacity 3407 of liquid hydrogen 3408 can be used to cool coolant 3430 in low temperature loop 3402 for use in cooling the number of heat loads 3416.

The heat capacity of liquid hydrogen 3408 is the energy needed to convert liquid hydrogen 3408 into gaseous hydrogen 3445. The conversion of liquid hydrogen 3408 into gaseous hydrogen 3445 cools. As result, this cooled coolant can be used to cool heat loads 3416.

In this illustrative example, in adding or removing heat to fuel cell stack 3405 exhaust air using charge air heat exchanger 3420, heated compressed air 3440 generated by compressor 3441 can be conditioned in conduit system 3403 by charge air heat exchanger 3420 to form compressed air near operating temperature 3411. This compressed air is sent into the fuel cell stack 3405 for use with gaseous hydrogen 3445 to generate electricity.

In one illustrative example, air intercooler 3460 can also be present. With this example, air intercooler 3460 can receive cooled compressed air 3444 from charge air heat exchanger 3420 through conduit system 3403 and further condition cooled compressed air 3444 and send cooled compressed air 3444 near operating temperature 3411 into the fuel cell stack 3405. Cooled compressed air 3444 reacts with gaseous hydrogen 3445 in fuel cell stack 3405 to generate electricity.

In this illustrative example, heated compressed air 3440 can be based on temperature 3410 a fuel cell stack 3405. If heated compressed air 3440 air is too far above operating temperature 3411 for fuel cell stack 3405, then heated compressed air 3440 is cooled. If the heated compressed air 3440 is too far below operating temperature 3411 for fuel cell stack 3405, then heated compressed air 3440 is heated. When the temperature is too far below or above can be determined using thresholds.

The ability to heat or cool heated compressed air 3440 can be controlled by the coolant temperature. The coolant temperature can be controlled by at least one of the coolant pump speed or changing the amount of air flow through the nacelle heat exchanger 3421.

Thus, in this illustrative example, high temperature loop 3401 operates to cool fuel cell stack 3405. In some cases, this loop can heat fuel cell stack 3405 such as during the startup of fuel cell stack 3405. In a separate loop, low temperature loop 3402 operates to a set of cool heat loads 3416. As result, these two loops can provide flexibility cooling different components that may need different levels of cooling.

Further, the illustrative example enables conditioning air for use with gaseous hydrogen 3445 in fuel cell stack 3405 to generate electricity. This conditioning of the air from compressor 3441 can include at least one of heating or cooling depending on the temperature of heated compressed air 3440 and temperature 3410 of fuel cell stack 3405.

The block diagram illustration of aircraft thermal management system 3400 in FIG. 34 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, nacelle 3406 can include one or more fuel cell stacks in addition to fuel cell stack 3405 in another illustrative example. In another example, another heat exchanger such as an intercooler can be used with charger heat exchanger 3422 further cool heated compressed air 3440.

Turning next to FIG. 35, an illustration of a flowchart of a process for thermal management is depicted in accordance with an illustrative embodiment. The process in FIG. 35 can be implemented in hardware, software, or both. For example, the process can be implemented in aircraft thermal management system 3400 in FIG. 34.

The process begins by managing a temperature of a fuel cell stack in a nacelle using a nacelle heat exchanger in a high temperature loop (operation 3500).

The process cools a number of heat loads fuel cell stack in a nacelle using in a low temperature loop cools that the number of heat loads using a heat capacity of liquid hydrogen (operation 3502). The process terminates thereafter.

Referring now to FIG. 36, an illustration of a flowchart of a process for managing the temperature of a fuel cell stack is depicted in accordance with an illustrative embodiment. The process in this figure is an example of an implementation for operation 3500 in FIG. 35.

The process maintains the fuel cell stack at an operating temperature (operation 3600). The process terminates thereafter. In operation 3600 air is heated by the coolant such that the fuel cell stack remains at an operating temperature. This operating temperature can be a range of temperatures in which fuel cell stack 3405 operates to generate electricity. Further, the operating temperature may be a temperature that provides the desired level of electricity generation. In other words, other temperatures may be present at which fuel cell stack 3405 can generate electricity but not with a desired level.

With reference now to FIG. 37, an illustration of a thermal management system with a high temperature loop 3781 and a low temperature loop 3782 is depicted in accordance with an illustrative embodiment. This figure illustrates the layout of the hardware contained within a single nacelle for a high temperature proton exchange membrane (HTPEM) configuration. The fuel cell stack in this example is supplied air from the air management system and hydrogen from the fuel system and generates power in turn. That power is used to power an electric motor via its controller, which in turn spins the propeller.

As depicted, thermal management system 3700 is located in a nacelle of an engine. This system has high temperature loop 3781 and low temperature loop 3782. High temperature loop 3781 uses the ram air radiator 3702 to remove heat from fuel cell stack 3710.

Low temperature loop 3782 uses the heat capacity of liquid hydrogen in hydrogen fuel system 3711 to cool heat loads with lower heat generation than fuel cell stack 3710. In other words, low temperature loop 3780 cools coolant heated by these heat loads as part of a process to generate gaseous hydrogen from liquid hydrogen in hydrogen fuel system 3711.

As depicted, inlet air 3701 passes through ram air radiator 3702 to cool coolant that is part of a high temperature cooling loop. In this example, the coolant is used to cool fuel cell stack 3710. The result of this cooling is exhaust air 3703, which has increased temperature in comparison to inlet air 3701.

As depicted, air management system 3704 comprises compressor 3705, turbine 3706, motor 3707, and controller 3708. The air management system can be used to generate compressed air for use in fuel cell stack 3710. This air can be used with gaseous hydrogen from hydrogen (H2) fuel system 3711 to generate electricity. Liquid hydrogen from hydrogen fuel system 3711 is converted into gaseous hydrogen using liquid hydrogen heat exchanger (LH2 HX) 3712.

In this example, inlet air 3701 is received at the nacelle inlet as ambient air and is directed to compressor 3705 and ram air radiator 3702.

At compressor 3705, the air pressure of the air is increased to form compressed air. The compressed air also has a higher temperature. This compressed air is sent to charge air intercooler 3720 where the compressed air is conditioned toward fuel cell stack temperature by exchanging heat with the high temperature HT coolant. The air can be conditioned by heating or cooling the air depending on the temperature of the compressed air. This conditioning can include at least one of heating or cooling by charge air intercooler 3720. The heating or cooling is based on the temperature of the coolant relative to the temperature of the compressed air.

This conditioned air is sent to fuel cell stack 3710. Within the fuel cell stack 3710, the oxygen in conditioned air is reacted with gaseous hydrogen as it moves across the individual fuel cells in fuel cell stack 3710.

Air exits fuel cell stack 3710. This air is vitiated and can include some amount of the water product to keep fuel cell stack 3710 from flooding. The air, once exhausted from fuel cell stack 3710 passes through turbine 3706. The air becomes expanded to recover energy for use in the compression process and is exhausted as exhaust air 3703.

Ram air radiator 3702 removes heat from the high temperature coolant in high temperature loop 3781 and heats the air before the air is exhausted in exhaust air 3703.

Hydrogen is stored in a liquid form within the tanks of hydrogen fuel system 3711. This liquid hydrogen is distributed through fuel lines into the LH2 HX 3712. This component heats the liquid hydrogen to form gaseous hydrogen. The heating of gaseous hydrogen is performed using heat exchange with the low temperature coolant in low temperature loop 3782. The gaseous hydrogen can then be sent to fuel cell stack 3710.

In this example, high temperature (HT) loop 3781 utilizes a liquid coolant that flows through fuel cell stack 3710 to remove the heat generated during the fuel cell reaction. The heated coolant is sent to ram air radiator 3702, where heat in the coolant is rejected to the ambient air passing through ram air radiator 3702.

The low temperature loop 3782 uses a liquid coolant to remove heat from the low temperature heat loads. These heat loads can be, for example, motor 3750, controller 3751, and other power electronics such as DC-to-DC (DC/DC) converter 3752. Heat in this coolant can be transferred into liquid hydrogen at LH2 HX 3712 to gasify the liquid hydrogen.

In this example, motor 3750 turns propulsor 3795. High power bus 3786 connects fuel cell stack 3710 to other electrical components.

In some cases, these heat loads do not generate sufficient heat to gasify a sufficient amount of hydrogen fuel. In this case, high-temperature-to-low-temperature heat exchanger (HT-LT HX) 3731 can perform supplemental heating of the hydrogen. In this example, HT-LT HX 3731 can transfer heat from the high temperature coolant to the low temperature coolant to avoid insufficient liquid hydrogen gasification and subsequently, a fuel cell stack being damaged by thermal shock.

High temperature loop 3781 in thermal management system 3700 operates to remove the heat from the fuel cell, while ram air radiator 3702 rejects that heat to ambient air.

The LH2 HX 3712 operates to remove the heat from the low temperature coolant and low temperature loop 3782, and in turn cooling heat loads such as motor 3750 and controller 3751, while also warming and gasifying the hydrogen fuel before it enters fuel cell stack 3710. HT-LT HX 3731 operates to supply additional heat that is used to warm the hydrogen fuel when the lower heat loads do not provide sufficient heat. In one illustrative example, this feature can be implemented in the innermost nacelle of each wing.

6. Liquid Hydrogen Feed System for Fuel Cell Powered Aircraft

In this illustrative example, hydrogen for a fuel cell powered aircraft is stored as a liquid. Hydrogen can be stored as a liquid at approximately −424 degrees F. The storage tanks are liquid hydrogen tanks such as cryogenic tanks that store the hydrogen under pressure. Different techniques can be used to maintain pressure in the liquid hydrogen tanks, ensure venting can be performed safely without freezing the vent outlet, and direct the vent gases away from the aircraft. This venting of gases avoids undesired tank overpressure.

Maintaining pressure in the fuel tanks can be accomplished by tapping of liquid hydrogen from the common feed lines, running the liquid hydrogen through a heat exchanger then compressing to about 5 psi and pump the liquid hydrogen back to the top of the tank. The system can be turned on and off based on a set of pressure transducers operating with voting logic (the majority of the pressure sensors have to be below the pressurization system turn-on point).

Liquid hydrogen tanks can use a venting system to prevent overpressure due to ambient thermal heat leak. Due to the highly flammable nature of hydrogen, the vent system can include a flame arrestor at the end to prevent a back flash up the vent line in the event of vented hydrogen ignition. The design of a flame arrestor works to trap water in the narrow passages. If the pulse of warm hydrogen is vented prior to the opening of the relief valve, this operation will push any water out of the flame arrestor. This process is performed to avoid water freezing in the flame arrestor by the cryogenic temperature from venting hydrogen and blocking a flow through the flame arrestor.

In addition to the push of water, a heater can be added to the flame arrestor to prevent ice buildup when ambient temperature could cause freezing.

The illustrative examples recognize that a concern for safe venting of hydrogen gas is to vent the gas in a manner that hydrogen gas will not impinge on the aircraft and not become trapped under the aircraft when the aircraft is on the ground. A reason for not wanting to impinge on the aircraft is if the vent gases ignited, damage can occur to the skin of the aircraft where contacted.

In the illustrative example, by venting the hydrogen gases out of the top of the vertical stabilizer, the vent gases will not impinge on any aircraft surface and will warm to the point of being less dense than air so it will rise when on the ground.

Due to the temperature of liquid hydrogen, there are only two substances known that will remain a gas. Those substances are hydrogen (at or above the vapor pressure of the liquid hydrogen) and helium.

With respect to the ability to purge vent hydrogen, a first step includes performing a pressure cycle of warm hydrogen gas to bring the system to about −320 degrees F. At this temperature, nitrogen gas can be safely used to finish the warming and inerting of the system.

With reference next to FIG. 38, illustration of a hydrogen recirculating system is depicted in accordance with an illustrative embodiment. In this illustrative example, hydrogen recirculating system 3800 can be implemented in aircraft 400 in FIG. 4 to recirculate hydrogen from a set of liquid hydrogen tanks 408 in FIG. 4. In this example, liquid hydrogen 3807 is stored in the set of liquid hydrogen tanks 3810.

In this illustrative example, hydrogen recirculating system 3800 comprises conduit system 3801 and controller 3802. In this example, conduit system 3801 is connected to the set of liquid hydrogen tanks 3810 for aircraft 3855. Conduit system 3801 comprises conduits 3803 and valves 3804.

Conduit system 3801 includes conduits and valves. The valves can be controlled by controller 3802 to route fluids along different routes or loops. Controller 3802 is a hardware system and may include software.

In one illustrative example, controller 3802 can control conduit system 3801 to remove gaseous hydrogen 3811 from the set of liquid hydrogen tanks 3810. In one illustrative example, controller 3802 controls conduit system 3801 to perform a number of different operations. For example, controller 3802 sends gaseous hydrogen 3811 to tank heat exchanger 3820. Gaseous hydrogen 3811 is heated by tank heat exchanger 3820 to form heated gaseous hydrogen 3823. This tank heat exchanger can be, for example, LH2 HX 3712 in FIG. 37. Controller 3802 sends a first portion of the heated gaseous hydrogen to fuel cell stack 3822. Controller 3802 returns a second portion of heated gaseous hydrogen 3823 to the set of liquid hydrogen tanks 3810.

In this example, the second portion of heated gaseous hydrogen 3823 is an amount of the heated gaseous hydrogen 3823 that maintains a pressure level in the set of liquid hydrogen tanks 3810 that enables a flow of liquid hydrogen 3807 to the fuel cell stack 3822. This flow of liquid hydrogen 3807 comprises liquid hydrogen 3807 flowing from the set of liquid hydrogen tanks 3810 and being converted into gaseous hydrogen 3811 and being heated for use in fuel cell stack 3822. This type of flow can be used when the second portion of heated gaseous hydrogen 3823 is not present in a sufficient amount needed for use in fuel cell stack 3822.

Further, controller 3802 can control pressure in liquid hydrogen tanks 3810. For example, controller 3802 can send gaseous hydrogen 3811 in the set of liquid hydrogen tanks 3810 through conduit system 3801 to vent 3860 in response to pressure in the set of liquid hydrogen tanks 3810 being greater than a specified tolerance. In this example, vent 3860 is considered a part of hydrogen recirculating system 3800. Thus, in this example, excess gaseous hydrogen is sent from the set of liquid hydrogen tanks 3810 to vent 3860 in aircraft 3855 in response to a pressure in the set of liquid hydrogen tanks 3810 being greater than a tolerance.

Vent 3860 can be in different locations on aircraft 3855. For example, vent 3860 can be located in tail 3861 of fuselage 3862 of aircraft 3855. For example, vent 3860 can be located in vertical tail 3865 on tail 3861 of fuselage 3862. Vertical tail 3865 is a vertical stabilizer connected to tail 3861 of fuselage 3862.

In another illustrative example, controller 3802 can perform similar operations with respect to liquid hydrogen 3807 stored in the set of liquid hydrogen tanks 3810. Liquid hydrogen 3807 can be used to maintain a desired level of pressure in the set of liquid hydrogen tanks 3810. This use of liquid hydrogen 3807 can be used in place of or in addition to performing operations with gaseous hydrogen 3811 to maintain a desired pressure level.

In this example, controller 3802 can control conduit system 3801 to perform operations. For example, controller 3802 removes liquid hydrogen 3807 from the set of liquid hydrogen tanks 3810 and send liquid hydrogen 3807 to tank heat exchanger 3820 to form heated gaseous hydrogen 3823. Controller 3802 can send a first portion of heated gaseous hydrogen 3823 to fuel cell stack 3822 and return a second portion of the heated gaseous hydrogen 3823 to the set of liquid hydrogen tanks 3810.

For example, vent 3860 may be in another location. In another illustrative example, vent 3860 can be in another stabilizer in vertical tail 3865. In yet another illustrative example, the vent can be located on a wing for aircraft 3855.

The block diagram illustration of hydrogen recirculating system 3800 in FIG. 38 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

With reference to FIG. 39, an illustration of a flowchart of a process for recirculating hydrogen is depicted in accordance with an illustrative embodiment. The process in FIG. 39 can be implemented in hardware, software, or both. For example, the process can be implemented in hydrogen recirculating system 3800 in FIG. 38. This process can be used to manage liquid hydrogen in liquid hydrogen tanks for an aircraft.

The process begins by extracting gaseous hydrogen from a set of liquid hydrogen tanks connected to an aircraft (operation 3900). The process sends the gaseous hydrogen extracted from the set of liquid hydrogen tanks through a tank heat exchanger in nacelles for engines for the aircraft to form heated gaseous hydrogen (operation 3902)

The process sends a first portion of the heated gaseous hydrogen to fuel cell stacks in the engines for the aircraft (operation 3904). The process returns a second portion of the heated gaseous hydrogen into the set of liquid hydrogen tanks (operation 3906). The process terminates thereafter.

With reference to FIG. 40, an illustration of a flowchart of a process for recirculating hydrogen is depicted in accordance with an illustrative embodiment. The process in FIG. 40 can be implemented in hardware, software, or both. For example, the process can be implemented in hydrogen recirculating system 3800 in FIG. 38. This process can be used to manage liquid hydrogen in liquid hydrogen tanks for an aircraft.

The process removes liquid hydrogen from the set of liquid hydrogen tanks (operation 4000). The process sends the liquid hydrogen to a tank heat exchanger to form heated gaseous hydrogen (operation 4002).

The process sends a first portion of the heated gaseous hydrogen to a fuel cell stack (operation 4004). The process returns a second portion of the heated gaseous hydrogen to the set of liquid hydrogen tanks (operation 4006). The process terminates thereafter.

With reference to FIG. 41, an illustration of a flowchart of a process for recirculating hydrogen is depicted in accordance with an illustrative embodiment. The process in FIG. 41 can be implemented in hardware, software, or both. For example, the process can be implemented in hydrogen recirculating system 3800 in FIG. 38. This process can be used to manage liquid hydrogen in liquid hydrogen tanks for an aircraft.

The process sends gaseous hydrogen in the set of liquid hydrogen tanks through the conduit system to a vent in response to pressure in the set of liquid hydrogen tanks being greater than a specified tolerance (operation 4100). The process terminates thereafter.

Turning next to FIG. 42, an illustration of a recirculating system for liquid hydrogen for tank pressure control is depicted in accordance with an illustrative embodiment. As shown in this example, recirculating system 4200 for recirculating gaseous hydrogen (GH2) can be performed for controlling the temperature within liquid hydrogen tank 4251 and liquid hydrogen tank 4252.

This process can include pulling gaseous hydrogen from the top of the liquid hydrogen tanks and then sending the gaseous hydrogen through a heat exchanger 4201 while traveling down towards the wing. Heat exchanger 4201 has heat from the low temperature coolant line 4203 from the engines.

The gaseous hydrogen is split into two portions after heat exchanger 4201 at flow control valve 4202. In this example, with most of the gaseous hydrogen going towards fuel cells stacks through line 4204 and some of the gaseous hydrogen being pumped by gaseous hydrogen pump 4206 and gaseous hydrogen pump 4207 back into the liquid hydrogen tanks through return line 4205. Returning heated gaseous hydrogen back to the liquid hydrogen tanks affects how much liquid hydrogen (LH2) is boiled off in the liquid hydrogen tanks and affects the tank pressure. In this example, the more boil-off results in a greater pressure increase.

In one example, this process can be performed as follows:
1. Extract gaseous hydrogen from the liquid hydrogen tanks.
2. sending the gaseous hydrogen through heat exchanger 4205 with hot coolant from the fuel cell stack as the heating fluid The hot coolant can be heated by heat loads in a low temperature loop.
3. Output the heated gaseous hydrogen from heat exchanger 4205.
4 Split the gaseous hydrogen at flow control valve 4202 wherein a portion of the gaseous hydrogen is directed for recirculation in the liquid hydrogen tanks and another portion of the gaseous hydrogen is sent to the fuel cell stacks.
5. Directing the portion of the gaseous hydrogen for recirculation to gaseous hydrogen pump 4206 and gaseous hydrogen pump 4207 for return to the liquid hydrogen tanks
6. Returning the gaseous hydrogen back into the liquid hydrogen tanks and bubble through the liquid hydrogen to maintain pressure in the cryogenic tanks.

In FIG. 43, an illustration of a venting system for gaseous hydrogen is depicted in accordance with an illustrative embodiment. Venting system 4300 provides an ability to vent gaseous hydrogen (GH2) in response to excess pressure. This venting system enables releasing gaseous hydrogen from liquid hydrogen tanks 4310 and removing that gaseous hydrogen from aircraft. During flight, this venting can occur through vent 4304 in vertical tail 4306. In this example, vent 4304 is connected to liquid hydrogen tanks 4310 by conduit system 4312.

With reference next to FIG. 44, an illustration of a system for recirculating gaseous hydrogen for tank pressure control is depicted in accordance with an illustrative embodiment. In the illustrative examples, the same reference numeral may be used in more than one figure. This reuse of a reference numeral in different figures represents the same element in the different figures. This figure is a more detailed view of the components in section 4350 in FIG. 43.

This view also shows the components that can be used to recirculate liquid hydrogen (LH2) in addition to components for recirculating gaseous hydrogen. In this example, liquid hydrogen is pulled from the bottom of liquid hydrogen tanks 4310. Some of the liquid hydrogen is sent to the engine and some of liquid hydrogen is passed through heat exchanger 4401 to warm and phase change to gaseous hydrogen (GH2). Heat exchanger 4401 has heat from the low temperature coolant line 4402 from the engines. The liquid hydrogen is then pumped back into liquid hydrogen tanks 4310. Heated GH2 being added back to liquid hydrogen tanks 4310 affects how much liquid hydrogen is boiled off in liquid hydrogen tanks 4310 and affects the liquid hydrogen tank pressure.

With respect to performing recirculation with liquid hydrogen, the process can be performed as follows:

1. extract liquid hydrogen from liquid hydrogen tanks 4310;
2. input liquid hydrogen through heat exchanger 4401 with hot coolant from heat loads such as an engine as the heating fluid;
3. output gaseous hydrogen from heat exchanger 4401;
4. split the gaseous hydrogen at flow control valve 4407 wherein a portion of the gaseous hydrogen is directed for recirculation in the liquid hydrogen tanks through refill line 4408, which leads to refuel port for liquid hydrogen tanks 4310 and another portion of the gaseous hydrogen is sent to the fuel cell stacks through fuel cell stack line 4415;
5. sending the gaseous hydrogen for recirculation to gaseous hydrogen (GH2) pump 4405 and gaseous hydrogen pump 4406; and
6. returning the portion gaseous hydrogen for recirculation back into liquid hydrogen tanks 4310 and bubbled through the liquid hydrogen to maintain pressure in liquid hydrogen tanks 4310.

Alternatively, GH2 can also be pulled from the liquid hydrogen tanks 4310 instead of liquid hydrogen and perform a similar process with gaseous hydrogen.

Additionally, pressure relief valve 4420 can provide pressure relief by opening to vent gaseous hydrogen. This valve can open when the pressure is greater than some selected threshold. This gaseous hydrogen can then flow to vent 4304 in vertical tail 4306 in FIG. 43.

7. Pumped Two-Phase Cooling of Aircraft Electronics

Conventional single-phase cooling systems are unable to thermally manage electrified propulsion systems within acceptable size, weight, and power (SWaP) envelopes for use in aircraft such as liquid hydrogen powered aircraft.

Current solutions pump liquid in a cooling loop that uses a ram air radiator. Ram air radiators for electrified propulsion systems and high power electronics are large in size and weight and require large amounts of cooling air flow. This situation results in packaging challenges and potential aerodynamic drag penalties.

These solutions currently used in aircraft are single phase liquid or gaseous cooling solutions that are used for aircraft components such as power electronics, fuel cells, batteries, and electric motors and drives. These solutions are ineffective at dealing with large amounts of heat from these types of electric components that typically operate below 100 degrees centigrade.

In one or more illustrative examples, a series of components comprising a liquid pump, an evaporator, a condenser, and an accumulator can be used to provide desired cooling using a pumped two-phase cooling loop.

In the illustrative example, a fluid is used that undergoes phase change at temperatures and pressures that are suitable for thermal management of aircraft electronics and power systems. The heat sources and heat sink can be designed to operate as evaporators and condensers, respectively.

In the different illustrative examples, a waste heat recovery (WHR) system can be added to the thermal management system downstream of the evaporator. In another illustrative example, a system to generate thrust from ram air that is heated by the condenser can also be used.

With reference to FIG. 45, an illustration of a block diagram of an aircraft cooling system is depicted in accordance with an illustrative embodiment. In this illustrative example, aircraft cooling system 4500 can be implemented in aircraft 400 in FIG. 4 to cool heat loads 4501. Aircraft cooling system 4500 can be located in a nacelle of an engine of an aircraft.

Heat loads 4501 can take a number of different forms. For example, heat loads 4501 can be selected from at least one of a fuel cell, a fuel cell stack, a power circuit, an electric motor, a computer system, an electronics enclosure, a laser, or some other component that generates heat.

Aircraft cooling system 4500 can take a number of different forms. In one illustrative example, aircraft cooling system 4500 comprises evaporator 4511, condenser 4512, accumulator 4513, and pump system 4514, and conduit system 4515. Flow of fluids such as liquid 4516 and vapor 4519 between these different components are facilitated by conduit system 4515.

Conduit system 4515 comprises conduits 4527 and can also include valves 4517. Conduit system 4515 is connected to evaporator 4511, condenser 4512, accumulator 4513, and pump system 4514.

In this example, evaporator 4511 is thermally connected to a set of heat loads 4501 and can cool the set of heat loads 4501 in aircraft 4502 using liquid 4516. Liquid 4516 forms a vapor 4519 in response to cooling the set of heat loads 4501.

Condenser 4512 is a hardware component that cools vapor 4519 to form liquid 4516. In one example, condenser 4512 can be a ram air condenser that uses air entering an inlet of a nacelle or a condenser that does not use ram air. Condenser 4512 receives vapor 4519 and cools vapor 4519 in which cooling vapor 4519 forms liquid 4516. Further in this example, condenser 4512 rejects heat from the vapor 4519 into nacelle airflow. Nacelle air flow is air flowing through a nacelle that exits the nacelle at the outlet of the nacelle.

In this example, accumulator 4513 receives liquid 4516 from condenser 4512 and stores liquid 4516. A pump system is a physical system that comprises one or more pumps. Pump system 4514 pumps liquid 4516 stored in accumulator 4513 to evaporator 4511.

Further, in this example, aircraft cooling system 4500 can also include generator 4530 and turbine 4531. In this example, turbine 4531 is connected to the generator and to conduit system 4515. Turbine 4531 is physically connected to generator 4530 and can turn generator 4530 to generate electrical power. Turbine 4531 is connected to conduit system 4515 such that vapor 4519 flows through turbine 4531 to turn turbine 4531.

Turbine 4531 turns in response to receiving vapor 4519 from evaporator 4511 and causes generator 4530 to generate power and wherein condenser 4512 receives vapor 4519 from turbine 4531.

In another illustrative example, aircraft cooling system 4500 comprises condenser 4512, evaporator 4511 and pump system 4514. With this example, two liquids flow within conduit system 4515, first liquid 4541 and second liquid 4542. These two liquids flow separately from each other within conduit system 4515. In other words, the liquids do not mix. In this example, first pump 4544 in pump system 4514 pumps first liquid 4541 and second pump 4545 in pump system 4514 pumps second liquid 4542.

In this example, first pump 4544 pumps first liquid 4541 in liquid loop 4550 to a set of heat loads 4501. The set of heat loads 4501 heats first liquid 4541 in which heating first liquid 4541 forms heated liquid 4546.

Evaporator 4511 is a separate or partitioned evaporator in which both first liquid 4541 (heated liquid 4546) and second liquid 4542 can flow through this component without mixing with each other. In this example, evaporator 4511 receives heated liquid 4546 and cools the heated liquid 454. The cooling of heated liquid 4546 causes second liquid 4542 in liquid-vapor loop 4551 to form vapor 4552.

Further in this example, condenser 4512 receives vapor 4552 and cool vapor 4552. Cooling vapor 4552 forms second liquid 4542. Second pump 4545 pumps second liquid 4542 from condenser 4512 to evaporator 4511.

The block diagram illustration of aircraft cooling system 4500 in FIG. 45 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

With reference next to FIG. 46, an illustration of a flowchart of a process for cooling heat loads is depicted in accordance with an illustrative embodiment. The process in FIG. 46 can be implemented in hardware, software, or both. For example, the process can be implemented in aircraft cooling system 4500 in FIG. 45. This process can be used to cool heat loads in an aircraft.

The process cools a set of heat loads in an aircraft using a liquid in an evaporator, wherein in cooling the set of heat loads, the liquid forms a vapor (operation 4600). The process cools the vapor with a condenser to form the liquid (operation 4602).

The process receives the liquid from the condenser (operation 4604). The process stores the liquid in an accumulator (operation 4606).

The process pumps the liquid stored in the accumulator to the evaporator (operation 4608). The process terminates thereafter.

Next in FIG. 47, an illustration of a flowchart of a process for cooling heat loads is depicted in accordance with an illustrative embodiment. The process in FIG. 47 can be implemented in hardware, software, or both. For example, the process can be implemented in aircraft cooling system 4500 in FIG. 45. This process can be used to heat loads in an aircraft.

The process pumps a first liquid to a set of heat loads, wherein the set of heat loads heats in which heating the first liquid forms a heated liquid (operation 4700). The process cools the heated liquid in an evaporator, wherein cooling the heated liquid causes a second liquid in the evaporator to form a vapor (operation 4702).

The process sends the vapor to a condenser (operation 4704). The process cools the vapor in the condenser to form the second liquid (operation 4706). The process pumps the second liquid from the condenser to the evaporator (operation 4708). The process terminates thereafter.

With reference next to FIG. 48, an illustration of a pumped two-phase (P2P) cooling loop is depicted in accordance with an illustrative embodiment. As depicted, pumped two-phase cooling loop 4800 comprises pump 4802, evaporator 4804, condenser 4806, and accumulator 4808. In this example, accumulator 4808 is a reservoir that stores liquid. Pump 4802 can pump liquid from accumulator 4808 to evaporator 4804. Evaporator 4804 cools a set of heat loads 4805 in the aircraft. The set of heat loads 4805 in the aircraft is selected from at least one of a fuel cell, a fuel cell stack, an electric motor, a computer system, an electronics enclosure, or a laser. The set of heat loads can include a fuel cell, a fuel cell stack, an electronic motor, an electronic enclosure, the computer system, a laser, or other suitable types of components that generate heat.

When cooling these heat loads, evaporator 4804 generates a vapor from the liquid coolant which is sent to condenser 4806. Condenser 4806 operates via airflow moving through condenser 4806 to cool the vapor from evaporator 4804. The cooled vapor becomes a liquid that is stored in accumulator 4808, which can be recirculated by pump 4802 to perform further cooling in pumped two-phase cooling loop 4800.

Next in FIG. 49, an illustration of a hybrid two-phase (P2P) cooling loop is depicted in accordance with an illustrative embodiment. In this example, hybrid two-phase (P2P) cooling loop 4900 comprises pump 1 4902, pump 2 4904, evaporator 4906, and condenser 4908.

In this example, pump 1 4902 pumps a first liquid condensed by evaporator 4906 to heat loads 4910 in liquid loop 4901. Heat loads 4910 heat the first liquid in this example. The heated liquid flows to evaporator 4906, which is cooled for use by pump 1 4902.

This flow of the liquid forms liquid loop 4901 in hybrid two-phase (P2P) cooling loop 4900. In this instance, evaporator 4906 can be a separate location from heat loads 4910. For example, evaporator 4906 can be located closer to condenser 4908.

With this example, a second liquid in evaporator 4906 is heated to form vapor 4903 in two-phase (P2P) loop 4915. This vapor is sent to condenser 4908. This type of configuration may be desirable when the second liquid is more volatile or harder to handle. This configuration using two liquids can minimize the usage of a potentially volatile working fluid. Also, this configuration can also be used with a heat load that cannot come into direct contact with the liquid being used as a coolant or refrigerant.

Vapor 4903 is sent to condenser 4908 which cools the vapor to form the second liquid. Pump 2 4904 pumps the second liquid back to evaporator 4906. Heat exchange in evaporator 4906 cools the first liquid in liquid loop 4901.

Turning next to FIG. 50, an illustration of a pumped two-phase (P2P) cooling loop with waste heat recovery is depicted in accordance with an illustrative embodiment. As depicted, pumped two-phase cooling loop 5000 comprises pump 5002, evaporator 5004, condenser 5006, and accumulator 5008.

In this example, turbine 5010 is located between evaporator 5004 and condenser 5006. Liquid sent to evaporator by pump 5002 cools heat loads 5011. With this example, vapor 5031 generated by evaporator 5004 cooling heat loads 5011 can be used to turn turbine 5010. Turbine 5010 is connected to generator 5012, which generates power in response to turbine 5010 using vapor 5031. Vapor 5031 then flows to condenser 5006 for condensation into liquid 5032 that is stored in accumulator 5008. As depicted, waste heat recovery system 5050 comprises turbine 5010 and generator 5012.

Thus, one or more illustrative examples can use this type of cooling system in place of the other cooling systems that use a single phase liquid. A liquid can be selected that will evaporate when cooling a heat load.

Further, vapor 5031 produced by evaporator 5004 can be a superheated gas. Similarly, liquid 5032 produced by condenser 5006 can be subcooled. The terms superheated and subcooled refer to increasing or decreasing the fluid temperature beyond the saturation temperature, respectively.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, to the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An aircraft cooling system comprising:
   an evaporator configured to cool a set of heat loads in an aircraft using a first liquid in a liquid loop, wherein a second liquid in a liquid-vapor loop forms a vapor in response to cooling the set of heat loads;
   a condenser configured to receive the vapor from the evaporator and cool the vapor in which cooling the vapor forms the second liquid;
   an accumulator configured to receive the second liquid from the condenser and store the second liquid; and
   a pump system comprising a first pump and a second pump, the first pump configured to pump the first liquid in the liquid loop to the set of heat loads and the second pump configured to pump the second liquid stored in the accumulator to the evaporator and pump the second liquid from the condenser to the evaporator.

2. The aircraft cooling system of claim 1, wherein the condenser is configured to reject heat from the vapor into air traveling through a nacelle.

3. The aircraft cooling system of claim 1 further comprising:
   a generator; and
   a turbine connected to the generator, wherein the turbine turns in response to receiving the vapor from the evaporator and causes the generator to generate power and wherein the condenser receives the vapor from the turbine.

4. The aircraft cooling system of claim 1, wherein the condenser comprises a nacelle heat exchanger.

5. The aircraft cooling system of claim 4, wherein the condenser further comprises a fan system.

6. The aircraft cooling system of claim 1, wherein the condenser rejects heat into air traveling through a nacelle.

7. The aircraft cooling system of claim 1, wherein the aircraft cooling system is located in a nacelle of an engine for the aircraft.

8. The aircraft cooling system of claim 1, wherein the set of heat loads in the aircraft is selected from at least one of a fuel cell, a fuel cell stack, a power circuit, an electric motor, a computer system, an electronics enclosure, or a laser.

9. The aircraft cooling system of claim 1 wherein the condenser is a ram air condenser.

10. An aircraft cooling system comprising:
    a first pump configured to pump a first liquid in a liquid loop to a set of heat loads, wherein the set of heat loads heats the first liquid in which heating the first liquid forms a heated liquid;
    an evaporator configured to receive the heated liquid and cool the heated liquid, wherein cooling the heated liquid causes a second liquid in a liquid-vapor loop to form a vapor;
    a condenser configured to receive the vapor and cool the vapor in which cooling the vapor forms the second liquid; and
    a second pump configured to pump the second liquid from the condenser to the evaporator.

11. The aircraft cooling system of claim 10, wherein the condenser comprises a nacelle heat exchanger.

12. The aircraft cooling system of claim 10, wherein the condenser further comprises a fan system.

13. The aircraft cooling system of claim 10, wherein the condenser rejects heat from the vapor into air traveling through a nacelle.

14. The aircraft cooling system of claim 10, wherein the aircraft cooling system is located in a nacelle of an engine for an aircraft.

15. An aircraft cooling system comprising:
    an evaporator configured to cool a set of heat loads in an aircraft using a first liquid in a liquid loop, wherein a second liquid in a liquid-vapor loop forms a fluid selected at least one of a vapor or a superheated gas in response to cooling the set of heat loads;
    a condenser configured to receive the fluid from the evaporator and cool the fluid in which cooling the vapor forms the second liquid;
    an accumulator configured to receive the second liquid from the condenser and store the second liquid; and a pump system comprising a first pump and a second pump, the first pump configured to pump the first liquid in the liquid loop to the set of heat loads and the second pump configured to pump the second liquid stored in the accumulator to the evaporator and pump the second liquid from the condenser to the evaporator.

16. An aircraft cooling system comprising:

a first pump configured to pump a first liquid in a liquid loop to a set of heat loads, wherein the set of heat loads heats the first liquid in which heating the first liquid forms a heated liquid;

an evaporator configured to receive the heated liquid and cool the heated liquid, wherein cooling the heated liquid causes a second liquid in a liquid-vapor loop to form a fluid selected at least one of a vapor or a superheated gas;

a condenser configured to receive the fluid and cool the fluid in which cooling the vapor forms the second liquid; and a second pump configured to pump the second liquid from the condenser to the evaporator.

17. An aircraft comprising:

a fuselage;

wings;

a number of engines connected to the wings;

an evaporator configured to cool a set of heat loads in the aircraft using a first liquid in a liquid loop, wherein cooling the set of heat loads forms a vapor from a second liquid in a liquid-vapor loop;

a condenser configured to receive the vapor from the evaporator and cool the vapor in which cooling the vapor forms the second liquid;

an accumulator configured to receive the second liquid from the condenser and store the second liquid; and a pump system comprising a first pump and a second pump, the first pump configured to pump the first liquid in the liquid loop to the set of heat loads and the second pump configured to pump the second liquid stored in the accumulator to the evaporator and pump the second liquid from the condenser to the evaporator.

18. The aircraft of claim 17, wherein the condenser comprises a nacelle heat exchanger.

19. The aircraft of claim 18, wherein the condenser further comprises a fan system.

20. The aircraft of claim 17, wherein the condenser rejects heat into air traveling through a nacelle.

21. The aircraft of claim 17, wherein the condenser is located in a nacelle for an engine in the number of engines.

22. A method for cooling a set of heat loads in an aircraft, the method comprising:

cooling the set of heat loads in the aircraft using a first liquid in a liquid loop in an evaporator, wherein cooling the set of heat loads forms a vapor from a second liquid in a liquid-vapor loop;

cooling the vapor with a condenser to form the second liquid;

receiving the second liquid from the condenser;

storing the second liquid in an accumulator; and pumping the first liquid to the set of heat loads, pumping the second liquid stored in the accumulator to the evaporator, and pumping the second liquid from the condenser to the evaporator.

23. A method for cooling a set of heat loads in an aircraft, the method comprising:

pumping a first liquid to the set of heat loads, wherein the set of heat loads heats in which heating the first liquid forms a heated liquid;

cooling the heated liquid in an evaporator, wherein cooling the heated liquid causes a second liquid in the evaporator to form a vapor;

sending the vapor to a condenser;

cooling the vapor in the condenser to form the second liquid; and pumping the second liquid from the condenser to the evaporator.

\* \* \* \* \*